(12) United States Patent
Brew

(10) Patent No.: US 12,034,397 B2
(45) Date of Patent: Jul. 9, 2024

(54) INFRASTRUCTURELESS DATA CENTER

(71) Applicant: Jeffrey Patrick Brew, Las Vegas, NE (US)

(72) Inventor: Jeffrey Patrick Brew, Las Vegas, NE (US)

(73) Assignee: Mavn Technology Licensing, Inc., Las Vegas, NV (US)

( * ) Notice: Subject to any disclaimer, the term of this patent is extended or adjusted under 35 U.S.C. 154(b) by 0 days.

(21) Appl. No.: 17/933,476

(22) Filed: Sep. 19, 2022

(65) Prior Publication Data
US 2024/0097602 A1   Mar. 21, 2024

(51) Int. Cl.
*H02S 20/00*   (2014.01)
*H02S 40/30*   (2014.01)
*H02S 40/36*   (2014.01)
*H05K 7/14*    (2006.01)

(52) U.S. Cl.
CPC .............. *H02S 20/00* (2013.01); *H02S 40/30* (2014.12); *H02S 40/36* (2014.12); *H05K 7/1492* (2013.01)

(58) Field of Classification Search
CPC .......... H02S 20/00; H02S 40/30; H02S 40/36; H05K 7/1492
See application file for complete search history.

(56) References Cited

U.S. PATENT DOCUMENTS

| | | |
|---|---|---|
| 5,814,906 A | 9/1998 | Spencer et al. |
| 7,492,582 B2 | 2/2009 | Kou |
| 9,141,139 B2 | 9/2015 | Arnouse |
| 10,826,763 B2 | 11/2020 | Bou Fadel |

(Continued)

FOREIGN PATENT DOCUMENTS

JP   2014232598 A   * 12/2014

OTHER PUBLICATIONS

Author(s): Mezzanotte, Matteo Title: Datacenters—Get Ready for Scope 3 Source URL: https://submer.com/blog/datacenters-get-ready-for-scope-3/ p. 3 Published: Jun. 27, 2019.

(Continued)

*Primary Examiner* — Mark A Connolly

(57) ABSTRACT

The disclosed Infrastructureless™ Data Center is a green-on-green technology. In an embodiment, an example Infrastructureless™ Data Center includes an Infrastructureless™ base node including a photovoltaic (PV) panel assembly. The Infrastructureless™ Data Center further includes a variety of proprietary computing components attached to the Infrastructureless™ base node including some or all of compute, memory, network, power and storage assemblies that, when attached to the Infrastructureless™ base node, create an Infrastructureless™ Data System. Infrastructureless™ Data Systems of similar configurations can be grouped together to form Infrastructureless™ Clusters. Multiple Infrastructureless™ Clusters can be grouped together to form an Infrastructureless™ Data Center of any size. In some embodiments, the Infrastructureless™ Data Center is electrically self-sufficient, e.g., carbon neutral, and does not need to be connected to an external power grid. In other embodiments, the Infrastructureless™ Data Center is carbon negative and can supply unused electricity to an external power grid.

20 Claims, 41 Drawing Sheets

© 2021 Mavn, Inc.

(56) References Cited

U.S. PATENT DOCUMENTS

| | | | |
|---|---|---|---|
| 2007/0030630 A1* | 2/2007 | Diaz | G06F 1/20 |
| | | | 361/600 |
| 2013/0286525 A1* | 10/2013 | Kanamori | H02H 9/004 |
| | | | 361/101 |
| 2013/0297949 A1* | 11/2013 | Sun | G06F 1/26 |
| | | | 713/300 |
| 2021/0075220 A1* | 3/2021 | Allen | H01Q 5/22 |
| 2021/0075863 A1* | 3/2021 | Achillopoulos | G07C 9/00182 |
| 2021/0152468 A1* | 5/2021 | Anandakrishnan | H04L 49/70 |
| 2023/0008449 A1* | 1/2023 | Chun | F21V 1/06 |

OTHER PUBLICATIONS

Author(s): Malone, John; Higgins, David Title: Data centers: balancing climate change and digital growth Source URL: https://aecom.com/without-limits/article/data-centers-balancing-climate-change-and-digital-growth/ p. 3 Published: Unknown Date retrieved: May 23, 2022.

Author(s): Trueman, Charlotte Title: Why data centres are the new frontier in the fight against climate change Source URL: https://www.computerworld.com/anicle/3431148/why-data-centres-are-the-new-frontier-in-the-fight-against-climate-change.html p. 6 Published: Aug. 29, 2019.

Author(s): Ritche, Hannah Title: Sector by sector: where do global greenhouse gas emissions come from? Source URL: https://ourworldindata.org/ghg-emissions-by-sector p. 9 Published: Sep. 18, 2020.

Author(s): Nixon, Katie Title: Touring Facebook's Gallatin data center: reaching the summit of Mount Crushmore Source URL: https://www.tennessean.com/story/news/local/sumner/2021/08/03/touring-facebooks-gallatin-data-center-reaching-summit-mount-crushmore/7888903002/ p. 4 Published: Aug. 3, 2021.

Author(s): Green, Jerod Title: Data Center Design Overview: Cabinet Layout, Rack Design, & More Source URL: https://blog.enconnex.com/data-center-design-overview-cabinet-layout-rack-design-more p. 7 Published: Jan. 25, 2022.

Author(s): James, Glanz Title: Power, Pollution and the Internet Source URL: https://www.nytimes.com/2012/09/23/technology/data-centers-waste-vast-amounts-of-energy-belying-industry-image.html p. 9 Published: Sep. 22, 2012.

Author(s): Krishan, Monica Title: The Link Between Internet Use and Global Warming Source URL: https://science.thewire.in/economy/tech/the-link-between-internet-use-and-rising-global-temperatures/ p. 4 Published: Nov. 11, 2021.

Author(s): Super Micro Computer, Inc. Title: Data Centers & the Environment 2021—Report on the State of the Green Data Center Source URL: https://www.datacenterdynamics.com/en/whitepapers/data-centers-environment-2021-report-state-green-data-center/ p. 16 Published: Feb. 2021.

Author(s): Bruschini, Alessandro Title: 'Tsunami of data' could consume one fifth of global electricity by 2025 Source URL: https://www.theguardian.com/environment/2017/dec/11/tsunami-of-data-could-consume-fifth-global-electricity-by-2025 p. 8 Published: Dec. 11, 2017.

Author(s): Hurst, Luke Title: Data centres are consuming more electricity than rural homes in Ireland for the first time Source URL: https://www.euronews.com/next/2022/05/05/data-centres-are-consuming-more-electricity-than-rural-homes-in-ireland-for-the-first-time p. 3 Published: May 5, 2022 (updated).

Author(s): Mordor Intelligence Title: Data Center Cooling Market-Growth, Trends, COVID-19 Impact, and Forecasts (2022-2027) Source URL: https://www.mordorintelligence.com/industry-reports/global-data-center-cooling-market-industry p. 9 Published: Unknown Date retrieved: Aug. 22, 2022.

Author(s): Ritche, Hannah Title: Climate change and flying: what share of global $CO_2$ emissions come from aviation? Source URL: https://ourworldindata.org/co2-emissions-from-aviation p. 8 Published: Oct. 22, 2020.

Author(s): Mytton, David Title: Data centre water consumption Source URL: https://www.nature.com/articles/s41545-021-00101 p. 6 Published: Feb. 15, 2021.

Author(s): Siddik, Md Abu Bakar; Shehabi, Arman; Marston, Landon Title: The environmental footprint of data centers in the United States Source URL: https://iopscience.iop.org/article/10.1088/1748-9326/abfba1 p. 12 Published: May 21, 2021.

Author(s): Henshaw, Kate Title: Heat in your datacenter: How to transform your biggest loss into a gain Source URL: https://submer.com/blog/heat-reuse-in-datacenters-from-a-loss-to-a-gain/ p. 4 Published: Mar. 16, 2022.

Author(s): Phillips, Mark Title: Chandler to consider banning data centers amid noise complaints Source URL: https://www.abc15.com/news/region-southeast-valley/chandler/chandler-to-consider-banning-data-centers p. 2 Published: Nov. 29, 2021.

Author(s): United Nations Environmental Programme (UNEP) Title: Conflict and Natural Resources Source URL: https://peacekeeping.un.org/en/conflict-and-natural-resources p. 2 Date retrieved: Aug. 22, 2022.

Author(s): Judge, Peter Title: What has biodiversity got to do with data centers? Source URL: https://www.datacenterdynamics.com/en/opinions/what-has-biodiversity-got-to-do-with-data-centers/ p. 7 Published: Apr. 22, 2022.

Author(s): U.S. Environmental Protection Agency Title: Energy Star Expands Efforts to Improve Energy Efficiency of U.S. Data Centers Source URL: https://www.epa.gov/newsreleases/energy-star-expands-efforts-improve-energy-efficiency-us-data-centers p. 5 Published: Aug. 16, 2021.

Author(s): Velasquez, Raul Title: No, Gaming PCs Are Not Being Banned In Several US States Source URL: https://www.thegamer.com/gaming-pcs-not-banned-us-california/ p. 4 Published: Jul. 29, 2021.

Author(s): Wikipedia Title: Backplane Source URL: https://en.wikipedia.org/wiki/Backplane p. 5 Published: Unknown Date retrieved: Jul. 7, 2022.

Author(s): Unknown Title: Rack unit Source URL: https://en.wikipedia.org/wiki/Rack_unit p. 4 Published: Unknown Date retrieved: Jun. 5, 2022.

Author(s): Schneider Electric Title: APC NetShelter SX, Server Rack Enclosure, 42U, Black, 1991H×600W×1070D mm Source URL: https://www.apc.com/shop/tradeups/us/en/products/APC-NetShelter-SX-Server-Rack-Enclosure-42U-Black-1991H-x-600W-x-1070D-mm/P-AR3100 p. 6 Published: Unknown Date retrieved: Jun. 5, 2022.

Author(s): Unknown Title: Computer-on-module Source URL: https://en.wikipedia.org/wiki/Computer-on-module p. 3 Published: Unknown Date retrieved: Jun. 5, 2022.

Author(s): Unknown Title: Uninterruptible power supply Source URL: https://en.wikipedia.org/wiki/Uninterruptible_power_supply p. 16 Published: Unknown Date retrieved: Jun. 6, 2022.

Author(s): Admin (Unknown) Title: What happens if you burn a lithium-ion battery? Source URL: https://lemielleux.com/what-happens-if-you-burn-a-lithium-ion-battery/ p. 2 Published: May 23, 2019.

Author(s): Unknown Title: Digital data Source URL: https://en.wikipedia.org/wiki/Digital_data p. 5 Published: Unknown Date retrieved: Jun. 5, 2022.

Author(s): Unknown Title: Storage Virtualization Source URL: https://en.wikipedia.org/wiki/Storage_virtualization p. 11 Published: Unknown Date retrieved: Jun. 5, 2022.

Author(s): Unknown Title: Hyper-converged infrastructure Source URL: https://en.wikipedia.org/wiki/Hyper-converged_infrastructure p. 3 Published: Unknown Date retrieved: Jun. 5, 2022.

Author(s): Unknown Title: Computer cluster Source URL: https://en.wikipedia.org/wiki/Computer_cluster p. 11 Published: Unknown Date retrieved: Jun. 5, 2022.

Author(s): Unknown Title: High-performance computing Source URL: https://en.wikipedia.org/wiki/High-performance_computing p. 3 Published: Unknown Date retrieved: Jun. 5, 2022.

Author(s): Newberger, Emma Title: As Earth overheats, asphalt is releasing harmful air pollutants in cities Source URL: https://www.

(56) References Cited

OTHER PUBLICATIONS cnbc.com/2020/09/02/climate-change-hot-asphalt-releases-harmful-air-pollutants-in-cities.html p. 8 Published: Published: Sep. 20, 2020.

* cited by examiner

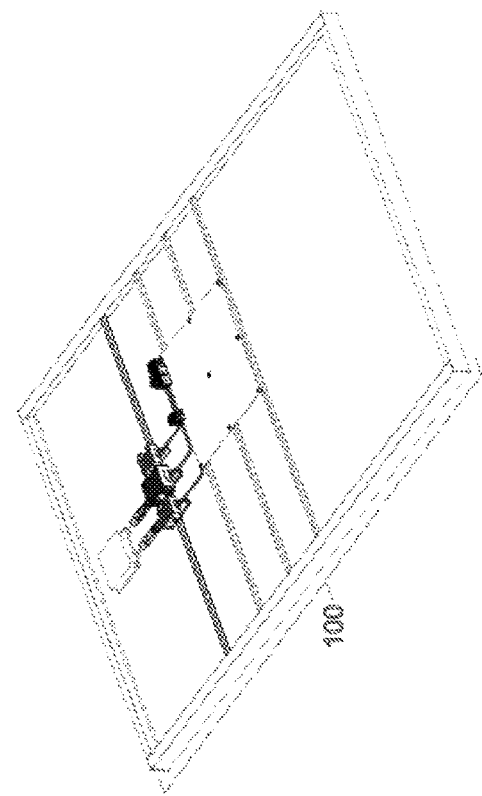
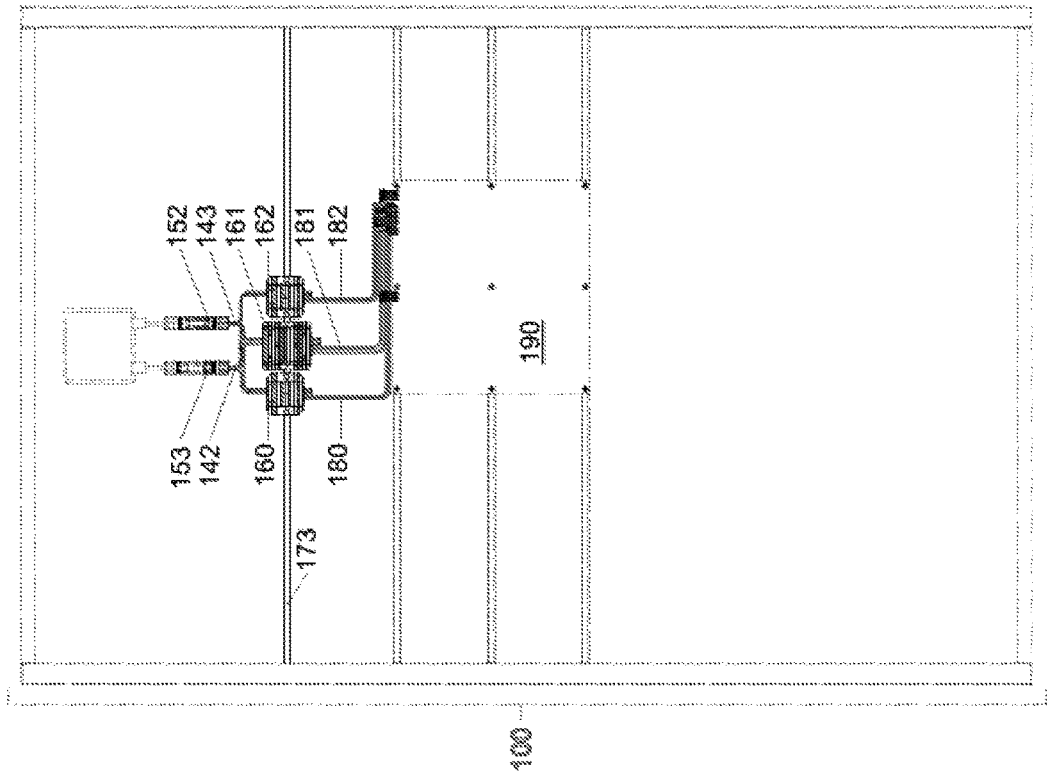
FIG. 6A
FIG. 6B

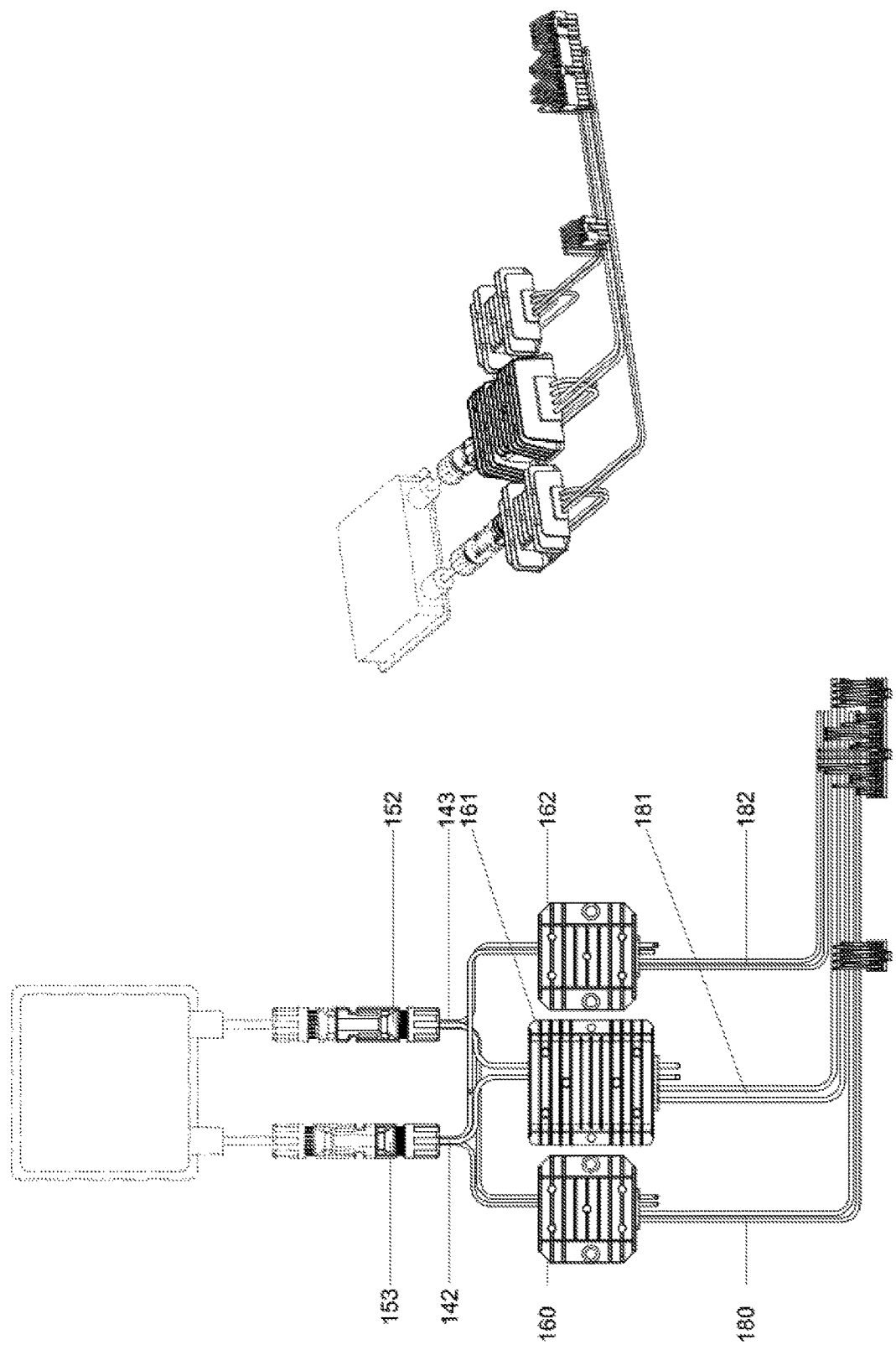

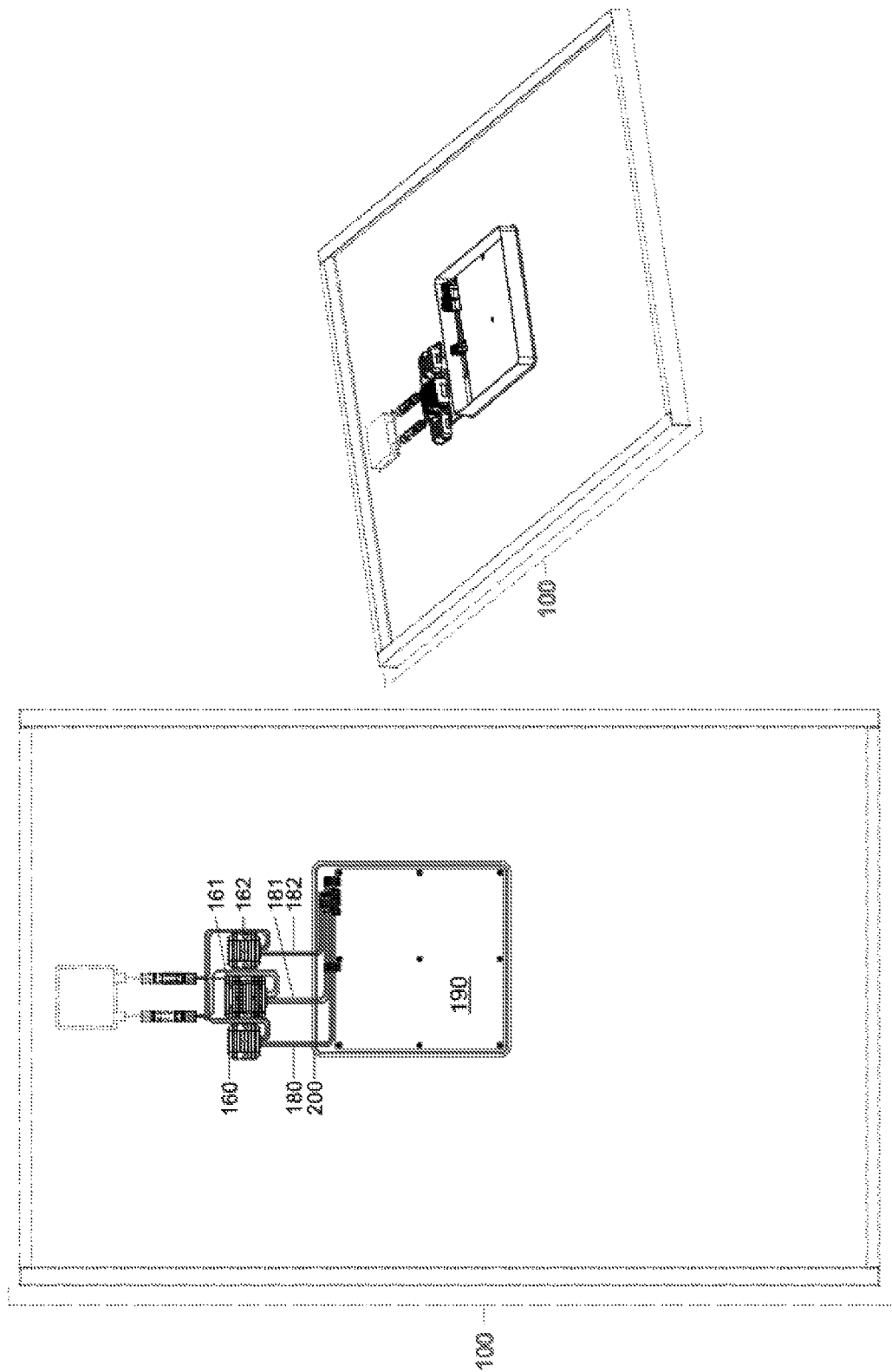

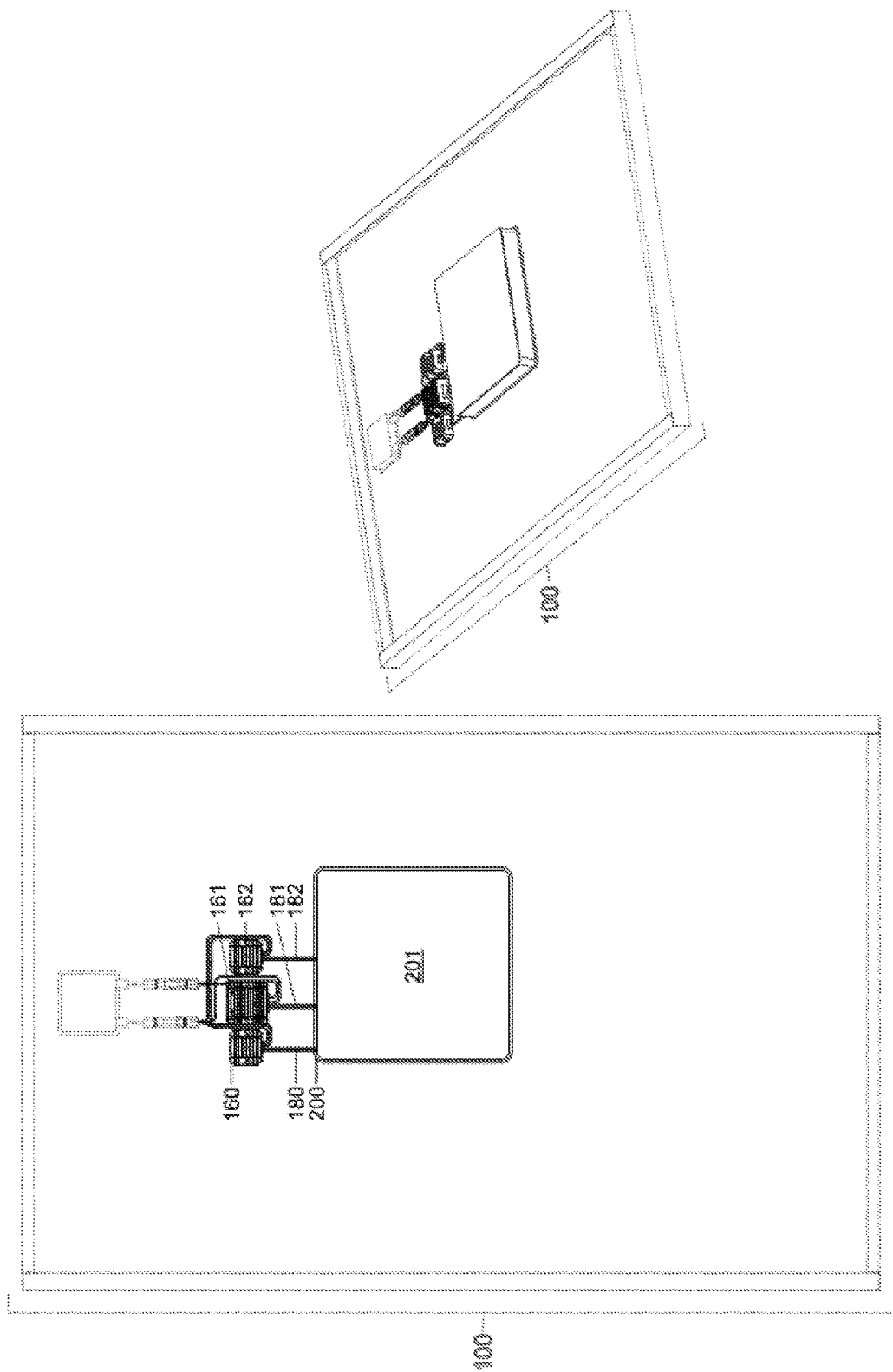

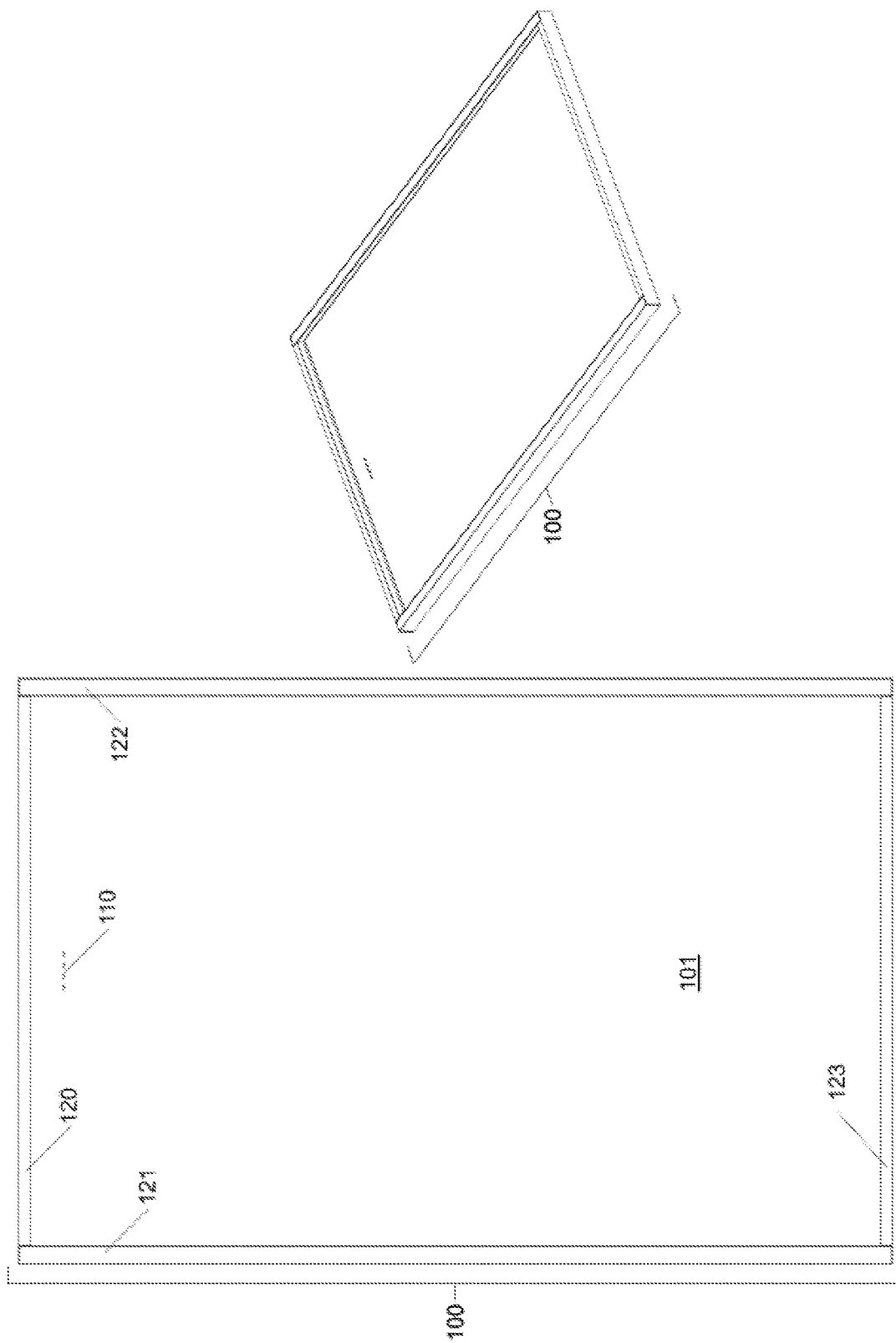

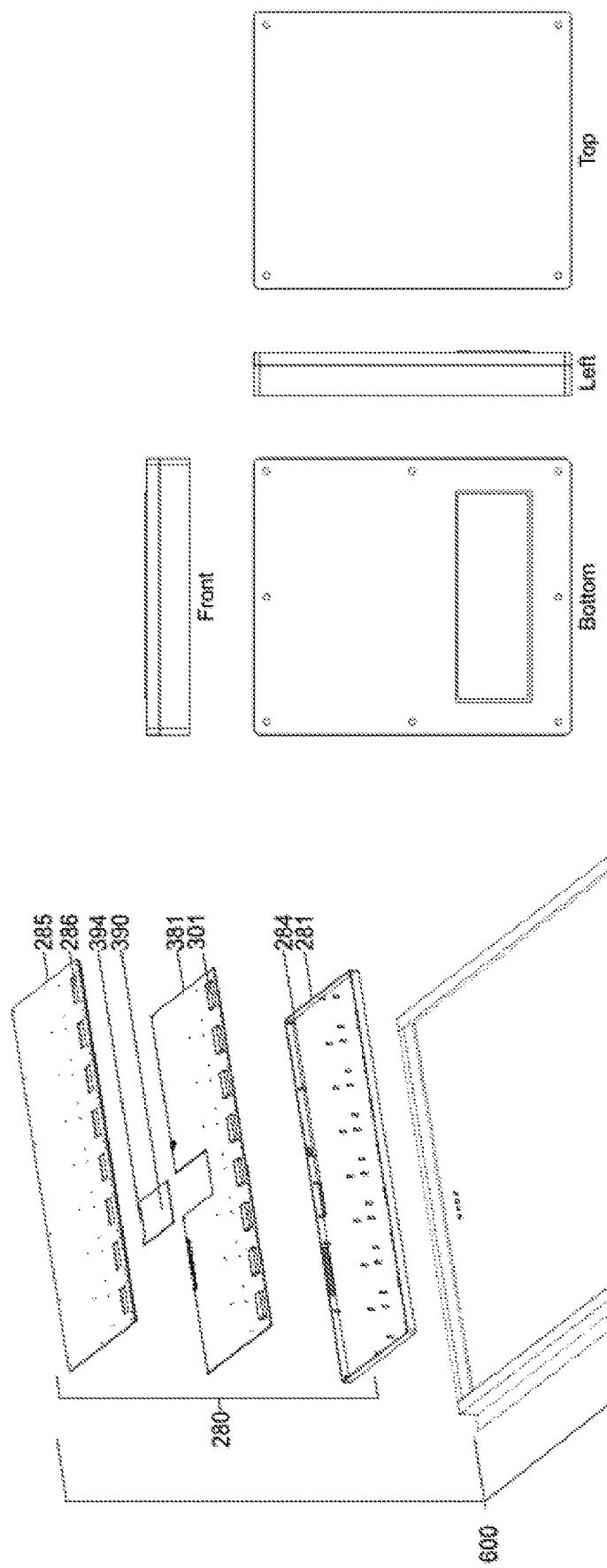

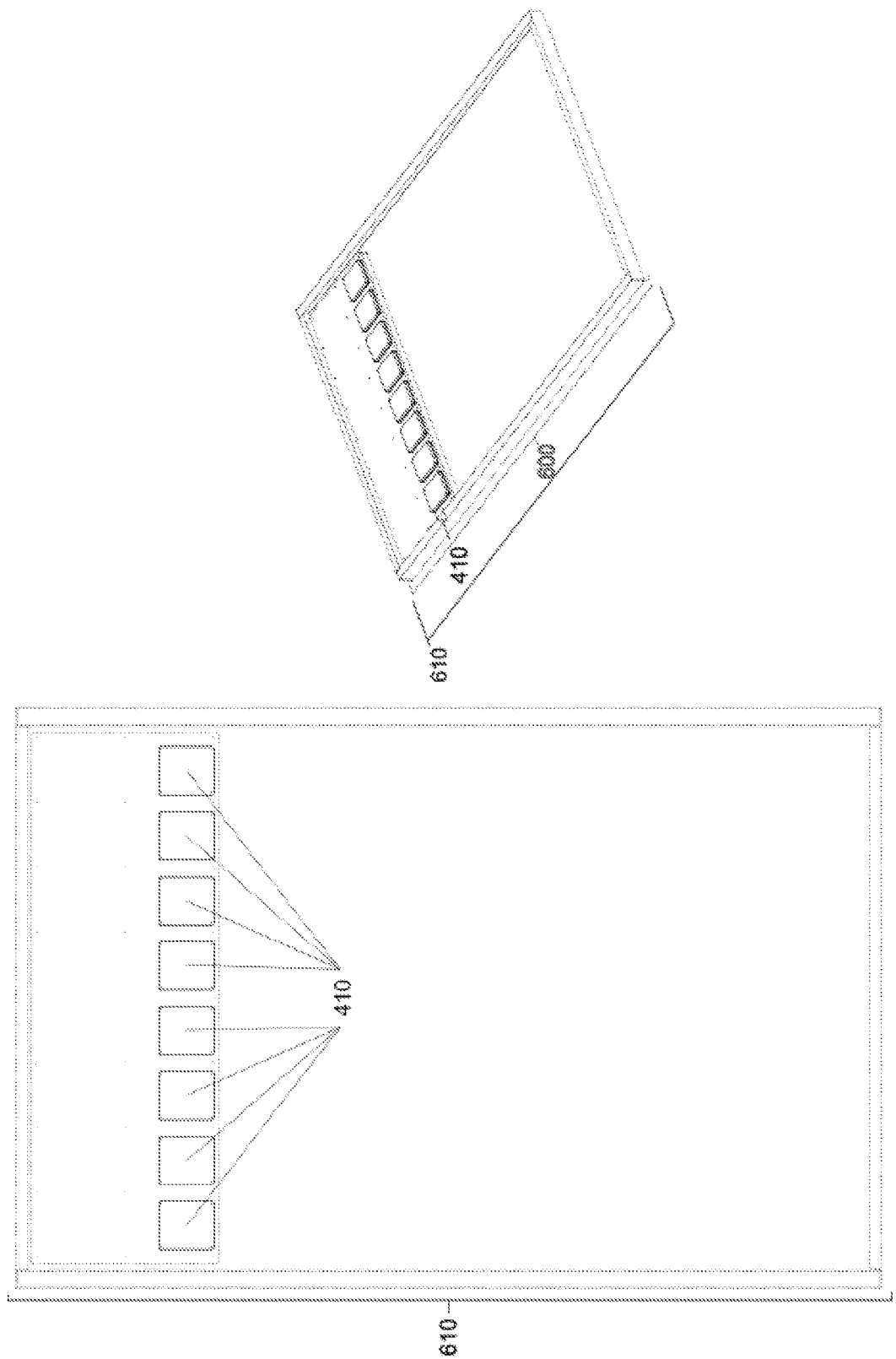

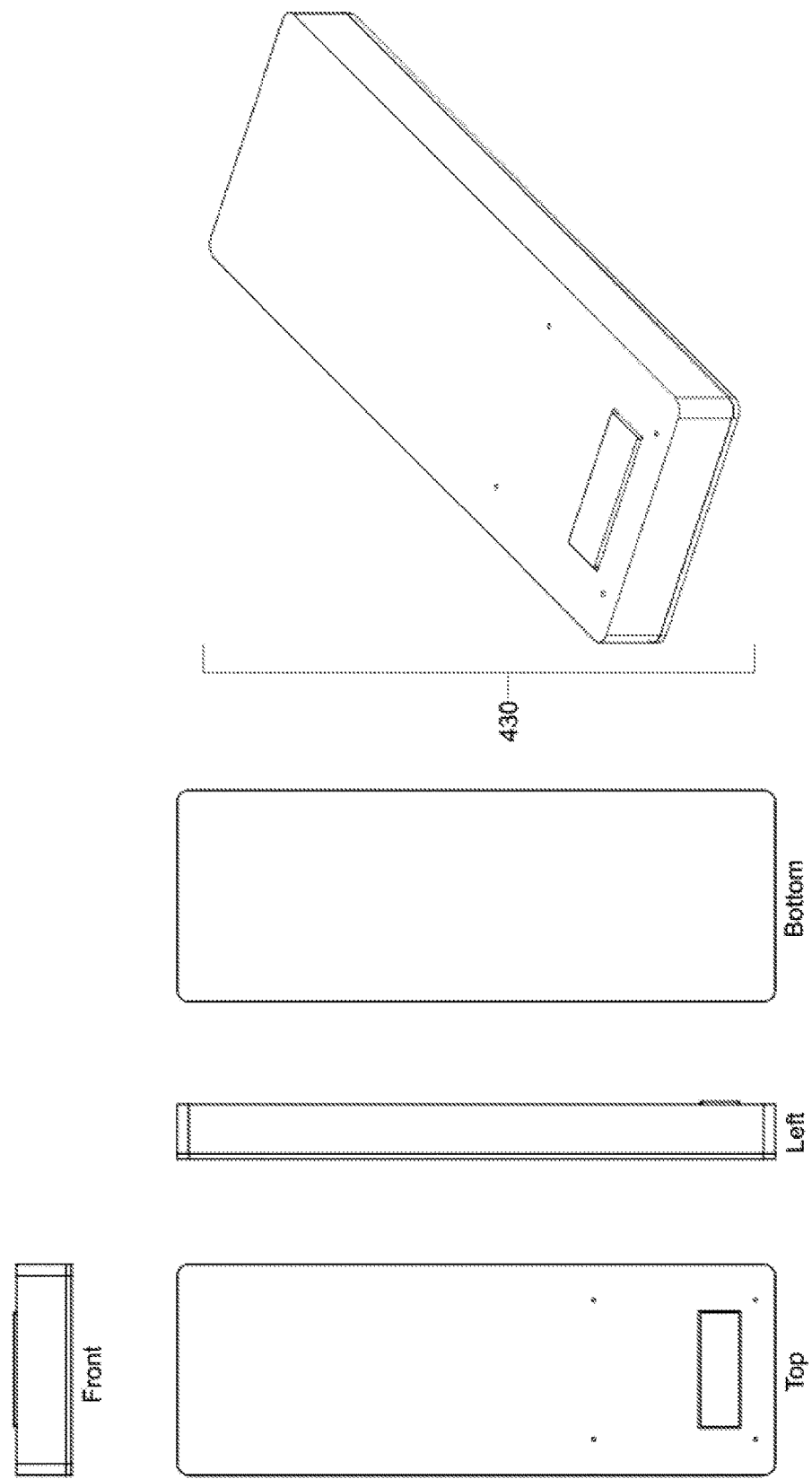

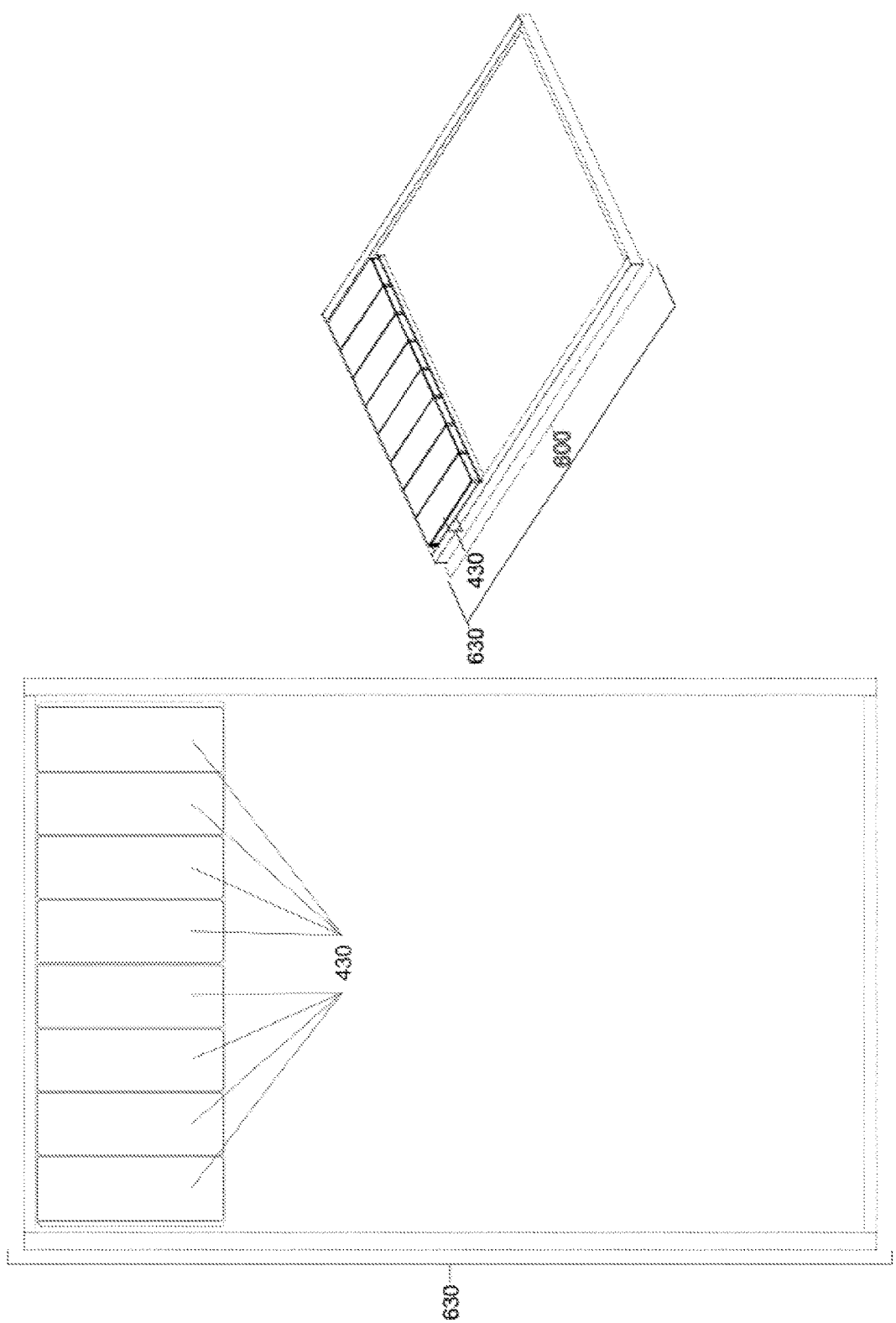

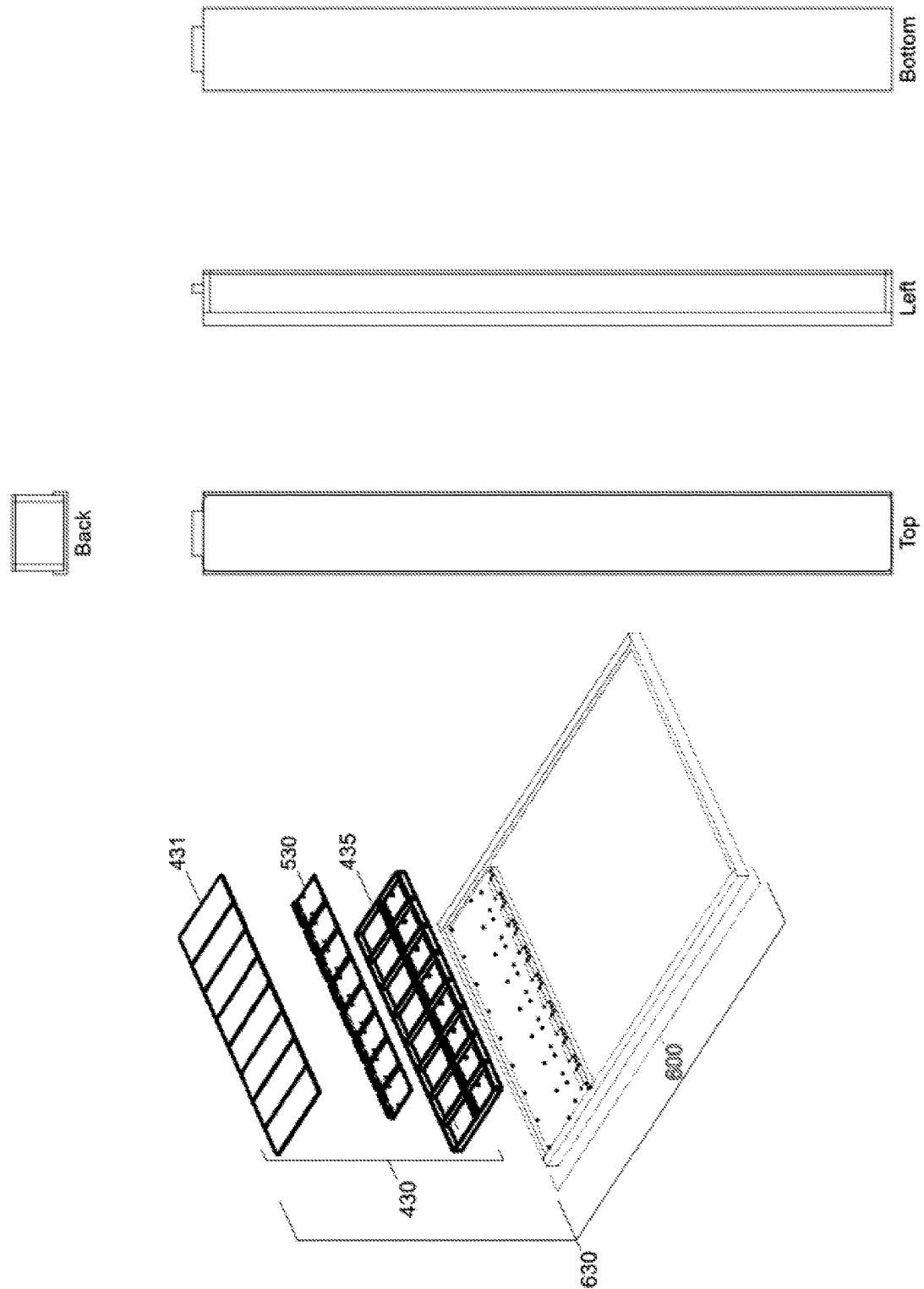

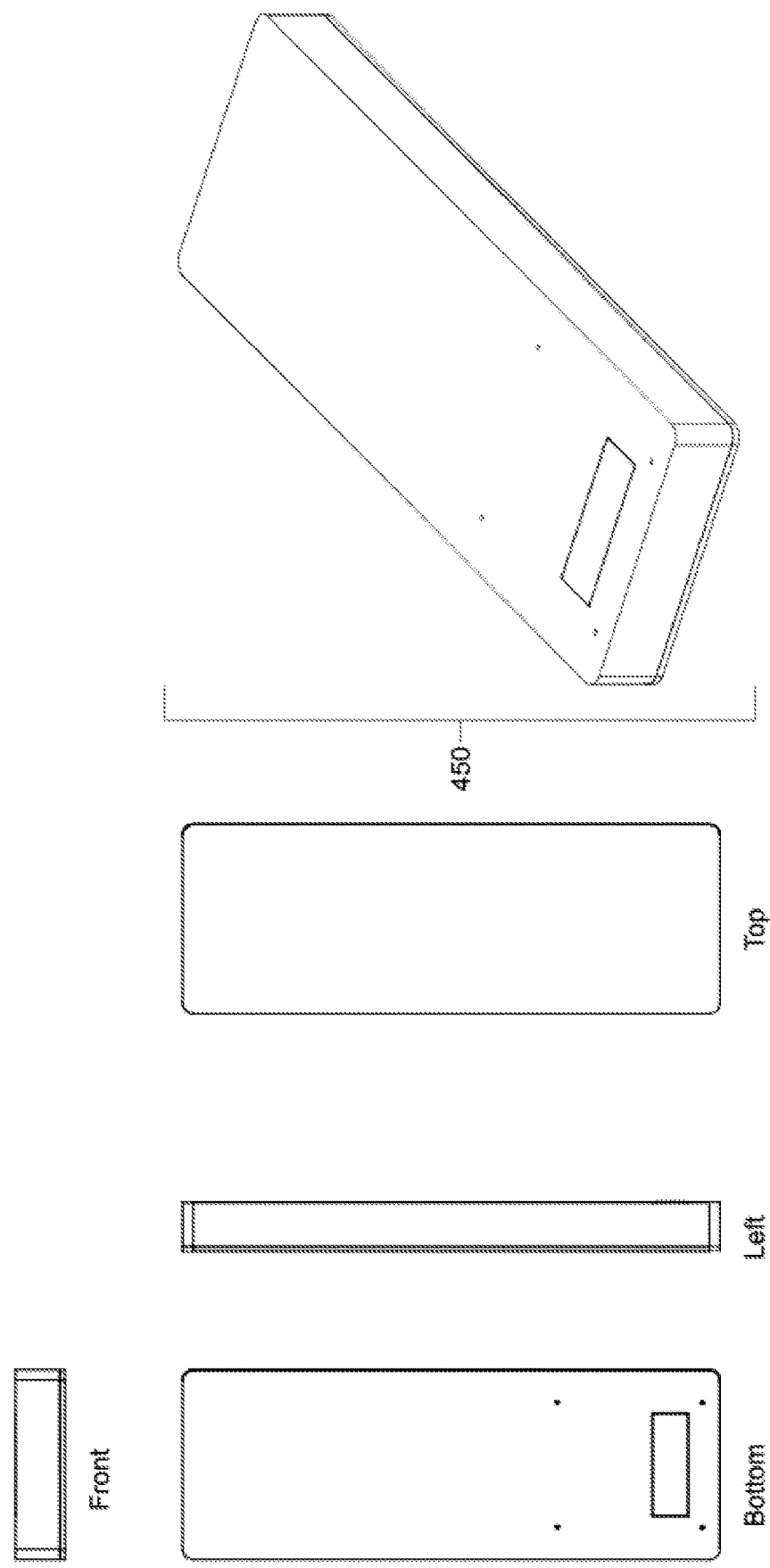

© 2021 Mavn, Inc.

© 2021 Mavn, Inc.

INFRASTRUCTURELESS DATA CENTER

This application generally relates to data centers and, in particular, how data centers can be built without using the greenhouse gas (GHG) emitting infrastructure used to build traditional data centers.

Climate change is the defining crisis of our time. The Fourth Industrial Revolution will redefine our relationship between technology, society, and the environment. Although we are currently losing the battle to control the catastrophic rise GHG emissions, we can win this war through technological innovation. As we come to terms with past generational failures to address how disadvantaged communities have not benefited from these advances and how their resources were unfairly used, we must ensure that current innovations are equitable, and run concurrent with being non-detrimental to the environment and help to mitigate the effects of climate change.

"And BY FAR [sic], the biggest use of energy and the largest GHG emissions associated with technology is the datacenter." (See *Datacenters—Get Ready for Scope* 3 at Submer.com) "Data centers are where the demands of digitalization and climate change collide. Organizations need new digital infrastructure to process and store the increasing amount of data they are generating—and they need it fast. But it is also necessary for that infrastructure to have as little impact as possible on the environment, and to run for decades despite a changing climate." (See *Data centers: balancing climate change and digital growth* at AECOM.com) "While most climate change activists are focused on limiting emissions from the automotive, aviation and energy sectors, it's the communications industry that is on track to generate more carbon emissions than all of the aforementioned sectors." (See *Why data centres are the new frontier in the fight against climate change* at ComputerWorld.com)

Data centers can be broken down into seven component categories.
  External infrastructure
  Internal infrastructure
  Electrical usage
  Carbon footprint
  Water footprint
  Water scarcity footprint
  Societal impacts The conglomeration of the component categories that may be needed to build and operate a data center may be referred to as a Hyper-Infrastructured Data Center (HIDC).

The external infrastructure needed to power an HIDC comprises power plants, Peaker plants, substations, transmission towers, transmission lines, and transformers. Together this external power infrastructure is often referred to as 'the grid.' Since HIDCs are needed for running our digital lives, they cannot rely on just one source of power. Redundancies are a facet of an HIDC. Additional measures are needed to maintain round-the-clock power to prevent a thermal runaway event which could cause a cascading failure, resulting in data loss, corrupted files, and damaged equipment.

The internal infrastructure of an HIDC includes, but is not limited to, numerous elements such as concrete, steel, lead, server cabinets, server chassis, plastics, lighting, cages, elevators, stairwells, conduit, electrical panels, multiple roofs, fire prevention systems, HVAC systems, computer room air conditioners, computer room air handlers, electrostatic control systems, humidifiers, fans, power conditioning and distribution units, office space, on-site diesel generators, diesel storage tanks, and uninterruptable power supplies. The internal infrastructure needed for each HIDC to intake, filter, circulate and expel water requires water pipes, filtration systems, corrosion control systems, electrical pumps, water meters, valves, and other associated parts. An on-site wastewater remediation facility must often be set up so that any gray water that leaves the HIDC meets governmental water standards.

According to OurWorldInData.org, the "energy-related emissions from the manufacturing of iron and steel" (See *Sector by sector: where do global greenhouse gas emissions come from?* at OurWorldInData.org) account for 7.2% of the world's greenhouse gas emissions. Steel is used in the construction of one HIDC amounts to "12,152 tons: nearly twice the amount used in the Eiffel Tower." (See *Touring Facebook's Gallatin data center: reaching the summit of Mount Crushmore* at Tennessean.com). This staggering amount is just to erect the data center building(s) and does not include the weight of the server cabinets and the server chassis within them. Exacerbating the HIDCs steel usage, "a hypothetical 300,000-square-foot data center could fit more than 12,000 racks and cabinets." (See *Data Center Design Overview: Cabinet Layout, Rack Design, & More* at blog.Enconnex.com) For a single 1,000,000-square-foot data center, this would add an additional approximately 48,000,000 pounds (approximately 24,000 tons) of steel, for a combined total of over 36,000 tons of steel. The GHG footprint of producing and transporting this much steel, in addition to the GHG footprint of constructing the data center itself is significant. And these staggering numbers only apply to the steel that is used in a data center. In addition to steel, other materials such as concrete, copper, plastic, etc. are also used and have corresponding GHG emissions.

In addition to GHG emissions of the materials, a 2012 article from the New York Times stated that on an annual global basis, data centers "use about 30 billion watts of electricity, roughly equivalent to the output of 30 nuclear power plants." (See *Power, Pollution and the Internet* at NYTimes.com). "In 2015 alone, the world's data centers used up 416.2 TWh of electricity—higher than the UK's total energy consumption in that year. This number was estimated to double every 4 years, despite innovations in hardware that massively increase their capacity to store data. This degree of data center growth is unsustainable beyond the next 10-15 years, according to Ian Bitterlin, Britain's foremost data center expert and formerly, a visiting professor at the University of Leeds." (See *The Link Between Internet Use and Global Warming* at Science.TheWire.in) An article published in 2021 says "the modern data center operates with little human activity, yet in aggregate worldwide, consumes nearly 3% of the world's power production. As digital transformation increases, data center energy consumption could soon reach 8%." (See *Data Centers & the Environment* 2021—*Report on the State of the Green Data Center* at DataCenterDynamics.com) and the amount of electricity and infrastructure will continue to grow with each bit and byte of information added to data centers. "The communications industry could use 20% of all the world's electricity by 2025, hampering attempts to meet climate change targets and straining grids as demand by power-hungry server farms storing digital data from billions of smartphones, tablets and internet-connected devices grows exponentially." (See *'Tsunami of data' could consume one fifth of global electricity by* 2025 at TheGuardian.com)

HIDCs are so energy intensive, they consume more electricity than some countries can produce, causing a shortage of electricity for the average citizen. "Data centers in Ireland are now consuming more electricity than all the rural homes in the country, . . . " (See *Data centres are consuming more electricity than rural homes in Ireland for the first time* at EuroNews.com) "A recent study . . . indicates that by 2030, the power requirements of Japan's data centers will exceed the nation's entire electricity generation capacity." (See *Data Center Cooling Market-Growth, Trends, COVID-19 Impact, and Forecasts* (2022-2027) at MordorIntelligence.com)

Every HIDC has a large carbon footprint. "The estimates by various sources suggest that the data center accounts for 2% to 5% of the global Green House Gas (GHG) emissions." (See *Data Center Cooling Market-Growth, Trends, COVID-19 Impact, and Forecasts* (2022-2027) at MordorIntelligence.com) This is higher than the yearly total for the Aviation industry. "It accounts for around 2.5% of global $CO_2$ emissions, but 3.5% when we take non-$CO_2$ impacts on climate into account." (See *Climate change and flying: what share of global $CO_2$ emissions come from aviation* at OurWorldInData.com)

Heat is the waste by-product of computation. An HIDC must keep its internal temperature cool enough to prevent overheating. In addition to air conditioning, water is unique with its ability to absorb heat. One HIDC can digest millions of gallons of water per day for cooling. The usage of water is known as their "Water Footprint" and every HIDC has one. Globally, the water footprint of all HIDC's is estimated to be "1218 billion liters/day." (See *Data centre water consumption* at Nature.com)

HIDCs also have a Water Scarcity Footprint. This is the stress created by an HIDC on local water resources. "Data centers' heavy reliance on water-scarce basins to supply their direct and indirect water requirements not only highlight the industry's role in local water scarcity, but also exposes potential risk since water stress is expected to increase in many watersheds due to increases in water demands and more intense, prolonged droughts due to climate change." (See *The environmental footprint of data centers in the United States* at IoPScience.IoP.org)

Local environmental impacts are a byproduct of HIDCs. "Currently, datacenters discard 98% of the electricity they use as excess heat" (See *Heat in your datacenter: How to transform your biggest loss into a gain* at Submer.com) back into the surrounding environment. Additionally, noise pollution, also known as acoustic waste, is causing headaches for residents. An article published by ABC15.com, Chandler, Arizona is considering banning data centers amid noise complaints. "It is a loud hum. It's 24/7 and it's very irritating because it never goes away." (See *Chandler to consider banning data centers amid noise complaints* at ABC15.com)

In addition to environmental impacts, there are societal consequences caused by HIDCs. The competition for natural resources is a direct threat to every nation's national security. "The United Nations Environment Programme (UNEP) suggests that in the last 60 years, at least 40 percent of all intrastate conflicts have a link to natural resources, and that this link doubles the risk of a conflict relapse in the first five years." (See *Conflict and Natural Resources* at PeaceKeeping.UN.org). The HIDC is also impacting Biodiversity. "Data centers occupy actual land, and it is the human race's use and misues [sic] of land which is one of the prime causes of species loss." (See *What has biodiversity got to do with data centers?* at DataCenterDynamics.com)

"Data Centers are one of the most energy intensive building types, consuming 10 to 50 times the energy per floor space of a typical commercial office." (See *ENERGY STAR Expands Efforts to Improve Energy Efficiency of U.S. Data Centers* at EPA.gov). Based on available data, data centers are heavily dependent upon resources from the following industries significantly raising each industry's annual GHG emissions:

Fossil fuel extraction and refining 10%
Iron and Steel production 7.2%
Commercial buildings 6.6%
Concrete 4.5%
Wastewater 1.3%
Pipelines 0.3%

These six industries account for a combined total of 29.9% of the world's annual GHG emissions. (See *Sector by sector: where do global greenhouse gas emissions come from?* at OurWorldInData.org)

Overcoming the significant environmental costs to build and operate HIDCs in a manner that is environmentally friendly may be challenging.

SUMMARY

In an embodiment, an infrastructureless data center is disclosed. The infrastructureless data center comprises a plurality of base nodes. Each base node comprises a photovoltaic panel. The infrastructureless data center further comprises a plurality of compute assemblies attached to one of the base nodes, each compute assembly comprising at least one processing device. The infrastructureless data center further comprises plurality of storage assemblies attached to one of the base nodes, each storage assembly comprising at least one data storage device. The infrastructureless data center further comprises a plurality of network assemblies attached to one of the base nodes, each network assembly comprising at least one network device.

In an embodiment, each base node comprises a carrier plane. The carrier plane is attached to the photovoltaic panel of that base node and comprises a plurality of carrier plane data connectors. In some embodiments, each compute assembly may comprise a compute assembly data connector that is configured to connect to a corresponding one of the carrier plane data connectors of the carrier plane of the base node to which the plurality of compute assemblies is attached. In some embodiments, each storage assembly may comprise a storage assembly data connector that is configured to connect to a corresponding one of the carrier plane data connectors of the carrier plane of the base node to which the plurality of storage assemblies is attached. In some embodiments, each network assembly may comprise a network assembly data connector that is configured to connect to a corresponding one of the carrier plane data connectors of the carrier plane of the base node to which the plurality of network assemblies is attached.

In some embodiments, the infrastructureless data center further comprises a given compute assembly, a given storage assembly and a given network assembly each attached to the same one of the base nodes and the given compute assembly, the given storage assembly and the given network assembly each comprise data connectors that are configured to connect to the carrier plane data connectors of the carrier plane of the base node to which the given compute assembly, the given storage assembly and the given network assembly are attached.

In another embodiment, the infrastructureless data center comprises a plurality of power assemblies attached to one of the base nodes. Each power assembly comprises a plurality of power storage devices that are configured to store power generated by the photovoltaic panel of the base node to which the plurality of power assemblies is attached. In an embodiment, a corresponding plurality of power assemblies is attached to each base node of the plurality of base nodes. In some embodiments, the power storage devices of each power assembly are disposed in a two-layer configuration.

In some embodiments, the infrastructureless data center comprises a first grouping of base nodes of the plurality of base nodes. Each base node in the first grouping of base nodes having a corresponding plurality of compute assemblies attached thereto. The first grouping of base nodes forming a compute cluster. The infrastructureless data center further comprising a second grouping of base nodes of the plurality of base nodes. Each base node in the second grouping of base nodes having a corresponding plurality of storage assemblies attached thereto. The second grouping of base nodes forming a storage cluster.

In an embodiment, an infrastructureless data center is disclosed. The infrastructureless data center comprises a plurality of carrier planes. Each carrier plane is configured to attach to a corresponding photovoltaic panel of a plurality of photovoltaic panels. The infrastructureless data center further comprises a plurality of assemblies, each assembly being configured to connect to a corresponding carrier plane of the plurality of carrier planes.

In some embodiments, the plurality of assemblies comprises a compute assembly, a storage assembly and a network assembly, the compute assembly comprises at least one processing device, the storage assembly comprises at least one data storage device and the network assembly comprises at least one network device. In an embodiment, the compute assembly, the storage assembly and the network assembly are each configured to attach to the same carrier plane of the plurality of carrier planes.

In another embodiment, the infrastructureless data center further comprises a plurality of power assemblies. Each power assembly is configured to attach to a corresponding photovoltaic panel of the plurality of photovoltaic panels and each power assembly comprises a plurality of power storage devices that are configured to store power generated by the corresponding photovoltaic panel to which that power assembly is attached.

In an embodiment, a given carrier plane of the plurality of carrier planes is configured to attach to a given photovoltaic panel of the plurality of photovoltaic panels, a given assembly of the plurality of assemblies is configured to connect to the given carrier plane and a given power assembly of the plurality of power assemblies is configured to attach to the given photovoltaic panel.

In some embodiments, the carrier plane comprises a plurality of carrier plane data connectors. In an embodiment, each assembly of the plurality of assemblies comprises an assembly data connector that is configured to connect to a corresponding carrier plane data connector of the plurality of carrier plane data connectors.

In an embodiment, an infrastructureless data center is disclosed. The infrastructureless data center comprises a carrier plane that is configured to attach to a photovoltaic panel and a data center assembly that is configured to connect to the carrier plane.

In some embodiments, the data center assembly comprises one of a compute assembly comprising at least one processing device, a storage assembly comprising at least one data storage device, a network assembly comprising at least one network device and a power assembly comprising at least one power storage device. In an embodiment, the data center assembly comprises a first data center assembly and the infrastructureless data center further comprises a second data center assembly that is configured to connect to the carrier plane. The second data center assembly comprises another of the compute assembly, the storage assembly, the network assembly and the power assembly. The second data center assembly being different than the first data center assembly.

The foregoing summary is illustrative only and is not intended to be in any way limiting where the illustrative aspects, embodiments, and features described above may be combined in any manner without departing from the scope of the present application. In addition to the illustrative aspects, embodiments, and features described above, further aspects, embodiments, and features will become apparent by reference to the drawings and the following detailed description.

BRIEF DESCRIPTION OF THE DRAWINGS

The disclosed embodiments illustrated in the figures of the accompanying drawings are meant to be exemplary and not limiting, where like references are intended to refer to like or corresponding parts.

FIGS. 6A (orthogonal) and 6B (isometric) are views of the back of a PV panel with a computing device and voltage regulators mounted on support structures attached to the PV panel's mounting frame according to an embodiment.

FIGS. 7A (orthogonal) and 7B (isometric) are views of the electrical components added to the embodiments shown in FIGS. 6A, 6B, 9A and 9B according to an embodiment.

FIGS. 9A (orthogonal) and 9B (isometric) are views of the back of a PV panel with voltage regulators and a computing device mounted inside an Infrastructureless™ enclosure base according to an embodiment.

FIGS. 9C (orthogonal) and 9D (isometric) are views of the Infrastructureless™ enclosure base of FIGS. 9A and 9B with an Infrastructureless™ enclosure cover according to an embodiment.

FIGS. 10A (orthogonal) and 10B (isometric) are views of the back of the PV panel of FIGS. 1A, 1B and 10 without the electrical junction box, electrical wires, and electrical connectors according to an embodiment.

FIGS. 17A (orthogonal), 17B (isometric) and 17C (exploded isometric) are views of an Infrastructureless™ Network node comprising multiple Infrastructureless™ NM assemblies of FIGS. 16A, 16B, 16C and 16D mounted on the ACP of an Infrastructureless™ Base Node of FIGS. 11A, 11B and 11C according to an embodiment.

DETAILED DESCRIPTION

Figures 1A, 1B:
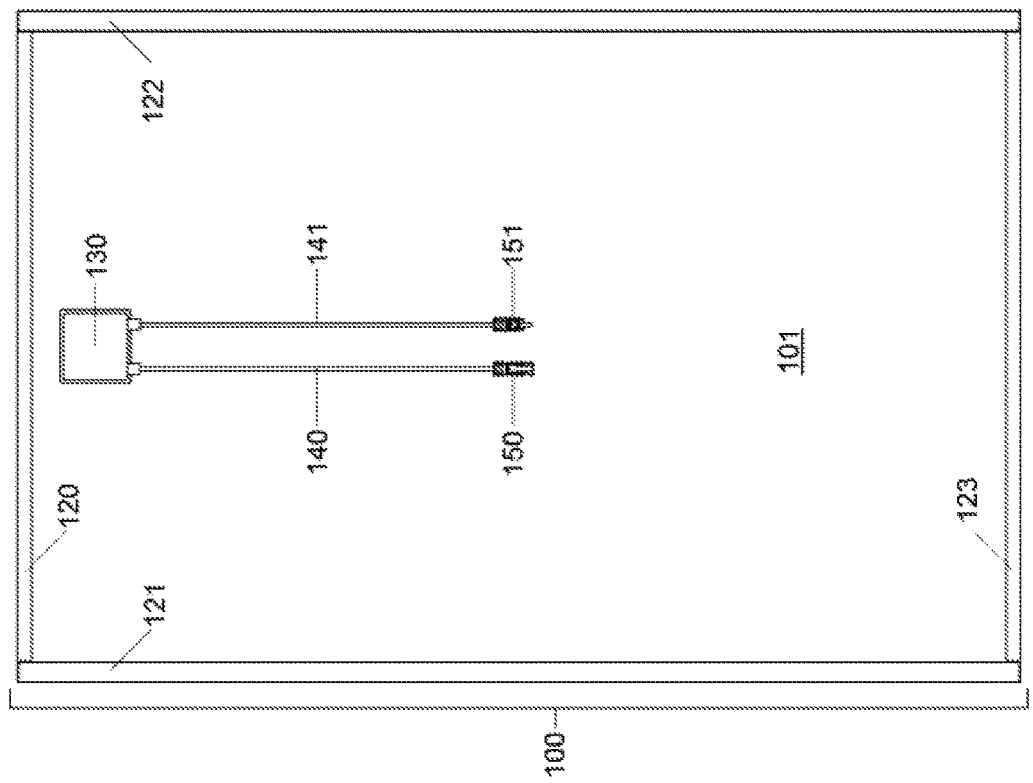
FIGS. 1A (orthogonal) and 1B (isometric) are views of the bottom (the surface that faces away from the sky when installed) of a PV panel according to an embodiment.

Subject matter will now be described more fully hereinafter with reference to the accompanying drawings, which form a part hereof, and which show, by way of illustration, exemplary embodiments. Subject matter may, however, be embodied in a variety of different forms and, therefore, covered or claimed subject matter is intended to be construed as not being limited to any example embodiments set forth herein. Example embodiments are provided merely to be illustrative. It is to be understood that other embodiments may be utilized, and structural changes may be made without departing from the scope of the claimed embodiments. Likewise, a reasonably broad scope for claimed or covered subject matter is intended. Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be taken in a limiting sense.

Illustrative embodiments comprise components that may be mounted to the back, i.e., the surface facing away from the sky when installed, of a photovoltaic (PV) panel or mounted on a component that is mounted to the back of a PV panel.

As disclosed herein, PV panels may comprise some or all of:
1. Glass
2. Encapsulant (adhesive layer)
3. An array of PV cells
4. Circuit Ribbons
5. Another encapsulant (adhesive layer)
6. A sheet of laminate
7. An electrical junction box
8. Electrical wires
9. Electrical connectors
10. Mounting Frame The circuit ribbons may comprise, for example, highly conductive metal strips connecting the electrical terminals from the individual PV cells. In some embodiments, the circuit ribbons lay parallel between the PV cells and the sheet of laminate and may protrude perpendicularly through the sheet of laminate to be connected to electrical wires in the electrical junction box.

The PV panels disclosed herein may conform to industry manufacturing standards for commercial or residential class PV panels or may deviate from industry standards. Any type of PV panel may be utilized in the illustrative embodiments where the illustrative embodiments may vary depending on the type of PV panel used. For example, some PV panels may comprise ends of the circuit ribbons protruding perpendicularly from the back of the panel centered near one end (i.e., a short edge) of the PV panel to which the positive and negative electrical wires can be connected. Other PV panels may comprise the ends of the circuit ribbons toward the middle of each opposing side (i.e., long edge) of the PV panel or from adjacent corners near the intersections of two sides (i.e., long edges) with an end (i.e., short edge) of the PV panel.

The following definitions are used throughout this application:

A. The front of a PV panel refers to the surface that faces the toward the sky when installed. Similarly, the back of a PV panel refers to the surface that faces away from the sky when installed.

B. The terms "PV panel" and "PV panel assembly" are used through this document. The term "PV panel" may include, for example, some or all of items 1, 2, 3, 4, 5, and 6 from the list above. The term "PV panel assembly" may also include, for example, some or all of items 7, 8, 9 and 10. The PV panel or the PV panel assembly may also or alternatively comprise any other components commonly found in PV panels.

C. In an illustrative embodiment, one or more additional components may be attached, connected or integrated onto the back of a PV panel assembly to provide a portion of an Infrastructureless™ Data Center. The drawings that include references to the basic components of a PV panel assembly are FIGS. 1A, 10A, and 22A. The drawings of various illustrative embodiments may show some or all of those components on the back of a PV panel assembly drawn with dotted lines.

D. To aid in keeping the focus on the additional components that provide a portion of an Infrastructureless™ Data Center, references to those components in an illustrative embodiment are provided.

F. For illustrative purposes, the PV panel defined in A, B and C of this list may be capable of producing 60 volts (60V) of direct current (DC) electricity at a current of 6 amps (6 A) or 360 watts (360 W). In other embodiments, the PV panel defined in A, B and C of this list may be capable of producing any other voltage of DC electricity at any other amperage or wattage.

G. The term "computing device" is generically used to describe a printed circuit board (PCB) comprising, for example, a processor, a microprocessor, a microcontroller, an application-specific integrated circuit (ASIC), a field-programmable gate array (FPGA), a graphics processing unit (GPU), a PCB or other type of processing circuitry, as well as portions or combinations of such circuitry elements. In some embodiments, the PCB may be a mainboard, a motherboard or any other type of circuit board. As an example, a motherboard may comprise a PCB having expansion capabilities such as those used in personal computers. A mainboard may comprise a PCB having no additional expansion capability such as those used in mobile devices. If the expansion capability of a motherboard is not used, the motherboard may be utilized as a mainboard.

FIGS. 1A and 1B are an illustrative embodiment of the back of a PV panel assembly 100. PV panel assembly 100 comprises a PV panel 101 having mounting frame structures 120, 121, 122, and/or 123 attached to each edge of the four edges of PV panel 101. Adhered or attached to the back of PV panel 101 is an electrical junction box 130 covering the ends of circuit ribbons 110 (FIG. 10A). In some embodiments, electrical junction box 130 is weatherproof or otherwise configured to inhibit the intrusion of outside environmental elements from affecting or damaging components within electrical junction box 130. The circuit ribbons 110 (FIG. 10A) are connected to one end of electrical wires 140 and 141. Typically, electrical junction box 130 may comprise high-voltage diodes (not shown) between the ends of the circuit ribbons 110 enabling negative DC (−DC) current to flow through electrical wire 140 and positive DC (+DC) current to flow through electrical wire 141. Attached to the ends of electrical wires 140 and 141 opposite circuit ribbons 110 (FIG. 10A) are electrical connectors 150 and 151, respectively, which may comprise weatherproof electrical connectors.

The illustrative embodiments in FIGS. 3A through 9D will build upon the illustrative embodiment of PV panel assembly 100 (FIG. 1A) by attaching, connecting or integrating one or more additional components onto the back of a PV panel assembly 100 to provide a portion of an Infrastructureless™ Data Center. For illustrative purposes, a dotted outline of PV panel assembly 100 (FIG. 1A) is provided in FIGS. 5A through 9D.

Figures 2A, 2B:
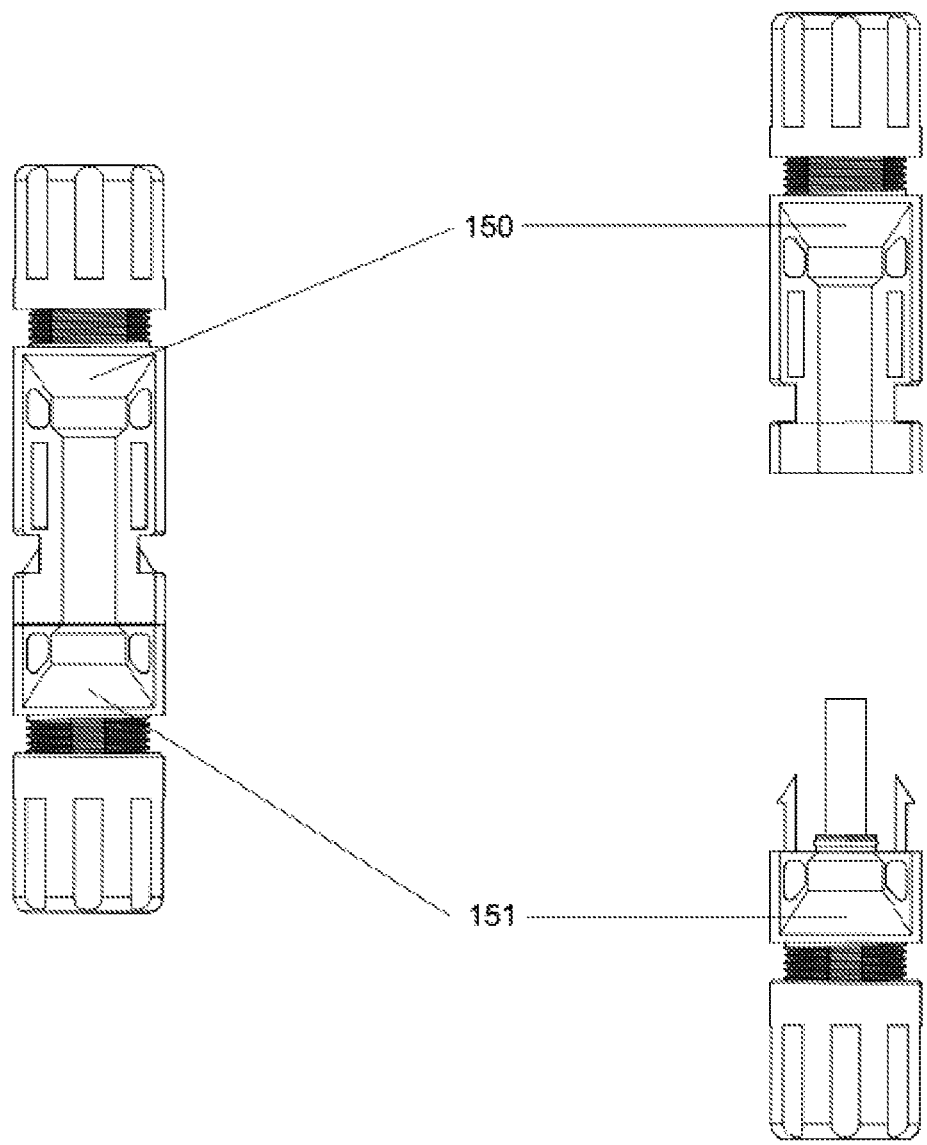
FIGS. 2A (coupled) and 2B (uncoupled) are views of an electrical connector according to an embodiment.

FIG. 2A (coupled) and FIG. 2B (uncoupled) are an illustrative embodiment of electrical connectors 150 and 151. In some embodiments, electrical connectors 150 and 151 comprise industry standard MC4 electrical connectors that are used to connect PV panels to each other or to an inverter (e.g., DC-to-AC converter). As shown in FIGS. 1A, 2A and 2B, electrical connector 150 comprises a female MC4 electrical connector that is connected to an end of the −DC wire 140 and electrical connector 151 comprises a male MC4 electrical connector that is connected to an end of the +DC wire 141.

Figure 3A:
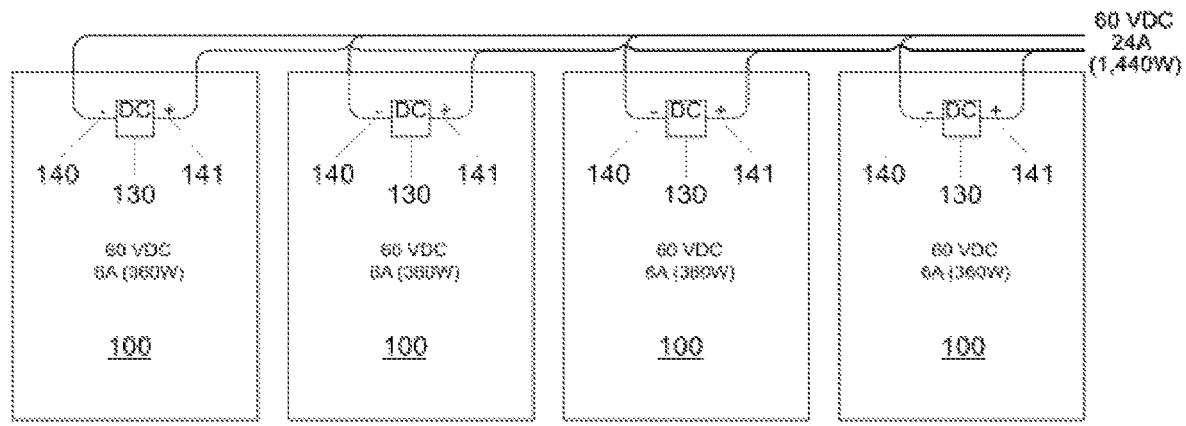
FIGS. 3A, 3B, 3C and 3D are block diagrams showing different configurations of multiple PV panels electrically connected according to an embodiment.

The configuration of one or more PV panel assemblies 100 (FIG. 1A) is extremely flexible depending on the needs of the user. When more power is needed than can be provided by a single PV panel assembly 100 (FIG. 1A), multiple PV panel assemblies 100 (FIG. 1A) may be connected together in serial (i.e.: where +DC electrical wire 141 from a given PV panel assembly 100 is connected to the −DC electrical wire 140 of the adjacent PV panel assembly 100) forming groups of PV panel assemblies 100. The groups of PV panel assemblies 100 may also be connected together in parallel (i.e., where −DC electrical wires from each group are connected together and the +DC electrical wires from each group are connected together). Therefore:

When more amperage (wattage) is needed than can be generated by a single PV panel assembly 100 (FIG. 1A), the electrical wires from the groups of PV panels can be connected in parallel. FIG. 3A illustrates an example configuration of PV panel assemblies 100 (FIG. 1A) having four groups with one PV panel assembly 100 (FIG. 1A) in each group. Each of the groups are connected to the other groups in parallel. Using the example 60 VDC at 6 A (360 W) defined above, each group would produce 60 VDC at 6 A (360 W). When the groups are connected together in parallel this example configuration would produce 60 VDC at 24 A (1,440 W).

Figure 3B:
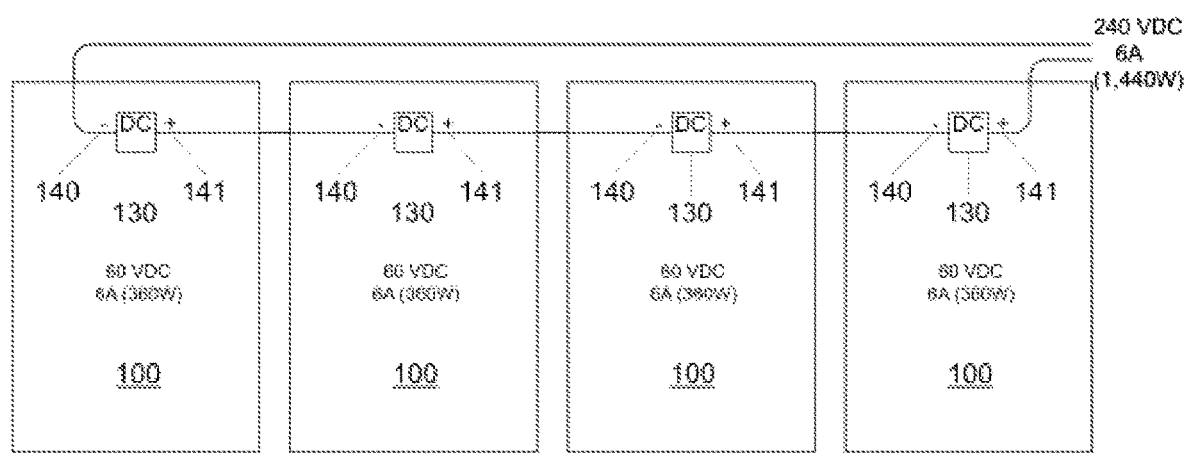

When more voltage is needed than can be generated by a single PV panel assembly 100 (FIG. 1A), multiple PV panel assemblies 100 (FIG. 1A) can be connected in series. FIG. 3B illustrates an example configuration of PV panel assemblies 100 (FIG. 1A) having four PV panel assemblies 100 (FIG. 1A) that have been connected in series to form single group. Using the example 60 VDC at 6 A (360 W) mentioned above, this group would produce 240 VDC at 6 A (1,440 W).

When both more amperage (wattage) and more voltage is needed than can be generated by a single PV panel assembly 100 (FIG. 1A), multiple groups of serially connected PV panels assemblies 100 (FIG. 1A) can be connected in parallel.

Figure 3C:
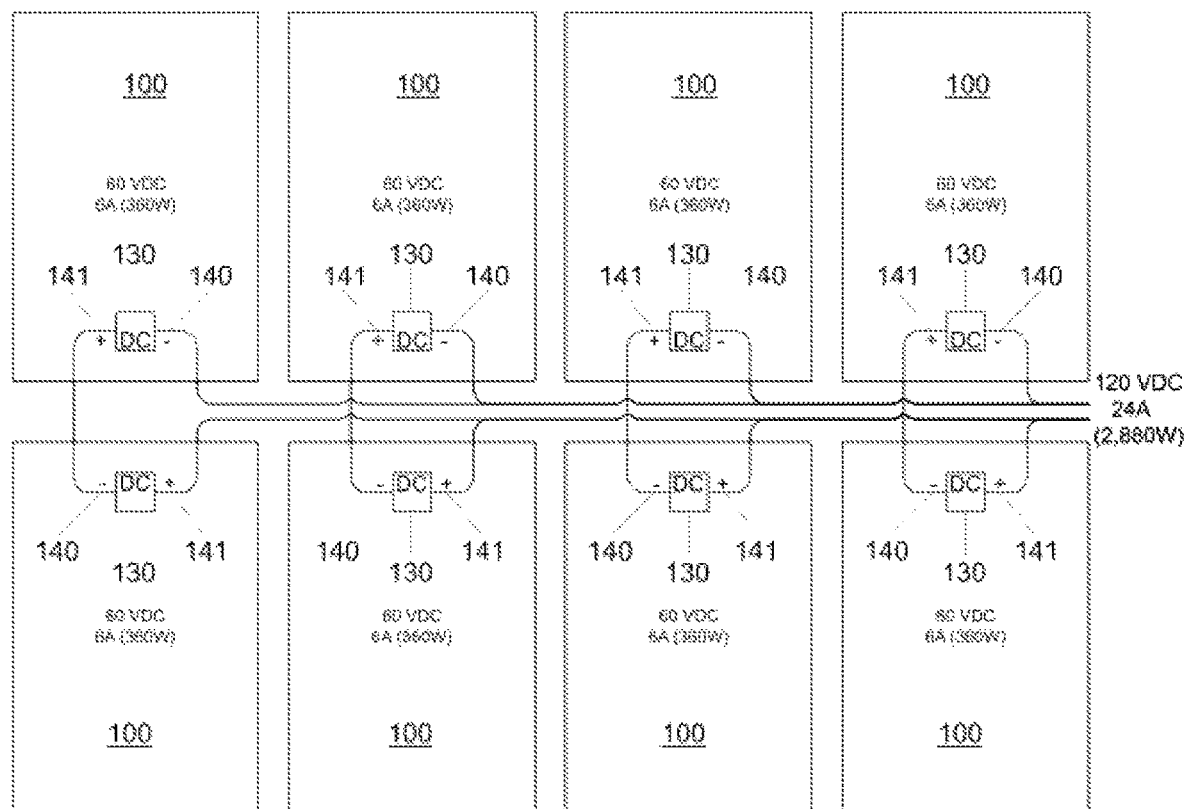

In FIG. 3C an additional PV panel assembly 100 (FIG. 1A) has been added in series to each of the four groups of PV panel assemblies 100 (FIG. 1A) from FIG. 3A. The two PV panel assemblies 100 (FIG. 1A) in each group produce 120 VDC at 6 A (720 W). When combined, the electrical capacity for the entire example configuration is 120 VDC at 24 A (2,880 W).

Figure 3D:

FIG. 3D illustrates another example configuration of PV panel assemblies 100 (FIG. 1A) that may provide more amperage and voltage. As shown in the example configuration, there are two groups of PV panel assemblies 100 (FIG. 1A) each having four PV panel assemblies 100 (FIG. 1A) connected in series with the two groups being connected in parallel. Each group produces 240 VDC at 6 A (1,440 W) with the example configuration having a combined electrical capacity of 240 VDC at 12 A (2,880 W).

While the embodiments of FIGS. 3A, 3B, 3C and 3D are described above as having particular configurations of PV panel assemblies 100 (FIG. 1A), any other configurations having groups of PV panel assemblies 100 (FIG. 1A) connected in series, parallel or both may alternatively be utilized depending on the voltage, amperage and wattage requirements of a particular system or load connected to PV panel assemblies 100 (FIG. 1A) in other embodiments. For example, any number of PV panel assemblies 100 (FIG. 1A) may be connected in series to form groups of any size and any number of groups of PV panel assemblies 100 (FIG. 1A) may be connected in parallel. In addition, each group of PV panel assemblies 100 (FIG. 1A) may comprise any number of PV panel assemblies 100 (FIG. 1A) connected in series where, for example, an example configuration may comprise one or more groups connected in parallel that have different numbers of PV panel assemblies 100 (FIG. 1A) connected in series depending on the voltage, amperage and wattage requirements of the connected system or load.

The manner of connecting PV panel assemblies 100 (FIG. 1A) in series and parallel as described above according to voltage and amperage (wattage) requirements makes it possible to power a wide range of devices or loads in an expandable manner. For example, several devices each requiring very little electricity may be powered by a single PV panel assembly 100 (FIG. 1A) while a single device requiring a substantial amount of electricity may be powered by multiple PV panels assemblies 100 (FIG. 3A, 3B, 3C or 3D).

In illustrative embodiments, PV panel assemblies 100 (FIG. 1A) are utilized to support an Infrastructureless™ Data Center that is easily expandable as will be described in more detail below.

Certain U.S. states are banning the sale of certain energy intensive computers because of the increased demand they put on the state's electrical infrastructure (aka 'the grid'). (See *No, Gaming PCs Are Not Being Banned In Several US States* at TheGamer.com). One solution is to connect the energy intensive computer to a different source of electricity than 'the grid'.

Figure 4C:
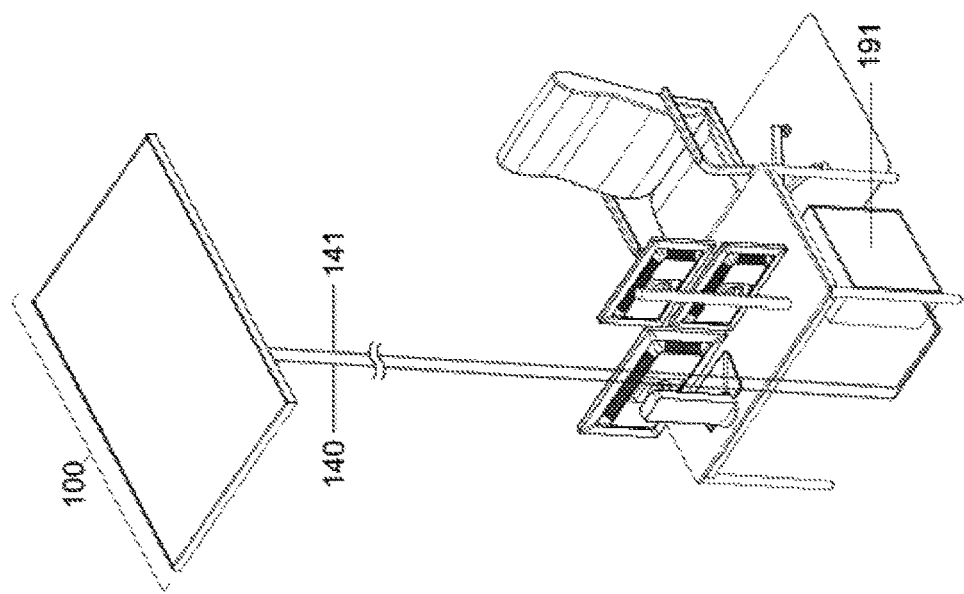
FIG. 4A (orthogonal), FIG. 4B (perspective) and FIG. 4C (isometric) are views of a PV panel having electrical wires connected to the electrical terminals of a computing device (e.g., personal gaming computer) according to an embodiment.
Figure 4B:
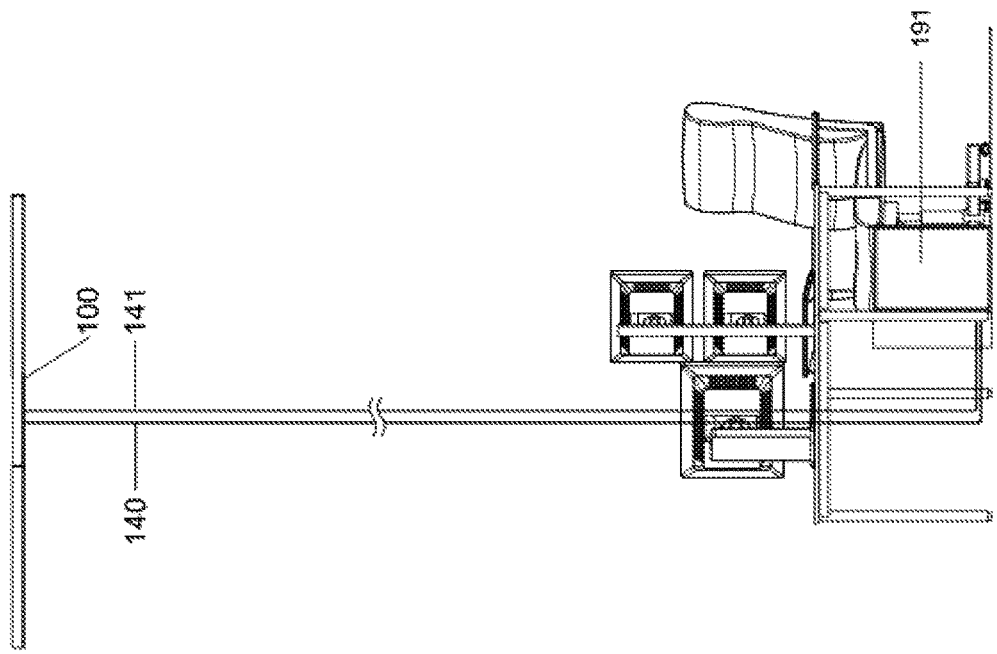
Figure 4A:
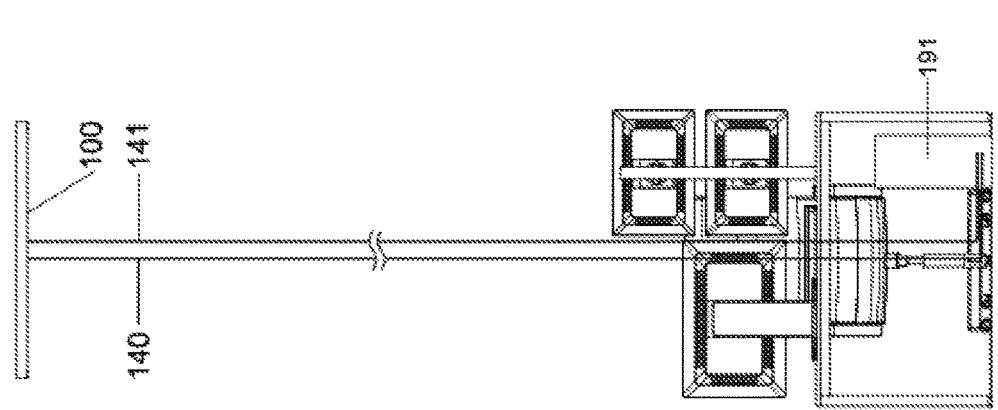

In the example embodiments of FIGS. 4A, 4B and 4C, a single PV panel assembly 100 (FIG. 1A) may be connected to the electrical terminals of a DC power supply (not shown) contained within a computing device 191. As an example, computing device 191 may comprise a low or high-power computing device 191 including, e.g., a personal computing device, a gaming computing device or any other computing device. Computing device 191 may be connected to PV panel assembly 100 via electrical wires 140 and 141, using electrical connectors 150 and 151 (FIG. 1A) or other connectors. This example embodiment effectively removes the attached computing device 191 from 'the grid' thereby satisfying the State's ban. If a single PV panel assembly 100 (FIG. 1A) is not capable of producing the appropriate amount of DC electricity to power the connected computing device 191 then the combined electrical production from multiple PV panel assemblies 100 (FIG. 3A, 3B, 3C or 3D) can be connected to the electrical terminals of the DC power supply contained in computing device 191.

As discussed in the Background section of this document, the construction and operation of Data centers, either directly or indirectly, create the emission of as much as 5% of the global GHGs. Two important components of any data center are computing devices and the power to run them. If a computing device (e.g., a server motherboard) is removed from its chassis and mounted directly on the back of a PV panel, some or all of the environmentally harmful GHG emitting infrastructure of the data center disposed between the computing device and the power source would be eliminated.

Figure 5B:
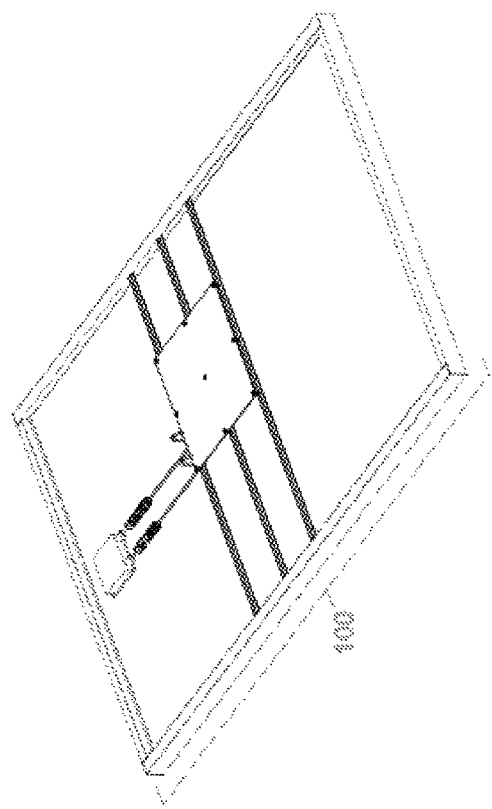
FIGS. 5A (orthogonal) and 5B (isometric) are views of the back of a PV panel with a computing device mounted on support structures attached to the PV panel's mounting frame according to an embodiment.
Figure 5A:
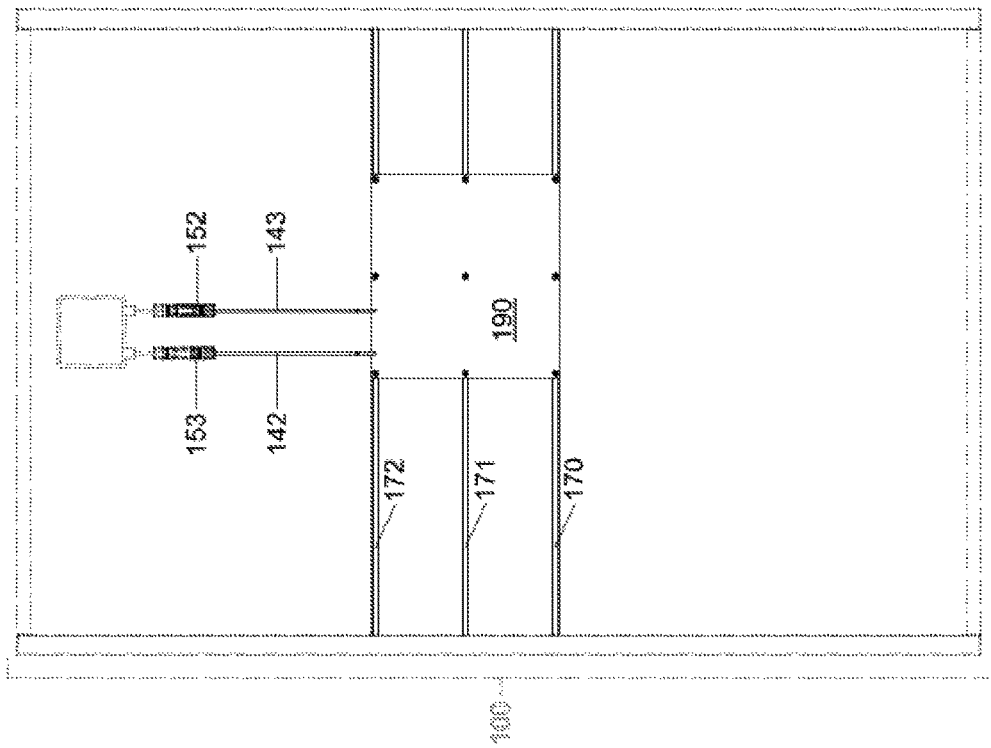

The example embodiment shown in FIGS. 5A and 5B are views of a PV panel assembly 100 (FIG. 1A) with support structures 170, 171, and 172 attached at the appropriate locations to the frontal facing flange surface on mounting frame pieces 121 and 122 (FIG. 1A). Example support structures 170, 171 and 172 may comprise e.g., crossbars, brackets or any other component that is configured to support computing device 190. The type, quantity of, and locations at which the support structures 170, 171, and 172 are attached to PV panel 100 (FIG. 1A) is determined by the component or components being mounted on them. Electrical connectors 153 and 152 are connected to their counterparts on PV panel assembly 100 (FIG. 1A) to which one end of electrical wires 142 and 143 are connected. The opposing end of electrical wires 142 and 143 are directly connected to the electrical terminals of computing device 190. If a single PV panel assembly 100 (FIG. 1A) is not capable of producing the appropriate amount of DC electricity to power computing device 190 then the combined electrical outputs from multiple PV panel assemblies 100 (FIG. 3A, 3B, 3C or 3D) can be connected to the electrical terminals of computing device 190.

With this example embodiment the single PV panel assembly 100 (FIG. 1A) or multiple PV panel assemblies 100 (FIG. 3A, 3B, 3C or 3D) will produce varying amounts of DC electricity at different times. For example, at a first time, PV panel assembly 100 (FIG. 1A) could be exposed to perpendicularly unobstructed sunlight resulting in PV panel assembly 100 (FIG. 1A) producing 100% of its rated DC electrical production. A minute later, at a second time, the same sunlight could be obstructed by a cloud significantly reducing the exposure to unobstructed sunlight and reducing the electrical production of PV panel assembly 100 (FIG. 1A). In some embodiments, voltage regulation components may be added between PV panel assembly 100 (FIG. 1A) and computing device 190 that provide voltage regulation of the power supplied by PV panel assembly 100 (FIG. 1A) or by multiple PV panel assemblies 100 (FIG. 3A, 3B, 3C or 3D).

The example embodiment shown in FIGS. 6A and 6B builds on the embodiment previously discussed in FIGS. 5A and 5B. Another support structure 173 is attached at the appropriate location to the frontal facing flange surface on mounting frame pieces 121 and 122 (FIG. 1A). The type, quantity of, and location at which the support structure 173 is attached to PV panel assembly 100 (FIG. 1A) is determined by the component or components being mounted on it. Three voltage regulators (e.g., DC-DC converters) 160, 161 and 162 are mounted on support structure 173. The quantity and type of voltage regulators to be mounted on support structure 173 is determined by the electrical requirements of computing device 190. For example, voltage regulator 160 may comprise a 3.3 VDC DC-DC converter, voltage regulator 161 may comprise a 12 VDC DC-DC converter and voltage regulator 162 may comprise a 5 VDC converter. Electrical connectors 153 and 152 are connected to their counterpart electrical connectors 150 and 151 (FIG. 1A), respectively, on PV panel assembly 100 (FIG. 1A). The −DC electrical wires 142 from voltage regulators 160, 161 and 162 are connected to electrical connector 153. The +DC electrical wires 143 from voltage regulators 160, 161 and 162 are connected to electrical connector 152. The opposing end of electrical wires 142 and 143 are directly connected to the electrical inputs of the voltage regulators 160, 161, and 162. The electrical output wires 180, 181, and 182 from voltage regulators 160, 161, and 162, respectively, are connected to the electric terminals on computing device 190.

The voltage regulators provide partial electrical regulation by limiting the amount of DC electricity supplied to computing device 190 to particular voltages. The operational stability of computing device 190 can be maintained when the electrical output from the attached PV panel assembly 100 (FIG. 1A) or PV panel assemblies 100 (FIG. 3A, 3B, 3C or 3D) is more than the minimum rated input of the voltage regulators 160, 161, and 162 to power the attached computing device 190.

In some cases, an instability of computing device 190 may result when the electrical production from the attached PV panel assembly 100 (FIG. 1A) falls below the minimum rated input of one or more of the voltage regulators 160, 161, and 162 to power computing device 190. In addition, the use of voltage regulators may also cause a loss of some of the DC electricity produced by the PV panel assembly 100 (FIG. 1A) that they are mounted on and connected to. In some embodiments, some or all of voltage regulators 160, 161 and 162 may also or alternatively be integrated into computing device 190.

In the illustrative embodiment shown in FIGS. 7A and 7B, closer views of the electrical components added to the embodiment shown in FIGS. 6A and 6B as well as FIGS. 9A, 9B, 9C and 9D are illustrated.

In some embodiments protecting the computing device 190 (FIGS. 5A, 6A, 8A and 9A) from the environment and other harsh weather conditions may be beneficial. Computing device 190 (FIGS. 5A, 6A, 8A and 9A) can be protected by covering computing device 190 (FIGS. 5A, 6A, 8A and 9A) with a protective coating, by placing the computing device 190 (FIGS. 5A, 6A, 8A and 9A) in a weatherproof enclosure or protected in another manner.

As an example, a coating may be applied to protect the embedded integrated circuits and other electrical components of computing device 190 (FIGS. 5A, 6A, 8A and 9A) and, in some embodiments, may be applied to both sides of computing device 190 (FIGS. 5A, 6A, 8A and 9A). In some embodiments, the coating may comprise a material that protects the integrated circuits, for example, from water damage, from damage due to physical contact with other objects including rough handling or installation or other damage. The coating may also serve to reduce mechanical stress on computing device 190 (FIGS. 5A, 6A, 8A and 9A), thermal stress on computing device 190 (FIGS. 5A, 6A, 8A and 9A) or any other stress. The coating may also protect the computing device 190 (FIGS. 5A, 6A, 8A and 9A) from damage due to contamination, moisture, fungus, dust, corrosion, or other factors caused by harsh or extreme environments.

In some embodiments, the coating may be configured to protect the integrity of the integrated circuit components of computing device 190 (FIGS. 5A, 6A, 8A and 9A), e.g., from tampering or improper accessing of stored data. As an example, the coating may inhibit or prevent reverse engineering or removal of any circuit components of computing device 190 (FIGS. 5A, 6A, 8A and 9A). In some embodiments, for example, the coating may comprise an epoxy coating that may make the integrated circuit components or electrical equipment brittle so that any attempt to remove or tamper with the components would break or shatter the coated components. In some embodiments, a laminate material may also or alternatively be utilized.

In some embodiments, the coating may comprise a protective non-conductive dielectric layer that is applied onto the PCB assembly. The coating may be substantially clear, or it may be substantially or partially opaque. The coating may be hard or may have a flexible or slightly flexible texture. In some embodiments, the coating may provide at least some thermal conductivity from the integrated circuits or electronic components. Where the coating is insulating, thermally conductive elements, such as, e.g., metals or semi-conductors, may be included in the coating to dissipate thermal energy. In addition, channels, openings, holes, etc. in the coatings may be provided to dissipate heat. Examples of suitable coatings may comprise silicone, epoxy, acrylic, urethane, borophene, graphene and Paraxylene. Other coatings may also or alternatively be utilized. Where an epoxy coating is used, the coating may disperse heat generated by a processor of computing device 190 (FIGS. 5A, 6A, 8A and 9A) to thermally conductive casing portions, where the heat may be dissipated via a chimney in the casing. Thus, in one embodiment, epoxy and a thermally conductive casing, for example, a metal-based, provide protection of and heat dissipation from the computing device 190 (FIGS. 5A, 6A, 8A and 9A).

In some embodiments, computing device 190 (FIGS. 5A, 6A, 8A and 9A) may also or alternatively be protected by an Infrastructureless™ enclosure as shown, for example, in FIGS. 8A-8F and 9A-9D.

With reference to FIGS. 8A-8F, an example embodiment of an Infrastructureless™ enclosure is illustrated. The Infrastructureless™ enclosure comprises an Infrastructureless™ enclosure base 200 and an Infrastructureless™ enclosure cover 201. Infrastructureless™ enclosure base 200 is adhered or attached to the back surface of PV panel 101 of PV panel assembly 100 (FIG. 1A), e.g., using an adhesive, mounting structures, screws, or other components. Computing device 190 is encased inside Infrastructureless™ enclosure base 200 and connected to electrical wires 142 and 143. For example, electrical wires 142 and 143 may extend through a wall of Infrastructureless™ enclosure base 200 or may extend over the wall and into Infrastructureless™ enclosure base 200 to connect to computing device 190. In another example, a portion of electrical connectors 153 and 152 are incorporated into the wall of Infrastructureless™ enclosure base 200 making it possible for electrical wires 142 and 143 to be fully contained within Infrastructureless™ enclosure base 200. An Infrastructureless™ enclosure cover 201 is installed onto Infrastructureless™ enclosure base 200 to seal computing device 190 within the Infrastructureless™ enclosure. In some embodiments, Infrastructureless™ enclosure cover 201 is configured to accommodate electrical wires 142 and 143. In some embodiments, a gasket or other material may be utilized about electrical wires 142 and 143 to the seal Infrastructureless™ enclosure where electrical wires 142 and 143 enter the Infrastructureless™ enclosure. In this embodiment, voltage regulators 160, 161 and 162 (FIGS. 6A-7B) are not included.

Figure 8B:
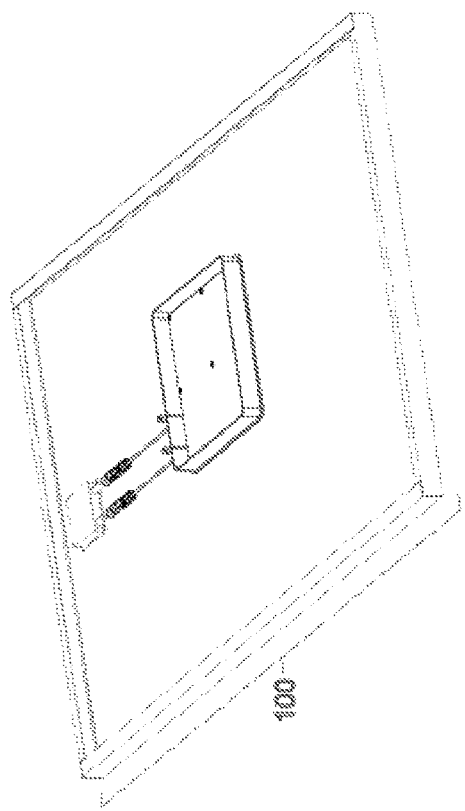
FIGS. 8A (orthogonal) and 8B (isometric) are views of the back of a PV panel with a computing device mounted inside an Infrastructureless™ enclosure base according to an embodiment.
FIGS. 8C (orthogonal) and 8D (isometric) are views of the Infrastructureless™ enclosure base of FIGS. 8A and 8B with an Infrastructureless™ enclosure cover according to an embodiment.
FIGS. 8E (orthogonal) and 8F (isometric) are views of the Infrastructureless™ enclosure base of FIGS. 8A and 8B with a portion of electrical connectors incorporated into the wall of the Infrastructureless™ enclosure base according to an embodiment.
Figure 8A:
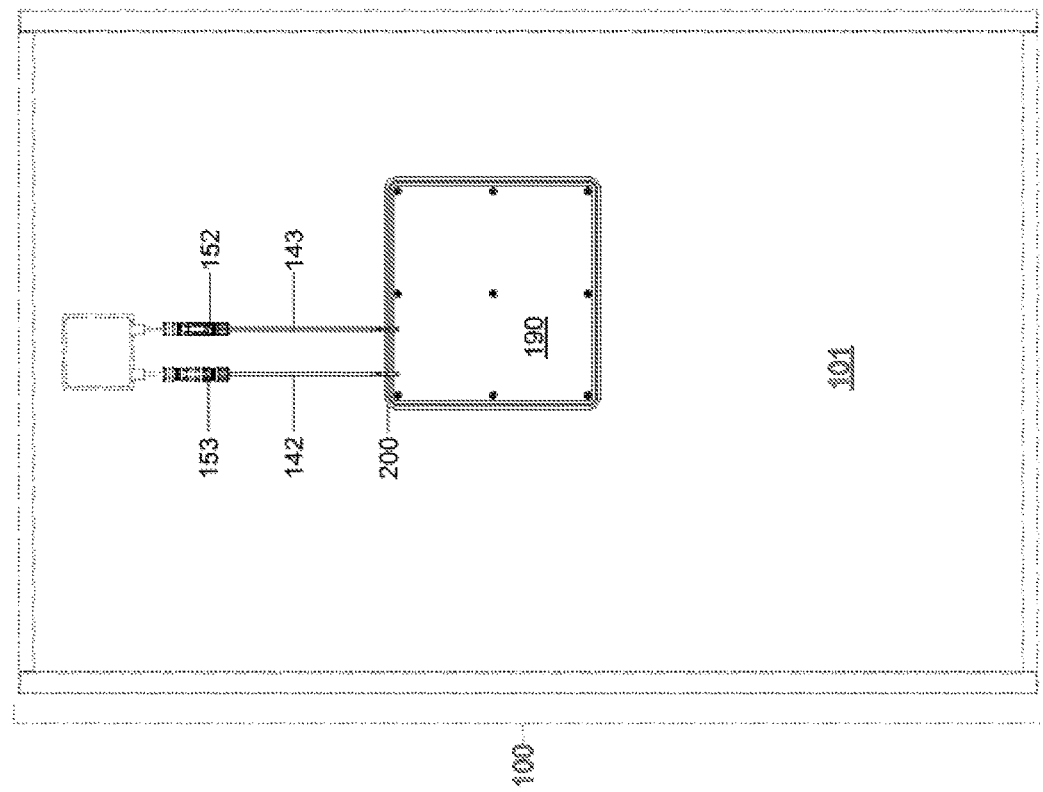
Figure 8D:
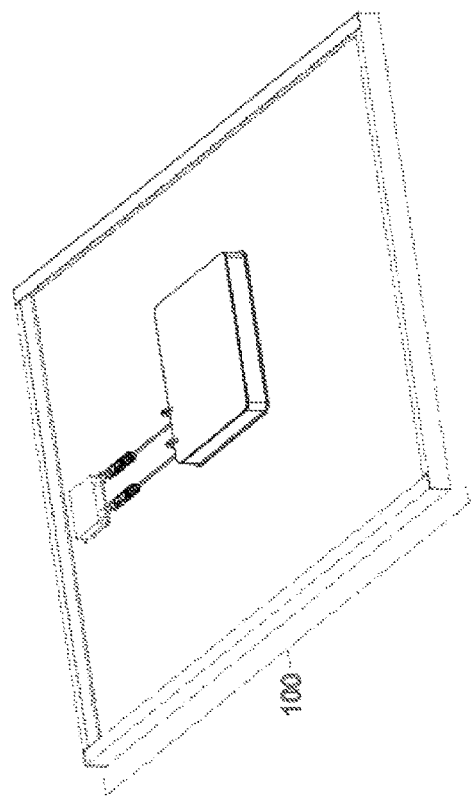
Figure 8C:
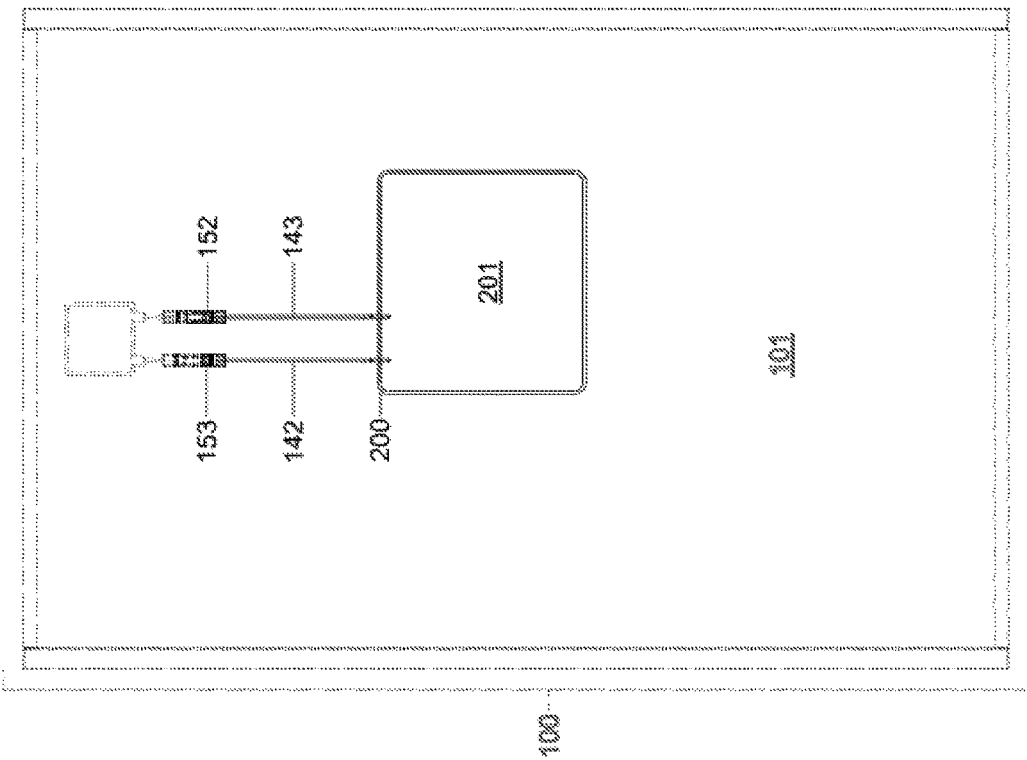
Figure 8F:
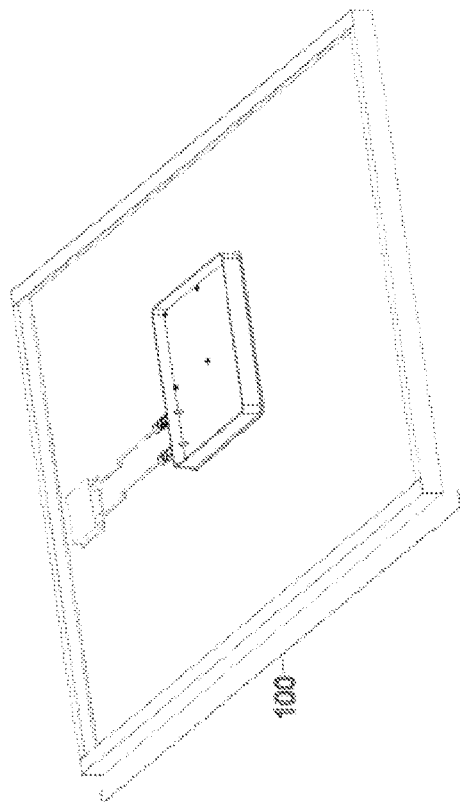
Figure 8E:
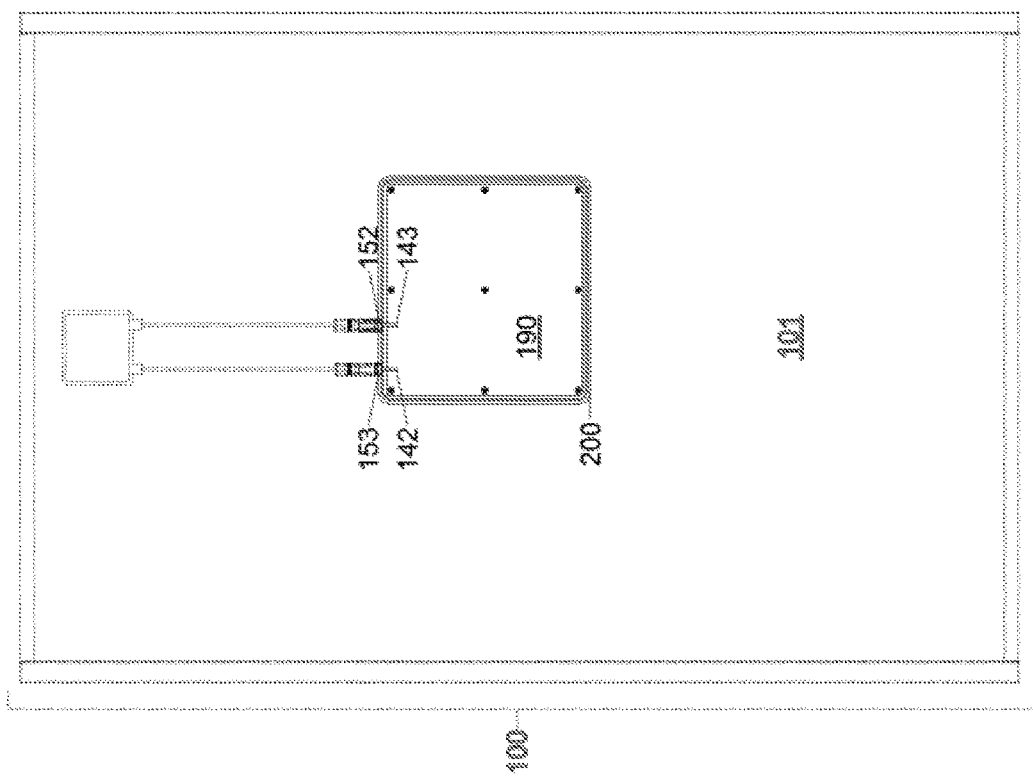

With reference to FIGS. 9A-9D, another example embodiment utilizing the Infrastructureless™ enclosure is illustrated. As above, the Infrastructureless™ enclosure comprises Infrastructureless™ enclosure base 200 and Infrastructureless™ enclosure cover 201. In this embodiment, voltage regulators 160, 161 and 162 are included with electrical wires 180, 181 and 182 extending into the Infrastructureless™ enclosure to connect to computing device 190 instead of electrical wires 142 and 143 (FIGS. 8A, 8C and 8E).

Depending on particular usage requirements, each Infrastructureless™ enclosure may be made from one or more of many different materials using one or more of many manufacturing methods. Example manufacturing methods include but are not limited to Additive Manufacturing (3D Printing), Carbon® Digital Light Synthesis™ (DLS), Cast Urethane, CNC, Fused Deposition Modeling (FDM), Injection molded, Multi Jet Fusion, Stereolithography (SLA), or any other manufacturing method. The materials may include, e.g., metal-based materials, synthetic materials, or any other materials. The metal-based materials may include, for example, Alloy Steel (4140, 4340, etc.), Aluminum (5083, 6061, 6082, 7075, etc.), Brass (036000, etc.), Bronze, Copper, Mild Steel (A36, 1018, 1045, etc.), Stainless Steel (17-4, 303, 304, 316, 2205, etc.), Titanium Alloys, Tool Steel (A2, D2, O1, etc.), Zinc Alloys, or any other metal-based materials. The synthetic materials may comprise, for example, Acrylonitrile Butadiene Styrene (ABS), High Density Polyethylene (HDPE), Low Density Polyethylene (LDPE), Nylon (PA 6, PA 66, PA 12), Polycarbonate (PC), Polycarbonate/Acrylonitrile Butadiene Styrene (PC/ABS), Polyether ether ketone (PEEK), Polyethylene (PE), Polyethylene Terephthalate (PET), Polymethyl Methacrylate (PMMA/Acrylic), Polypropylene (PP), Polystyrene (PS), Polyurethane (PU), POM (Acetal/Delrin), Thermoplastic Elastomer (TPE), or any other synthetic material. Other materials may include, for example, wax, wood or any other material.

The embodiments described with reference to FIGS. 5A-9D illustrate examples of how PV panel assemblies 100 (FIG. 1A) may be utilized to supply power to a variety of different components. FIGS. 5A-9D effectively removes the need for all the infrastructure (e.g., the same infrastructure used to build and operate HIDCs) between the power generation device, e.g., PV panel assembly 100 (FIG. 1A) or PV panel assemblies 100 (FIG. 3A, 3B, 3C or 3D), and computing device 190 (FIGS. 5A, 6A, 8A and 9A) making the example embodiments in FIGS. 5A-9D Infrastructureless™.

The five elemental data components needed by data centers are compute, network, memory, power (e.g., power protection such as Uninterruptable Power Supplies or UPS), and storage. Computing devices such as mainboards or motherboards may contain three or four of the five elemental computing components. A modular computing system may combine compute, memory, network, and storage into a single solution. However, power protection (e.g., UPS) often is not included as a component in a modular computing system.

Modular computing systems provide a way for the various modules in the system to communicate with each other as well as other systems. Modular computing systems typically moved the expansion slots and power connections of a traditional server motherboard onto a separate PCB called a backplane. The processing, memory and I/O components were placed on a dedicated PCB called a Single Board Computer (SBC). Backplanes usually provide a dedicated connector, e.g., slot, for the SBC. Early modular computing systems used passive backplanes (a PCB with connectors for expansion on one side) then evolved to using active backplanes (chips were added to buffer the various signals to the slots) then to midplanes (connectors for expansion on both sides of a PCB) and eventually to carrier boards. (See *Backplane* at Wikipedia.org)

The main difference between backplanes and carrier boards is the I/O connectors on the SBC are moved to the carrier board. More information is provided in the section titled Infrastructureless™ Computer Module (CM), below.

FIGS. 10A and 10B are an illustrative embodiment of the back of a PV panel assembly 100. PV panel assembly 100 comprises PV panel 101 having mounting frame structures 120, 121, 122, and/or 123 attached to each edge of the four edges of PV panel 101. This embodiment of PV panel assembly does not have an electrical junction box 130 (FIG. 1A), electrical wires 140 and 141 (FIG. 1A) and electrical connectors 150 and 151 (FIG. 1A). The ends of the Circuit Ribbons 110 are accessible for use by the computing devices to be discussed below.

Figure 11B:
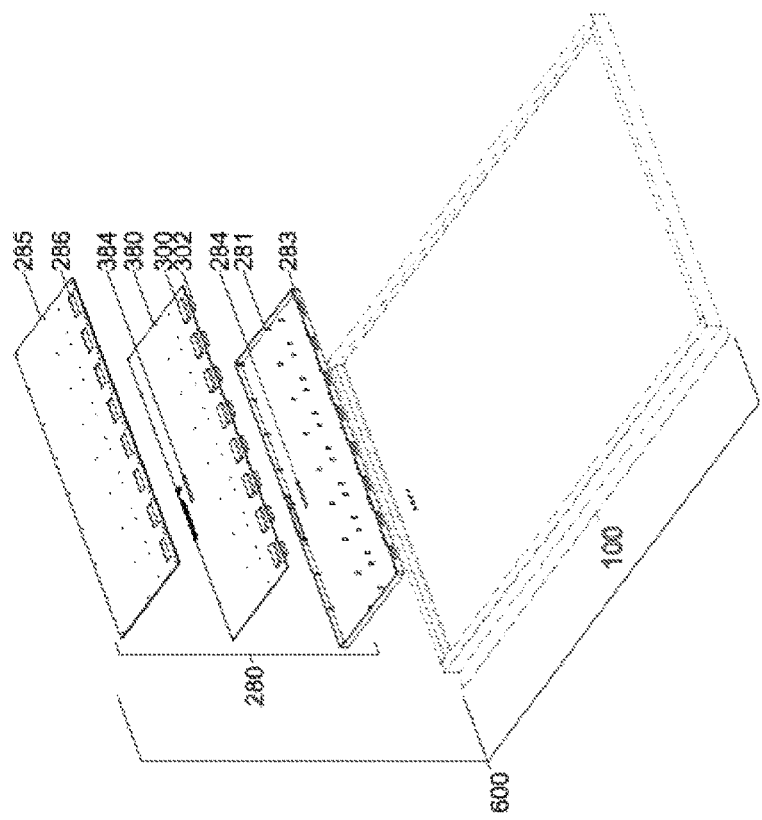
FIGS. 11A (isometric), 11B (exploded isometric) and 11C (exploded isometric) are views of the back of an Infrastructureless™ Base Node comprising a PV panel with an Infrastructureless™ Active Carrier Plane (ACP) mounted inside of an Infrastructureless™ enclosure according to an embodiment.
Figure 11A:
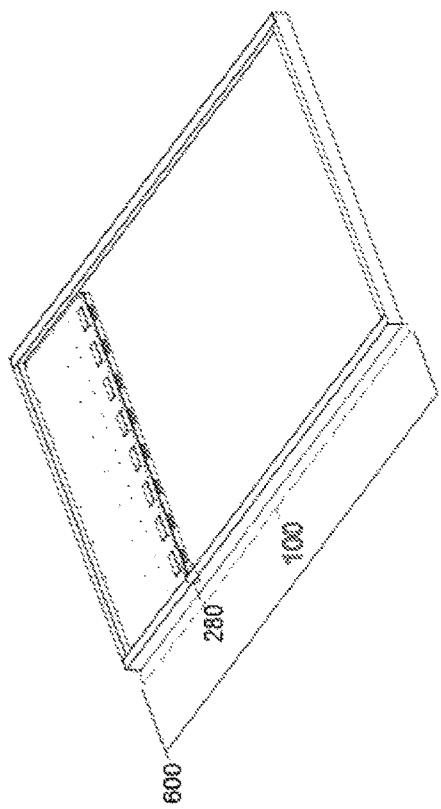

The illustrative embodiments in FIGS. 11A through 11C will build upon the illustrative embodiment of PV panel assembly 100 shown in FIG. 10A by attaching, connecting or integrating one or more additional components that provide a portion of an Infrastructureless™ Data Center onto the back of a PV panel assembly 100 (FIG. 10A).

To bring perspective to the specific Infrastructureless™ components being discussed, embodiments of the Infrastructureless™ components will be displayed in the figures on a dotted outline of the PV panel assembly 100 (FIG. 10A). To help keep the focus on the specific Infrastructureless™ component being discussed, embodiments of the Infrastructureless™ components will be drawn using solid lines.

Infrastructureless™ Active Carrier Plane (ACP)

The Infrastructureless™ ACP comprises a PCB that combines features of an active backplane with features of a carrier board and adds additional features not found on either. Infrastructureless™ ACP provides centralized I/O and other resources for use by the Infrastructureless™ modules connected to the Infrastructureless™ ACP.

The Infrastructureless™ ACP comprises either a single connection or multiple connections to connect to one or more Infrastructureless™ modules. The Infrastructureless™ ACP comprises chips which buffer various signals to the Infrastructureless™ modules connected to the connections of the Infrastructureless™ ACP. The Infrastructureless™ ACP comprises I/O interfaces for accessing the Infrastructureless™ ACP or the Infrastructureless™ modules connected to the connections of the Infrastructureless™ ACP. The Infrastructureless™ ACP may be configured to simultaneously and symmetrically support as many Infrastructureless™ Compute (processor) Modules as the Infrastructureless™ ACP has connections. The Infrastructureless™ ACP comprises DC voltage regulation circuitry, either integrated directly on the Infrastructureless™ ACP or as a separate Infrastructureless™ Module connected to the Infrastructureless™ ACP, that is configured to manage the DC electricity being produced by the PV panel assembly 100 (FIG. 10A) to which it is connected and to convert the DC electricity to what is needed by the Infrastructureless™ ACP and connected Infrastructureless™ modules. The Infrastructureless™ ACP may comprise onboard sensing devices and I/O interfaces for connecting external sensing devices and/or other accessories.

In some embodiments, an Infrastructureless™ ACP may comprise multiple components including but not limited to some or all of a charge controller, firmware, systems management, memory, one or more on-board network components for inter-module communication, one or more network media ports for external communication, one or more out-of-band (OOB) management ports, one or more miscellaneous I/O ports, a power converter/regulator, at least one processing device, security components, sensing components, one or more storage devices, one or more wireless communication devices or any other computing components.

The firmware may comprise, for example, a basic I/O system (BIOS), a unified extensible firmware interface (UEFI) or any other firmware technology.

The systems management may comprise, for example, Intelligent Platform Management Interface (IPMI), Distributed Management Task Force (DMTF) Redfish® or any other systems management technology.

The memory may comprise one or more memory components including, for example, Double Data Rate (DDR) memory, Dual Inline Memory Modules (DIMMs), Load Reduced Dual Inline Memory Modules (LRDIMMs), Registered Dual Inline Memory Modules (RDIMMs), Small Outline Dual Inline Memory Modules (SO-DIMMs), Electrically Erasable Programmable Read-Only Memory (EEPROM), Intel® Optane™ memory, Programmable Read-Only Memory (PROM) or any other type of memory technology.

The on-board network components may comprise, for example, components from Broadcom®, Intel®, NVIDIA® (formerly Mellanox) or any other type of on-board network components.

The network media ports may comprise, for example, RJ45, Small Form-factor Pluggable (SPF, SPF+, SFP28, SFP56, etc.), Quad-SFP (QSFP, QSFP+, QSFP14, QSFP28, QSFP56, etc.), Octal-SFP (OSFP) or other SFP variants, or any other type of network media ports.

The other input/output (I/O) ports may comprise, for example, general purpose I/O (GPIO), Joint Test Action Group (JTAG), multi-pin header, parallel, serial, USB or any other ports.

The processing device may comprise, for example, one or more processors including, for example, an Advanced RISC Machine (ARM), Application Specific Integrated Circuit (ASIC), an Application Specific Standard Product (ASSP), a Central Processing Unit (CPU), a Data Processing Unit (DPU), a Field Programmable Gate Array (FPGA), a General-Purpose Graphics Processing Unit (GPGPU), a Graphics Processing Unit (GPU), a Tensor Processing Unit (TPU), a combination of the above, or any other processor technology.

The security components may comprise, for example, Chip-to-Cloud, Trusted Platform Module (TPM) or any other security technology.

The storage device may comprise, for example, Hard Disk Drives (HDDs), memory cards, compact flash components, phase-change Memory, Secure Digital (SD) memory, Secure Digital Standard Capacity (SDSC) memory, Secure Digital High Capacity (SDHC) memory, Secure Digital eXtended Capacity (SDXC) memory, Secure Digital Ultra Capacity (SDUC) memory, memory sticks, multi-media cards, random-access memory (RAM) such as, e.g., non-volatile random-access memory (NVRAM), phase-change RAM (PC-RAM) and magnetic RAM (MRAM), Non-Volatile Memory Express (NVMe) memory, Solid State Drives (SSD) or any other memory technology.

The wireless communication devices may comprise, for example, one or more of cellular wireless devices, e.g., 3G, 4G LTE, 4G WiMAX, 5G, 6G, or any other cellular wireless technology, satellite wireless devices, e.g., HughesNet®, StarLink®, ViaSat™, or any other satellite-based communication technology, Wi-Fi, Bluetooth or any other wireless communication technology.

FIGS. 11A and 11B are an illustrative embodiment of an Infrastructureless™ Base Node 600 which comprises an Infrastructureless™ ACP assembly 280 adhered or attached to the back of a PV panel assembly 100 (FIG. 10A), e.g., as previously described. An Infrastructureless™ ACP assembly 280 comprises an Infrastructureless™ ACP PCB with Integrated Power Supply 380 encased inside an Infrastructureless™ enclosure base 281 with an Infrastructureless™ enclosure cover 285. In some embodiments, the Infrastructureless™ enclosure base 281 and the Infrastructureless™ enclosure cover 285 together form a weatherproof enclosure or otherwise configure the enclosure to inhibit the intrusion of outside environmental elements from affecting or damaging the components within the enclosure. In some embodiments, Infrastructureless™ enclosure base 281 can have a portion of connectors 152 and 153 (FIG. 8E) incorporated into the enclosure wall such as those shown in FIG. 8E.

The Infrastructureless™ enclosure base 281 is adhered or attached to the back of PV panel 101 (FIG. 10A), e.g., as previously described. The ends of the Circuit Ribbons 110 (FIG. 10A) pass through opening 284 in the bottom of the Infrastructureless™ enclosure base 281 as well as slot 384 in the Infrastructureless™ ACP PCB with Integrated Power Supply 380 then connect to the Infrastructureless™ ACP PCB with Integrated Power Supply 380. In some embodiments a portion of one or both of electrical connectors 152 and 153 (FIG. 8E) may be incorporated into the wall of the Infrastructureless™ enclosure base 281 and electric wires 142 and 143 (FIG. 8E) may be connected to Infrastructureless™ ACP PCB with Integrated Power Supply 380.

When Infrastructureless™ ACP PCB with Integrated Power Supply 380 is mounted inside Infrastructureless™ enclosure base 281, connectors 302 on the Infrastructureless™ ACP PCB with Integrated Power Supply 380 extend through corresponding openings 283 in the Infrastructureless™ enclosure base 281. Connectors 302 are available to connect Infrastructureless™ ACP PCB with Integrated Power Supply 380 to external Infrastructureless™ Power Module (PM) assemblies. In an additional or alternative embodiment, Infrastructureless™ ACP PCB with Integrated Power Supply 380 may be connected to external Infrastructureless™ Power Module (PM) assemblies wirelessly, where in such an embodiment connectors 302 and openings 283 may or may not be included or utilized.

When the Infrastructureless™ enclosure cover 285 is attached to the Infrastructureless™ enclosure base 281, connectors 300 on the Infrastructureless™ ACP PCB with Integrated Power Supply 380 extends through corresponding openings 286 in the Infrastructureless™ enclosure cover 285. Connectors 300 are available to connect Infrastructureless™ ACP PCB with Integrated Power Supply 380 to external Infrastructureless™ module assemblies. While described as having eight connectors 300 and eight connectors 302, in other embodiments any other number of connectors 300 and connectors 302 may alternatively be included on Infrastructureless™ ACP assembly 280.

FIG. 11C is another illustrative embodiment of an Infrastructureless™ Base Node 600. The difference between FIG. 11B and FIG. 11C is FIG. 11C illustrates the use of a modular Infrastructureless™ ACP PCB 381 and modular Infrastructureless™ Power Supply Module (PSM) PCB 390 instead of an Infrastructureless™ ACP PCB with Integrated Power Supply 380 (FIG. 11B). Modular Infrastructureless™ ACP PCB 381 and modular Infrastructureless™ PSM PCB 390 are both encased inside the Infrastructureless™ enclosure base 281 with Infrastructureless™ enclosure cover 285. In some embodiments, the Infrastructureless™ enclosure base 281 and the Infrastructureless™ enclosure cover 285 together form a weatherproof enclosure or otherwise configure the enclosure to inhibit the intrusion of outside environmental elements from affecting or damaging components within the enclosure.

The Infrastructureless™ enclosure base 281 is adhered or attached to the back of PV panel 101 (FIG. 10A), e.g., as previously described. The ends of the Circuit Ribbons 110 (FIG. 10A) pass through opening 284 in the bottom of the Infrastructureless™ enclosure base 281 as well as slot 394 in the modular Infrastructureless™ PSM PCB 390 then connect to the modular Infrastructureless™ PSM PCB 390. In some embodiments a portion of one or both of electrical connectors 152 and 153 (FIG. 8E) may be incorporated into the wall of the Infrastructureless™ enclosure base 281 and electric wires 142 and 143 (FIG. 8E) may be connected to modular Infrastructureless™ PSM PCB 390.

As described above, when the Infrastructureless™ enclosure cover 285 is attached to the Infrastructureless™ enclosure base 281, connectors 301 on the modular Infrastructureless™ ACP PCB 381 extend through corresponding openings 286 in the Infrastructureless™ enclosure cover 285. Connectors 301 are available to connect modular Infrastructureless™ ACP PCB 381 to external Infrastructureless™ module assemblies. While described as having eight connectors 301, in other embodiments any other number of connectors 301 may alternatively be included on Infrastructureless™ ACP assembly 280.

In an additional or alternative embodiment, modular Infrastructureless™ ACP PCB 381 may also comprise connectors 302 (FIG. 11B) that extend through corresponding openings 283 (FIG. 11B) in the Infrastructureless™ enclosure base 281 and function in a similar manner to that described above for Infrastructureless™ ACP PCB with Integrated Power Supply 380.

Infrastructureless™ modules that may connect to the Infrastructureless™ Base Node 600 will now be described with reference also to the above-described modularity provided by the Infrastructureless™ Data Center.

An Infrastructureless™ module may comprise any elemental data device traditionally found in a data center including, but not limited to Compute, Memory, Network, Power, Storage or any other elemental data center device.

The example illustrative embodiments of the Infrastructureless™ modules of the Infrastructureless™ Data Center described below with reference to FIGS. 12A through 25 will use FIG. 11A as the reference drawing for the Infrastructureless™ Base Node 600. FIG. 11A relies on FIG. 10A as the reference drawing for PV panel assembly 100.

To aid in keeping the focus on the components of the specific Infrastructureless™ module being discussed, references to the components of the specific Infrastructureless™ module embodiment are provided. The drawings that include references to the Infrastructureless™ Base Node 600 or Infrastructureless™ ACP assembly 280 or its components is FIG. 11A. The drawings that include references to the basic components of a PV panel assembly 100 or PV panel 101 is FIG. 10A.

To provide perspective to the components of the specific Infrastructureless™ module being discussed, the components of the specific Infrastructureless™ module being discussed will be drawn using solid lines. The Infrastructureless™ Base Node 600 (FIG. 11A) will be drawn using dotted lines.

Infrastructureless™ Compute Module (CM)

The HIDC Way

"A rack unit (abbreviated U or RU) is a unit of measure defined as 1¾ inches (44.45 mm). It is most frequently used as a measurement of the overall height of 19-inch and 23-inch rack frames, as well as the height of equipment that mounts in these frames, whereby the height of the frame or equipment is expressed as multiples of rack units." (See *Rack unit* at En.Wikipedia.org)

In HIDCs server components are often housed in server chassis that are typically 1 U, 2 U, 3 U or 4 U tall. Server chassis may be mounted on top of each other in server cabinets. A typical full-size server cabinet is 42 U high, while custom server racks can be as tall as 70 U. Each 1 U server chassis may have an average weight of approximately 22 pounds (approximately 10 Kg) with each 42 U server cabinet having an average weight of approximately 275.8 pounds (approximately 125.1 Kg). (See *APC NetShelter SX, Server Rack Enclosure, 42U, Black,* 1991H×600 W×1070D mm at APC.com) Typically, there are as many as forty (40) 1 U server chassis mounted in each server cabinet. Typically, the remaining 2 U are used for either network switches or network patch panels, depending on the network design, along with one or two Power Distribution Units (PDUs) in the back of the cabinet. That's an estimated combined total of ~1,200 pounds of steel for just one server cabinet and the chassis contained within. According to available data, " . . . a hypothetical 300,000-square-foot data center could fit more than 12,000 racks and cabinets." (See *Data Center Design Overview: Cabinet Layout, Rack Design, & More* at Blog.Enconnex.com) That's a minimum of ~14,400,000 pounds (~7,200 tons) of steel in just the server cabinets and the chassis they house. According to OurWorldInData.org, the "energy-related emission from the manufacturing of iron and steel" (See *Sector by Sector: where do global greenhouse gas emissions come from?* at OurWorldInData.org) account for 7.2% of the world's greenhouse gas (GHG) emissions. This does not include the GHG emissions from the transportation of that iron and steel.

An Infrastructureless™ Data Center does not utilize server chassis and server cabinets for housing Infrastructureless™ CMs, resulting in zero energy related GHG emissions from the manufacturing (not including the transportation) of iron and steel for these items. In fact, the Infrastructureless™ Data Center does not use any of the steel used in the construction of HIDCs resulting in significantly more GHG savings.

The Infrastructureless™ Way

In illustrative embodiments, a Computer-On-Module (COM) may be utilized as a component of an Infrastructureless™ Data Center.

"A Computer-On-Module (COM) is a type of single-board computer (SBC), a subtype of an embedded computer system. An extension of the concept of System-On Chip (SOC) and System-In-Package (SIP), COM lies between a full-size computer and a microcontroller in nature. It is very similar to a System-On-Module (SOM).

COMs are complete embedded computers built on a single circuit board. The design is centered on a microprocessor with RAM, input/output controllers and all other features needed to be a functional computer on the one board. However, unlike an SBC, the COM usually lack the standard connectors for any input/output peripherals to be attached directly to the board. The module usually needs to be mounted on a carrier board (or "baseboard") which breaks the bus out to standard peripheral connectors. Some COMs also include peripheral connectors. Some can be used without a carrier.

A COM solution offers a dense package computer system for use in small or specialized applications requiring low power consumption or small physical size as is needed in embedded systems. As a COM is very compact and highly integrated, even complex CPUs, including multi-core technology, can be realized on a COM.

Some devices also incorporate field-programmable gate array (FPGA) components. FPGA-based functions can be added as Intellectual Property (IP) cores to the COM itself or to the carrier board. Using FPGA IP cores adds to the modularity of a COM concept, because I/O functions can be adapted to special needs without extensive rewiring on the printed circuit board." (See *Computer-on-Module* at En.Wikipedia.org)

Componentry

In some embodiments, an Infrastructureless™ CM may comprise multiple components including some or all of firmware, systems management, memory, one or more on-board network components, one or more network media ports, one or more out-of-band (OOB) management ports, one or more miscellaneous I/O ports, at least one processing device, security components, one or more storage device, one or more wireless communication devices or any other computing components.

The firmware may comprise, for example, a basic I/O system (BIOS), a unified extensible firmware interface (UEFI) or any other firmware technology.

The systems management may comprise, for example, Intelligent Platform Management Interface (IPMI), Distributed Management Task Force (DMTF) Redfish® or any other systems management technology.

The memory may comprise one or more memory components including, for example, Double Data Rate (DDR) memory, Dual Inline Memory Modules (DIMMs), Load Reduced Dual Inline Memory Modules (LRDIMMs), Registered Dual Inline Memory Modules (RDIMMs), Small Outline Dual Inline Memory Modules (SO-DIMMs), Electrically Erasable Programmable Read-Only Memory (EE-PROM), Intel® Optane™ memory, Programmable Read-Only Memory (PROM) or any other type of memory technology.

The on-board network components may comprise, for example, components from Broadcom®, Intel®, NVIDIA® (formerly Mellanox) or any other type of on-board network components.

The processing device may comprise, for example, one or more processors including, for example, an Advanced RISC Machine (ARM), Application Specific Integrated Circuit (ASIC), an Application Specific Standard Product (ASSP), a Central Processing Unit (CPU), a Data Processing Unit (DPU), a Field Programmable Gate Array (FPGA), a General-Purpose Graphics Processing Unit (GPGPU), a Graphics Processing Unit (GPU), a Tensor Processing Unit (TPU), a combination of the above, or any other processor technology.

The security components may comprise, for example, Chip-to-Cloud, Trusted Platform Module (TPM) or any other security technology.

The storage device may comprise, for example, Hard Disk Drives (HDDs), memory cards, compact flash components, phase-change Memory, Secure Digital (SD) memory, Secure Digital Standard Capacity (SDSC) memory, Secure Digital High Capacity (SDHC) memory, Secure Digital eXtended Capacity (SDXC) memory, Secure Digital Ultra Capacity (SDUC) memory, memory sticks, multi-media cards, random-access memory (RAM) such as, e.g., non-volatile random-access memory (NVRAM), phase-change RAM (PC-RAM) and magnetic RAM (MRAM), Non-Volatile Memory Express (NVMe) memory, Solid State Drives (SSD) or any other memory technology.

The wireless communication devices may comprise, for example, one or more of cellular wireless devices, e.g., 3G, 4G LTE, 4G WiMAX, 5G, 6G, or any other cellular wireless technology, satellite wireless devices, e.g., HughesNet, StarLink, ViaSat, or any other satellite-based communication technology, Wi-Fi, Bluetooth or any other wireless communication technology.

Figure 12C:
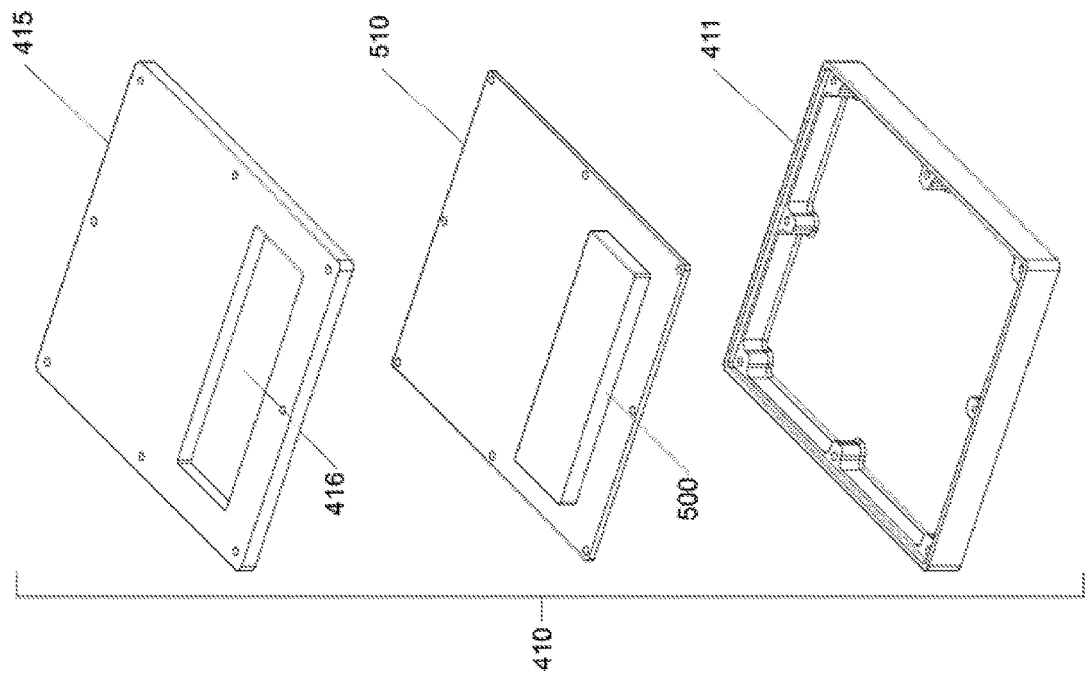
FIGS. 12A (orthogonal), 12B (isometric), and 12C (exploded isometric) are views of an Infrastructureless™ Compute Module (CM) assembly according to an embodiment.
Figure 12B:
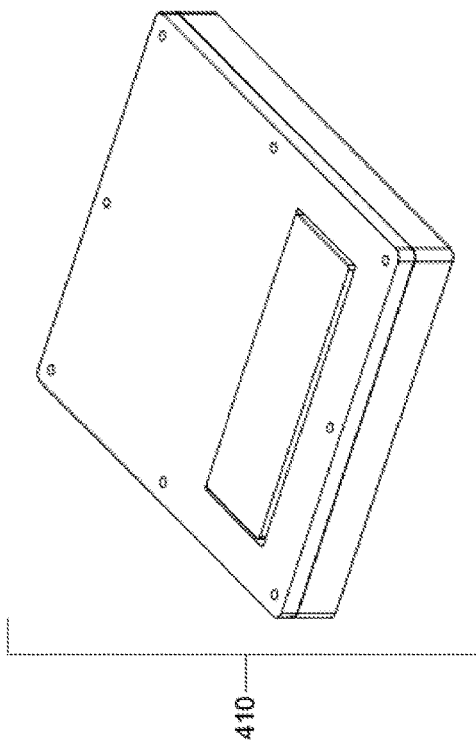
Figure 14A:
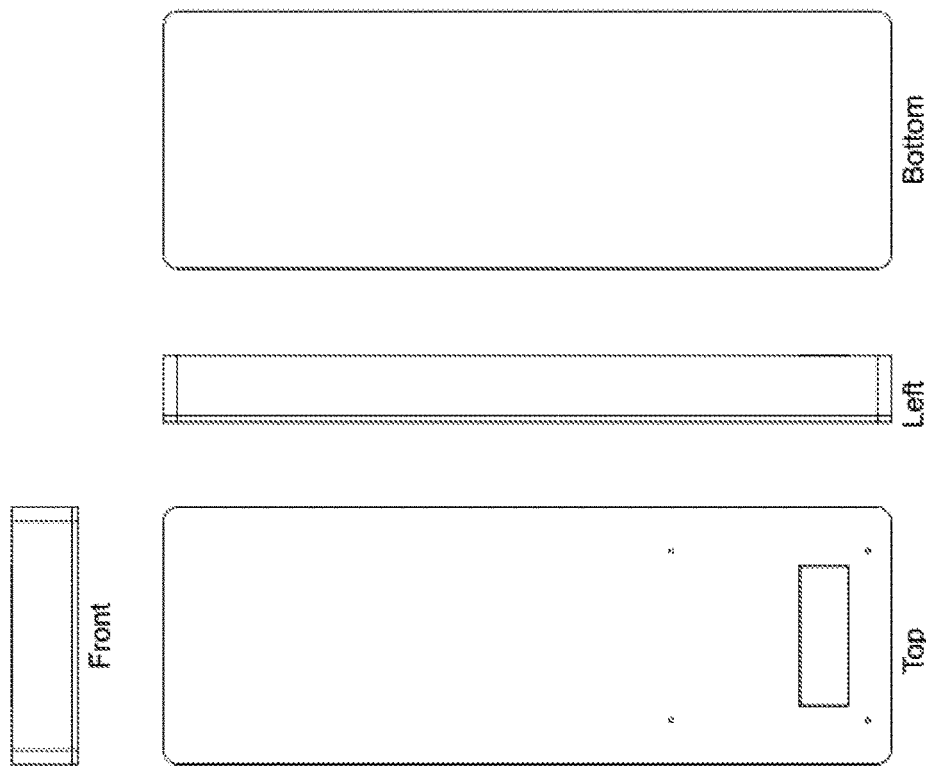
FIGS. 14A (orthogonal), 14B (isometric), 14C (exploded isometric) and 14D (inverted exploded isometric) are views of an Infrastructureless™ Memory Module (MM) assembly according to an embodiment.

FIGS. 12A, 12B and 12C are illustrative embodiments of an Infrastructureless™ CM assembly 410 which comprises a computing device 510, e.g., a SBC or another computing device such as those described above, that is encased inside an Infrastructureless™ enclosure base 411 by an Infrastructureless™ enclosure cover 415. In some embodiments, the Infrastructureless™ enclosure base 411 and the Infrastructureless™ enclosure cover 415 together form a weatherproof enclosure or otherwise configure the enclosure to inhibit the intrusion of outside environmental elements from affecting or damaging components within the enclosure. When the Infrastructureless™ enclosure cover 415 is attached to Infrastructureless™ enclosure base 411, connector 500 extends through opening 416 in the Infrastructureless™ enclosure cover 415 to mate with connector 300 on an Infrastructureless™ ACP assembly 280 of Infrastructureless™ Base Node 600 (FIG. 11A).

Figure 13C:
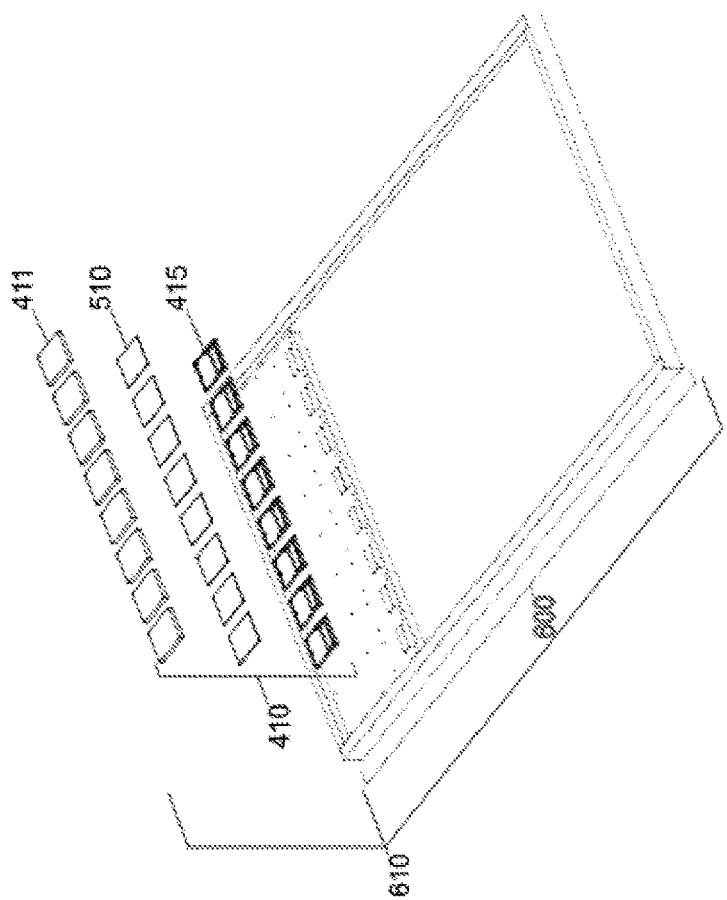
FIGS. 13A (orthogonal), 13B (isometric), and 13C (exploded isometric) are views of Infrastructureless™ Computing node comprising multiple Infrastructureless™ CM assemblies of FIGS. 12A, 12B and 12C mounted on the Infrastructureless™ ACP of an Infrastructureless™ Base Node of FIGS. 11A, 11B and 11C according to an embodiment.
Figure 14C:
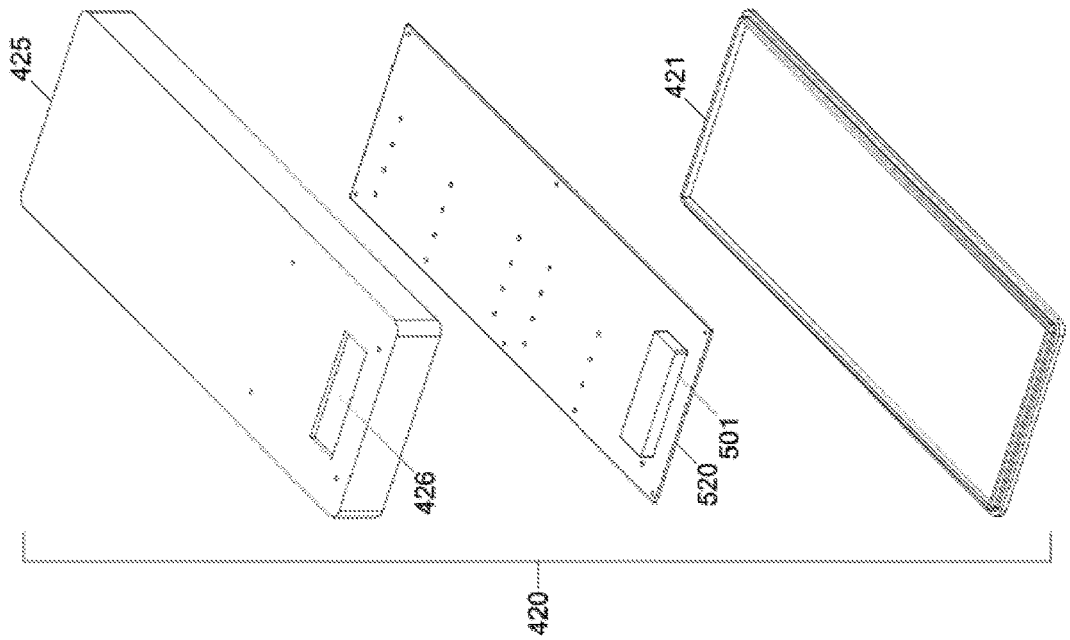
Figure 14B:
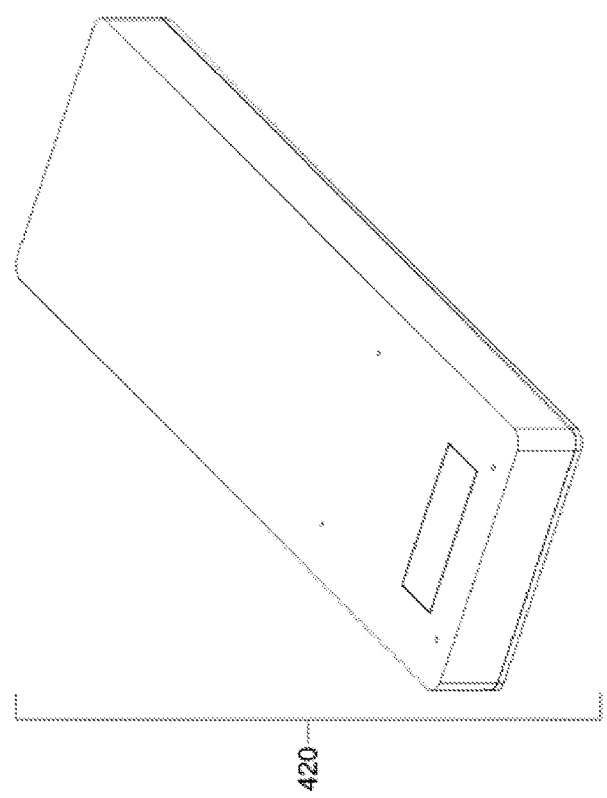

FIGS. 13A, 13B and 13C are an illustrative embodiment of an Infrastructureless™ Compute Node 610 comprising eight Infrastructureless™ CM assemblies 410 mounted on the Infrastructureless™ ACP assembly 280 of Infrastructureless™ Base Node 600 (FIG. 11A) via the connection of the respective connectors 500 of each Infrastructureless™ CM assembly 410 to one of corresponding connectors 300 of Infrastructureless™ ACP assembly 280 of Infrastructureless™ Base Node 600 (FIG. 11A). In some embodiments, CM assembly 410 may alternatively be mounted or attached to the PV panel and connected to the ACP, e.g., via a wired or wireless connection. As an example, wiring (not shown) may connect the connector of the CM assembly 410 to a corresponding connector of the ACP.

The illustrative embodiment with eight Infrastructureless™ CM assemblies 410 mounted on an Infrastructureless™ ACP (FIGS. 13A, 13B and 13C) allows for the Infrastructureless™ CMS to be configured as:
 each Infrastructureless™ CM to be used as an individual computer
 four two-processor Symmetric Multi-Processing (SMP) servers
 two four-processor SMP servers
 one eight-processor SMP server
 High-Performance Computing (HPC) nodes
 a virtualized computing cluster
 any other configuration.

Other configurations and functionalities may also or alternatively be achieved when combined with other Infrastructureless™ modules.

Infrastructureless™ Memory Module (MM)

The HIDC Way

The most commonly used type of memory in a computer is Random Access Memory (RAM). Currently, the most common form-factor for RAM is DIMM. DIMMs are available in varying capacities (i.e.: 32 GB, 64 GB, 128 GB, 256 GB, etc.)

Typically, motherboards have no RAM. Instead, motherboards contain multiple DIMM connectors ("slots"). The amount of RAM that can be installed on a motherboard is limited to the number of DIMM slots on the motherboard and the capacity of the DIMMs installed in the DIMM slots. It is common for motherboard manufacturers to build motherboards with more DIMM connectors than is needed by the average user to accommodate the few users that will use all available DIMM connectors.

The Infrastructureless™ Way

COM manufacturers try to balance the amount of computing resources, e.g., one or more processing devices, and RAM or other memory on the SBC. In some cases, depending on the workload assigned to the computing resources there may not be enough memory in the COM for the computing resources to complete its assigned task. For example, when the task is complex, it may not be able to be divided into smaller tasks more easily processable by the COM. In other cases, the data needed by the task may be too large to fit into the COMs onboard memory.

In illustrative embodiments, an Infrastructureless™ MM that is usable with an Infrastructureless™ ACP assembly may be utilized to fill this gap and support the Infrastructureless™ CM.

The Infrastructureless™ MM may comprise a variety of components including, for example, DDR, DIMM, LRDIMM, RDIMM, SO-DIMM, EEPROM, Intel® Optane™, PROM or any other type of memory technology.

FIGS. 14A, 14B, 14C and 14D are illustrative embodiments of an Infrastructureless™ MM assembly 420. A PCB 520 is encased inside an Infrastructureless™ enclosure base 425 with Infrastructureless™ enclosure cover 421. In some embodiments, the Infrastructureless™ enclosure base 425 and the Infrastructureless™ enclosure cover 421 together form a weatherproof enclosure or otherwise configure the enclosure to inhibit the intrusion of outside environmental elements from affecting or damaging components within the enclosure. When Infrastructureless™ enclosure cover 421 is attached to Infrastructureless™ enclosure base 425 connector 501 extends through opening 426 in the Infrastructureless™ enclosure cover 425 to mate with connector 300 on an Infrastructureless™ ACP assembly 280 of Infrastructureless™ Base Node 600 (FIG. 11A). The Infrastructureless™ MM PCB 520 contains multiple memory connectors 521, e.g., Surface-Mount Technology (SMT) DIMM or other memory connectors on the opposing side of Infrastructureless™ MM PCB 520 from connector 500. Connected to each memory connector 521 is a memory module 522, e.g., a DIMM or another memory module. In other embodiments, other memory connectors and memory modules may alternatively be utilized. In other embodiments, memory connectors 521 may be located on the same side of circuit board 520 as connector 501. In some embodiments, one or more memory modules 522 may also or alternatively be embedded into or integrated as part of circuit board 520 such that those memory modules 522 are not removable.

Figure 15A:
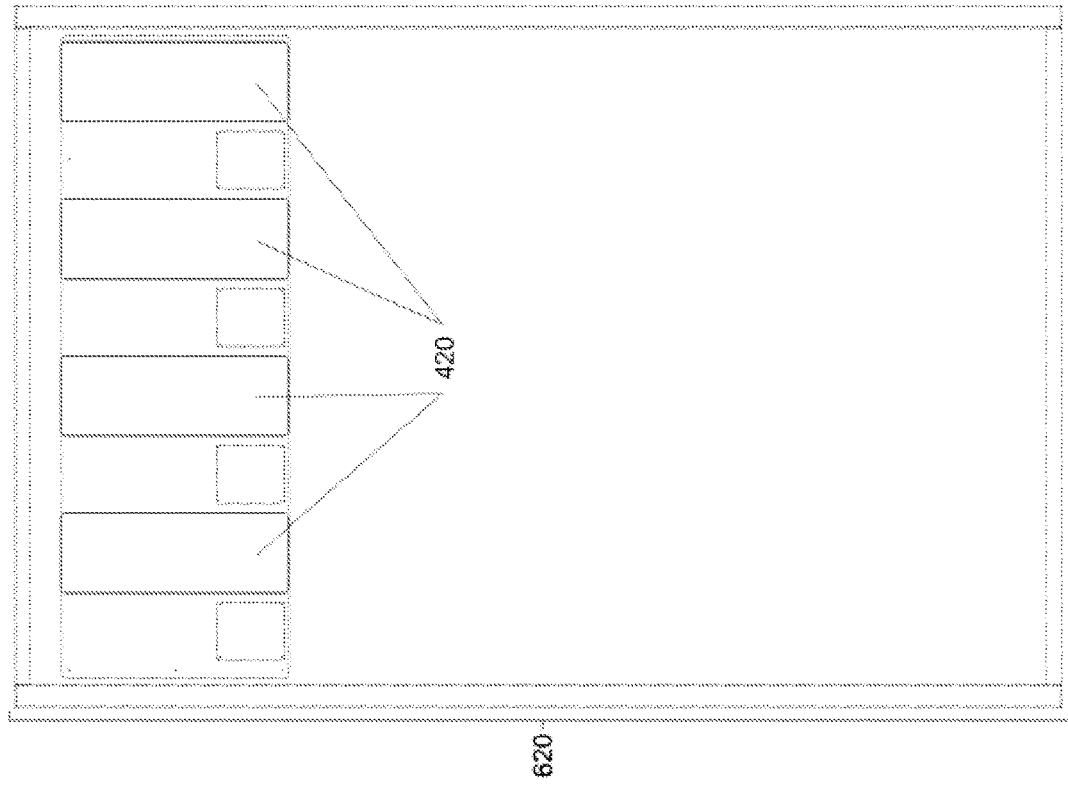
FIGS. 15A (orthogonal), 15B (isometric) and 15C (exploded isometric) are views of an Infrastructureless™ High-Capacity Computing Node comprising multiple Infrastructureless™ CM assemblies of FIGS. 12A, 12B and 12C and multiple Infrastructureless™ MM assemblies of FIGS. 14A, 14B, 14C and 14D mounted on the Infrastructureless™ ACP of an Infrastructureless™ Base Node of FIGS. 11A, 11B and 11C according to an embodiment.
Figure 14D:
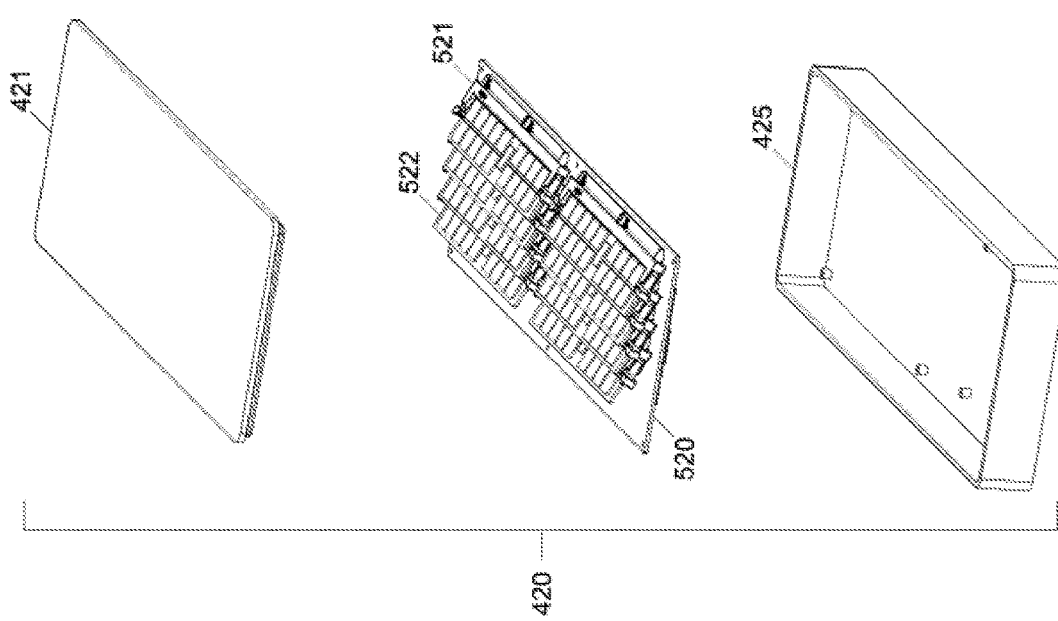
Figure 15C:
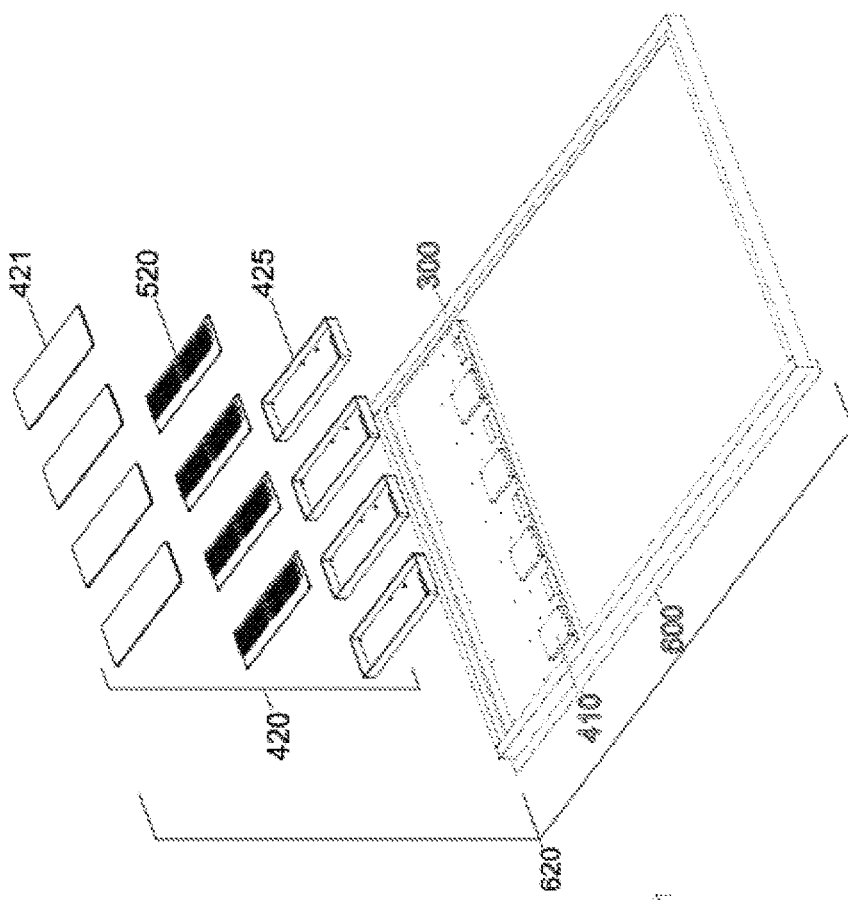
Figure 15B:
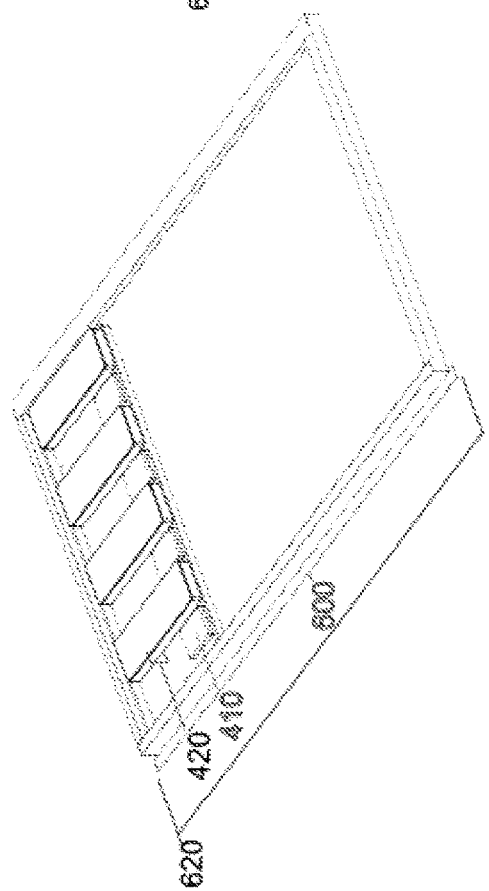
Figure 16D:
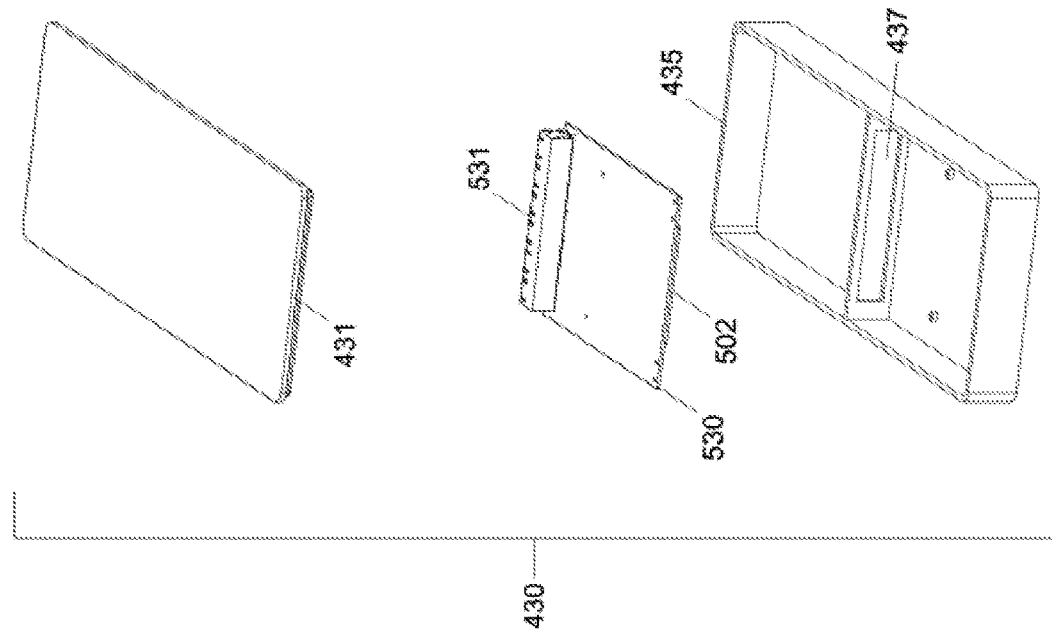
FIGS. 16A (orthogonal), 16B (isometric), 16C (exploded isometric) and 16D (inverted exploded isometric) are views of an Infrastructureless™ Network Module (NM) assembly according to an embodiment.
Figure 16C:
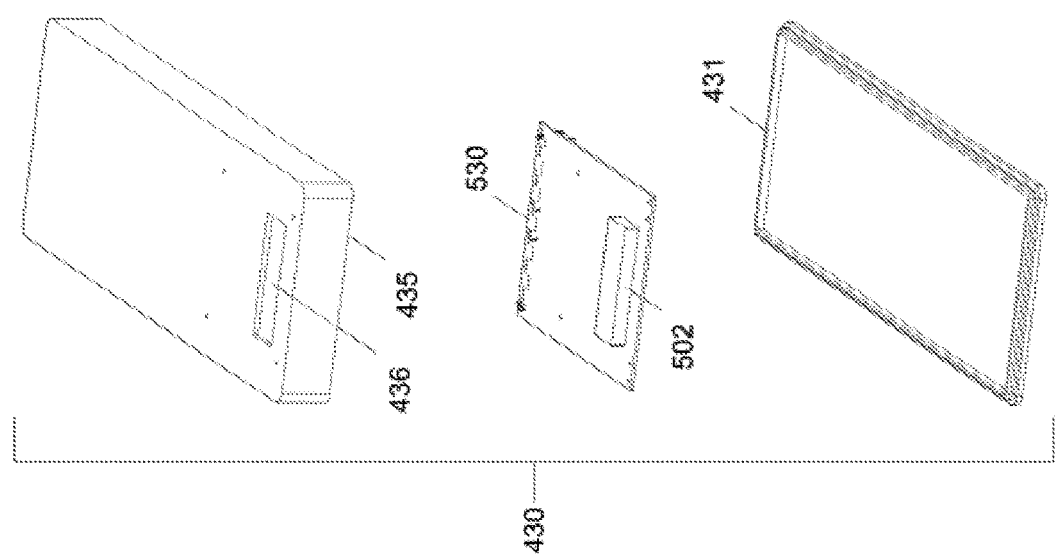

FIGS. 15A, 15B and 15C are an illustrative embodiment of an Infrastructureless™ High-Capacity Compute Node 620 comprising multiple Infrastructureless™ CM assemblies 410 (FIGS. 12A, 12B and 12C) and multiple Infrastructureless™ MM assemblies 420 (FIGS. 14A, 14B, 14C and 14D) mounted on the same Infrastructureless™ ACP assembly 280 of Infrastructureless™ Base Node 600 (FIG. 11A) via connections between respective connectors 500 (FIGS. 12A, 12B and 12C)/501 (FIGS. 14A, 14B, 14C and 14D) and corresponding ones of connectors 300 of Infrastructureless™ ACP assembly 280 of Infrastructureless™ Base Node 600 (FIG. 11A). In some embodiments, each Infrastructureless™ MM assembly 420 (FIGS. 14A, 14B, 14C and 14D) may be paired to corresponding Infrastructureless™ CM assembly 410 (FIGS. 12A, 12B and 12C) to increase the available memory capacity that is usable by that Infrastructureless™ CM assembly 410 (FIGS. 12A, 12B and 12C).

The illustrative embodiment of an Infrastructureless™ High-Capacity Compute Node 620 comprises four Infrastructureless™ CM assemblies 410 (FIGS. 12A, 12B and 12C) and four Infrastructureless™ MM assemblies 420 (FIGS. 14A, 14B, 14C and 14D) mounted on the same Infrastructureless™ ACP assembly 280 of Infrastructureless™ Base Node 600 (FIG. 11A) that can be used for memory intensive workloads. The illustrative embodiment of an Infrastructureless™ High-Capacity Compute Node 620 may be configured to perform functionality similar to an HIDC 4-socket (CPU) database server.

In other embodiments, other configurations of an Infrastructureless™ High-Capacity Compute node 620 may alternatively be utilized. For example, in some embodiments, a larger or smaller number of Infrastructureless™ CM assemblies 410 (FIGS. 12A, 12B and 12C) and Infrastructureless™ MM assemblies 420 (FIGS. 14A, 14B, 14C and 14D) may mounted to the same Infrastructureless™ ACP assembly 280 of Infrastructureless™ Base Node 600 (FIG. 11A). For example,
 seven Infrastructureless™ CM assemblies 410 and one Infrastructureless™ MM assembly 420
 six Infrastructureless™ CM assemblies 410 and two Infrastructureless™ MM assemblies 420
 five Infrastructureless™ CM assemblies 410 and three Infrastructureless™ MM assemblies 420
 three Infrastructureless™ CM assemblies 410 and five Infrastructureless™ MM assemblies 420
 two Infrastructureless™ CM assemblies 410 and six Infrastructureless™ MM assemblies 420
 one Infrastructureless™ CM assembly 410 and seven Infrastructureless™ MM assemblies.

As an example, in some embodiments, one Infrastructureless™ MM assembly 420 (FIGS. 14A, 14B, 14C and 14D)

may be usable by multiple Infrastructureless™ CM assemblies 410 (FIGS. 12A, 12B and 12C) as needed or one Infrastructureless™ CM assembly 410 (FIGS. 12A, 12B and 12C) may be configured to utilize multiple Infrastructureless™ MM assemblies 420 (FIGS. 14A, 14B, 14C and 14D) as needed.

In some embodiments each connector 300 of a particular Infrastructureless™ ACP assembly 280 of Infrastructureless™ Base Node 600 (FIG. 11A) may be connected to a corresponding Infrastructureless™ MM assembly 420 (FIGS. 14A, 14B, 14C and 14D), e.g., forming an Infrastructureless™ Memory node comprising eight Infrastructureless™ MM assemblies 420 (FIGS. 14A, 14B, 14C and 14D). In this embodiment, Infrastructureless™ Compute nodes 610 or Infrastructureless™ High-Capacity Compute nodes 620 mounted to another Infrastructureless™ ACP assembly 280 of another Infrastructureless™ Base Node 600 (FIG. 11A) may be configured to utilize the Infrastructureless™ MM assemblies 420 (FIGS. 14A, 14B, 14C and 14D) of the Infrastructureless™ ACP assembly 280 on the Infrastructureless™ Memory node to supplement their memory needs. In some embodiments, MM assembly 420 may alternatively be mounted or attached to the PV panel and connected to the ACP, e.g., via a wired or wireless connection. As an example, wiring (not shown) may connect the connector of the MM assembly 420 to a corresponding connector of the ACP.

Infrastructureless™ Network Module (NM)

The HIDC Way

In HIDCs there are currently two popular network designs, Top of Rack (ToR) and End of Row (EoR)/Middle of Row (MoR)

Top of Rack (ToR)

In an HIDC there may be as many as forty 1 U server chassis mounted on top of each other in each 42 U server cabinet. Also, in the server cabinets are one or two network switches typically installed in the top 2 U of the server cabinet. These network switches are referred to as ToR switches. In some cases, these switches have been moved to the middle of the cabinet and are referred to as in-rack switches. In both cases, each server in the cabinet is connected to the ToR or in-rack switch within the same cabinet. These short intra-cabinet network connections are typically made using RJ45 patch cables. Connecting these ToR or in-rack switches to the data center network is accomplished using fiber optic cable.

End of Row (EoR)/Middle of Row (MoR)

In an HIDC server cabinets are placed side-by-side in rows. At one or both ends of each server row are cabinets or racks with EoR network equipment providing network connectivity to the servers within the server cabinets of that row. In some cases, each server cabinet in this design has a bundle of twisted pair copper cabling, typically Category 6, 6A, 7 or 8, containing as many as 40 or more individual cables routed to the EoR network equipment.

For a redundant design there might be two bundles of cabling to each rack, each running to EoR network cabinets at opposing ends of the row. Within the server cabinet the space typically occupied by ToR switch(es) is occupied by one or more patch panels and the bundle of copper is wired to the back of these patch panels. As with the ToR design, the individual servers typically use a relatively short copper RJ45 patch cable to connect from the server to the patch panel in the same cabinet. The bundle of copper from each cabinet is typically routed through overhead cable troughs or "ladder racks" that carry the dense copper bundles to the EoR network cabinet. Longer server rows commonly have a rack dedicated to patching all the copper cables adjacent to the cabinet that contains the EoR network switch. Therefore, there might be two network racks at each end of the row, one for patching, and one for the network switch itself. Again, an RJ45 patch cable is used to link a port on the network switch to a corresponding patch panel port that establishes the link to the server.

The Infrastructureless™ Way

In illustrative embodiments, the disclosed Infrastructureless™ Data Center comprises Infrastructureless™ Nodes that are mounted side-by-side in a row instead of on top of each other in a server cabinet as found in HIDCs. Infrastructureless™ Data Center network design is based on a Network-On-Module concept that comprises a small device that offers tremendous flexibility that can be used to expand an Infrastructureless™ Data Center.

Componentry

In illustrative embodiments, a NM may comprise multiple components including some or all of on-board network components, network media, a network topology, a network type, and any other network technology.

The on-board network components may comprise, for example, components from Broadcom®, Intel®, nVIDIA® (formerly Mellanox) or any other type of on-board network components.

The network media may comprise, for example, wired network media, wireless network media or any other network media including, e.g., CATegory x (CATx) copper where x=3, 4, 5, 5e, 6, 6a, 7, 8 or any other version, Direct Attach Cable (DAC) including copper and fiber optic, SFP (SPF, SPF+, SFP28, SFP56, etc.), Quad-SFP (QSFP, QSFP+, QSFP14, QSFP28, QSFP56, etc.), Octal-SFP (OSFP) or other SFP variants, fiber optics including Multi-Mode Fiber (MMF), Single-Mode Fiber (SMF) or other fiber optics, RING, Bluetooth, Broadband cellular (3G, 4G LTE, 4G WiMAX, 5G, 6G, etc.), Satellite (HughesNet®, StarLink®, ViaSat™, etc.), Wi-Fi or any other network media technology.

The network topologies may comprise, for example, bus, hybrid, mesh, ring, star, tree or any other network topology.

The network type may comprise, for example, an Enterprise Private Network (EPN), a Fiber Channel (FC), a Local Area Network (LAN), Ethernet, InfiniBand, ROCE or any other LAN technology, a MAN, a PAN, a Storage Area Network (SAN), a Software-Defined Network (SDN), a System Area Network, VPN, WAN, Wireless Local Area Network (WLAN) or any other network type technology.

FIGS. 16A, 16B, 16C and 16D are an illustrative embodiment of an Infrastructureless™ NM assembly 430. Infrastructureless™ NM assembly 430 comprises a circuit board 530, i.e., PCB, that is encased inside an Infrastructureless™ enclosure base 435 with Infrastructureless™ enclosure cover 431. In some embodiments, the Infrastructureless™ enclosure base 435 and the Infrastructureless™ enclosure cover 431 together form a weatherproof enclosure or otherwise configure the enclosure to inhibit the intrusion of outside environmental elements from affecting or damaging components within the enclosure. A connector 502 extends through opening 436 in Infrastructureless™ enclosure base 435 to mate to a connector 300 on an Infrastructureless™ ACP assembly 280 (FIG. 11A). A connector 531 extends through opening 437 in Infrastructureless™ enclosure base 435 that is configured to receive connections to other NM assemblies 430 or other components of the Infrastructureless™ Data Center. In some embodiments, connector 531 may comprise a RJ45 connector or any other connector that may be utilized to connect a NM assembly 430 to other NM assemblies 430, routers or other network components.

FIGS. 17A, 17B and 17C are an illustrative embodiment of an Infrastructureless™ NM node 630 that comprises eight Infrastructureless™ NM assemblies 430 (FIGS. 16A, 16B, 16C and 16D) that are mounted on Infrastructureless™ ACP assembly 280 of Infrastructureless™ Base Node 600 (FIG. 11A) by way of a connection between the respective connectors 502 of each Infrastructureless™ NM assembly 430 (FIGS. 16A, 16B, 16C and 16D) to a corresponding one of connectors 300 of Infrastructureless™ ACP assembly 280 of Infrastructureless™ Base Node 600 (FIG. 11A). In some embodiments, NM assembly 430 may alternatively be mounted or attached to the PV panel and connected to the ACP, e.g., via a wired or wireless connection. As an example, wiring (not shown) may connect the connector of the NM assembly 430 to a corresponding connector of the ACP.

In other embodiments, any other number of connectors 300 and Infrastructureless™ NM assemblies 430 (FIGS. 16A, 16B, 16C and 16D) may alternatively be used.

The illustrative embodiment of Infrastructureless™ NM node 630 (FIGS. 17A, 17B and 17C) may have similar functionality to an EoR or MoR network switch placed in the middle or at one or both ends of a row of Infrastructureless™ Nodes comprising Infrastructureless™ Compute nodes 610 (FIGS. 13A, 13B and 13C), Infrastructureless™ High-Capacity Compute nodes 620 (FIGS. 15A, 15B and 15C) or any other nodes of Infrastructureless™ modular components mounted on Infrastructureless™ ACP assemblies 280 of Infrastructureless™ Base ACP Node 600 (FIG. 11A). Other configurations and functionalities can be achieved when combined with other Infrastructureless™ modules.

In other embodiments, any of Infrastructureless™ Compute node 610 (FIGS. 13A, 13B and 13C), Infrastructureless™ High-Capacity Compute node 620 (FIGS. 15A, 15B and 15C) or other nodes of the Infrastructureless™ Data Center may comprise one or more Infrastructureless™ NM assemblies 430 mounted to their Infrastructureless™ ACP assembly 280 of Infrastructureless™ Base ACP Node 600 (FIG. 11A). For example, any combination of Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B, 16C and 16D) or other module assemblies may be mounted to the same Infrastructureless™ ACP assembly 280 where Infrastructureless™ CM, Infrastructureless™ MM and Infrastructureless™ NM functionality may all be included on the Infrastructureless™ ACP assembly 280 of the same Infrastructureless™ Base ACP node 600 (FIG. 11a).

Infrastructureless™ Power Module (PM)
The HIDC Way

"An Uninterruptible Power Supply or Uninterruptible Power Source (UPS) is an electrical apparatus that provides emergency power to a load when the input power source or main power fails. A UPS differs from an auxiliary or emergency power system or standby generator in that it will provide near-instantaneous protection from input power interruptions, by supplying energy stored in batteries, supercapacitors, or flywheels. The on-battery run-time of most uninterruptible power sources is relatively short (a few minutes) but sufficient to start a standby power source or properly shut down the protected equipment. It is a type of continual power system." (See *Uninterruptible power supply* at Wikipedia.org)

HIDCs typically deploy one of two different UPS models, centralized or, distributed.

When a centralized UPS model is deployed HIDCs may experience fires resulting from insufficiently cooling large quantities of batteries tightly packed on a pallet and many pallets stored side-by-side in a small building or room. Batteries generate heat when being heavily charged or heavily discharged. The heat generated by the batteries in the core of a palletized battery pack has no place to escape thereby heating neighboring batteries which are generating heat of their own.

"How toxic is lithium-ion battery smoke? The research, published in Nano Energy, identified more than 100 toxic gases released by lithium-ion batteries (Li-ions), including carbon monoxide. The gases are potentially fatal, they can cause strong irritations to the skin, eyes and nasal passages, and harm the wider environment." (See *What happens if you burn a lithium-ion battery*? at Lemielleux.com)

The Infrastructureless™ Way

One of the major advantages of having battery packs mounted to the back of PV panels is those same palletized batteries mentioned above are thinly spread over a large area.

Example benefits that are obtained by thinly spreading the batteries over a larger area include:
1. By thinly spreading batteries over a large area none of those batteries are in the core. In an example embodiment, the Infrastructureless™ PMs in an Infrastructureless™ Data Center may have two or fewer layers of batteries thereby allowing the resulting heat to escape through at least 50% of the battery's exterior surface. In some embodiments, the number of layers of batteries may be 1, 2, 3 or any other number of layers.
2. In the reduced possibility that a battery in an Infrastructureless™ PM does catch fire, the fire can be easily contained, if not self-extinguishing. For example, with fewer layers of batteries spread over a large area, the fire's ability to spread is significantly reduced, if not eliminated.

Another major advantage is Infrastructureless™ Data Centers are electrically self-sufficient. Infrastructureless™ Data Centers do not need to be connected to 'the grid' for a source of electricity. Not being connected to 'the grid' eliminates the possibilities of inbound power surges and brownouts as well as the need for the associated power stabilizing equipment. Inbound power surges are known to cause batteries to overheat resulting in battery fires.

Componentry

The batteries or other power storage devices may comprise, for example, Absolyte, Alkaline, Flooded Lead Acid, Lead Acid, Lithium, Lithium-Ion, Lithium Iron Phosphate, Mercury, Nickel Cadmium, Nickel Iron, Nickel Metal Hydride, Sodium-Ion, valve regulated lead-acid (VRLA), Zinc or any other battery or power storage technologies.

The charge controller may comprise, for example, functionality for managing the charging cycle of the battery, e.g., by reducing the charging rate or energy supplied to the battery for charging to mitigate heat generation, by switching between constant voltage and constant current charging during the charging cycle depending on the amount of charge, etc. For example, since the last 20% of the charging cycle to reach full charge may generate more heat than the first 80%, the charge controller may be configured to either reduce the charging rate, reduce the amount of electricity being used to charge the battery, switch from constant current charging to constant voltage charging for the last portion of the charge or perform any other charging related adjustments as needed.

The power monitor device may comprise, for example, functionality for managing the discharge cycle of the battery, e.g., by adjusting the amount of electricity consumed by the connected modules to help mitigate the generation of heat as the battery nears its fully discharged state.

Any rechargeable battery can be used to build a battery pack. For the purposes of FIGS. 18A through 18E, the most popular and readily available rechargeable battery, the 18650 Lithium-Ion (Li-Ion) battery, is used as an example.

Figure 18C:
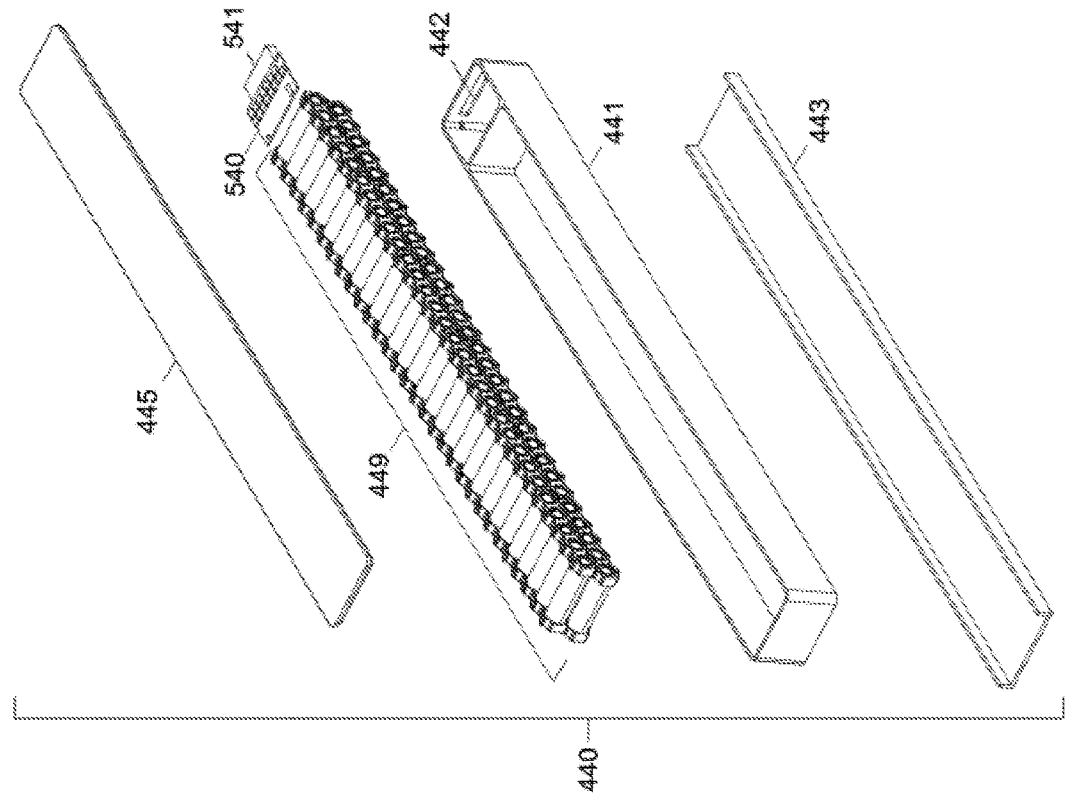
FIGS. 18A (orthogonal), 18B (isometric), 18C (exploded isometric), 18D (exploded isometric) and 18E (isometric) are views of an Infrastructureless™ Power Module (PM) assembly according to an embodiment.
Figure 18B:
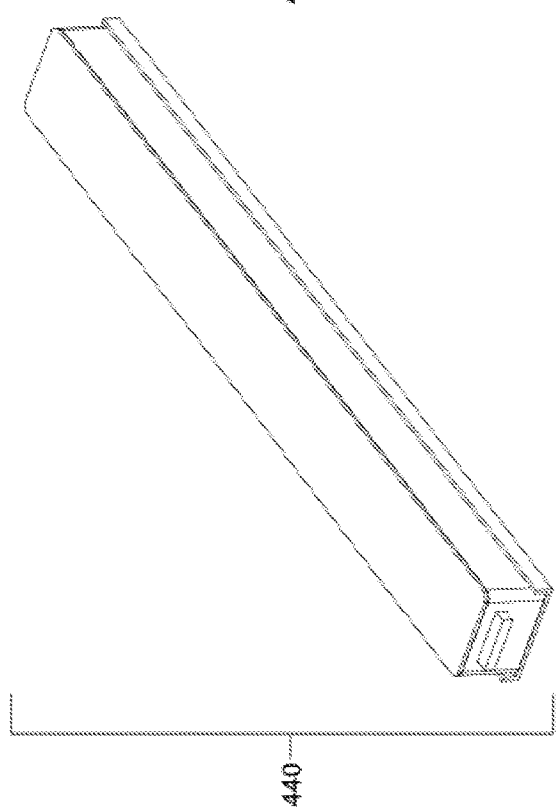

FIGS. 18A, 18B and 18C are an illustrative embodiment of an Infrastructureless™ PM assembly 440. A circuit board 540, e.g., a PCB, and a battery pack 449 are both encased inside an Infrastructureless™ Enclosure base 441 by an Infrastructureless™ enclosure cover 445. In some embodiments, the Infrastructureless™ enclosure base 441 and the Infrastructureless™ enclosure cover 445 together form a weatherproof enclosure or otherwise configure the enclosure to inhibit the intrusion of outside environmental elements from affecting or damaging components within the enclosure. In some embodiments, Infrastructureless™ enclosure base 441 is adhered or attached to the back of a PV panel assembly 100 (FIG. 10A), e.g., as previously described. In some embodiments, a mounting structure 443, e.g., a bracket or other structure, is adhered or attached to the back of PV panel assembly 100 (FIG. 10A) and Infrastructureless™ enclosure base 441 is configured to attach to mounting structure 443 to secure enclosure base 441 to the back of PV panel assembly 100 (FIG. 10A). Mounting structures similar to mounting structure 443 may also or alternatively be utilized to secure ACP assembly 280 or any other component to the back of PV panel assembly 100 (FIG. 10A).

The circuit board 540 may comprise the internal Battery Management System (BMS) for the Infrastructureless™ PM assembly 440. In some embodiments, circuit board 540 may be stored in a separate compartment of Infrastructureless™ PM enclosure base 441 from battery pack 449 with appropriate connections between circuit board 540 and battery pack 449, e.g., circuit ribbons, wires, etc., extending between the compartments. In some embodiments, circuit board 540 comprises a power connector 541 that extends through an opening 442 of Infrastructureless™ PM enclosure base 441 and is configured to connect to a corresponding power connector 302 (FIG. 11B) of Infrastructureless™ ACP assembly 280 of Infrastructureless™ Base Node 600 (FIGS. 11A, 11B and 11C). In an embodiment where Infrastructureless™ PM assembly 440 supplies power wirelessly, power connector 541 and opening 442 may not be included. In some embodiments, PM assembly 440 may alternatively be mounted or attached to the PV panel and connected to the ACP, e.g., via a wired or wireless connection. As an example, wiring (not shown) may connect the connector of the PM assembly 440 to a corresponding connector of the ACP.

In some embodiments, each power connector 302 (FIG. 11B) may be configured to supply power from an attached Infrastructureless™ PM assembly 440 to one of connectors 300 (FIG. 11B) and any assembly attached thereto, e.g., in a one-to-one relationship. In some embodiments, each power connector 302 may be configured to supply power from an attached Infrastructureless™ PM assembly 440 to multiple connectors 300 (FIG. 11B) and any assemblies attached thereto, e.g., in a one-to-many relationship. In some embodiments, more than one power connector 302 may be configured to supply power from their attached Infrastructureless™ PM assemblies 440 to one of connectors 300 (FIG. 11B) and any assembly attached thereto, e.g., in a many-to-one relationship. In some embodiments, more than one power connector 302 (FIG. 11B) may be configured to supply power from their attached Infrastructureless™ PM assemblies 440 to more than one connector 300 (FIG. 11B) and any assemblies attached thereto, e.g., in a many-to-many relationship.

For example, in some embodiments, circuit wiring within Infrastructureless™ ACP assembly 280 of Infrastructureless™ Base Node 600 (FIGS. 11A, 11B and 11C) may provide a one-to-one, one-to-many, many-to-one or many-to-many pathway between the power connectors 302 (FIG. 11B) and the corresponding connectors 300 (FIG. 11B). In other embodiments, Infrastructureless™ ACP assembly 280 of Infrastructureless™ Base Node 600 (FIGS. 11A, 11B and 11C) may be configured to modify or update the connections between the power connectors 302 (FIG. 11B) and connectors 300 (FIG. 11B) as needed, e.g., via software, switches, gates or in any other manner.

Figure 18D:
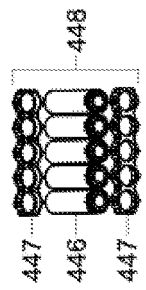

FIG. 18D shows five batteries 446 held together with a pair of battery holders 447. The Cathode (+) ends of the batteries 446 are placed into one battery holder 447. The other battery holder 447 is placed over the Anode (−) ends of the batteries 446. This creates a battery assembly 448. While battery assembly 448 is described as having five batteries 446 connected together by two battery holders 447 in an illustrative embodiment, battery assembly 448 may comprise any other number of batteries 446 and battery holders 447 in other embodiments.

Figure 18E:
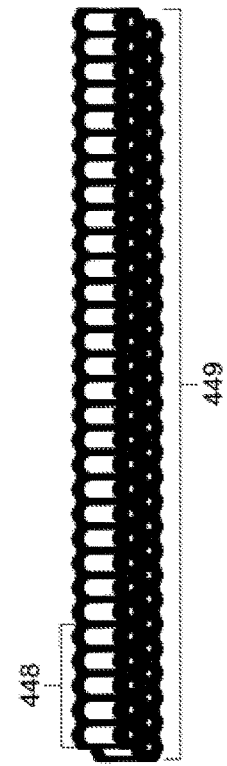

FIG. 18E is an illustrative embodiment that shows twelve battery assemblies 448 clustered together to form a battery pack 449. While battery pack 449 is described as having twelve battery assemblies 448 clustered together in an illustrative embodiment, battery pack 449 may comprise any other number of battery assemblies 448 in other embodiments.

Figure 19A:
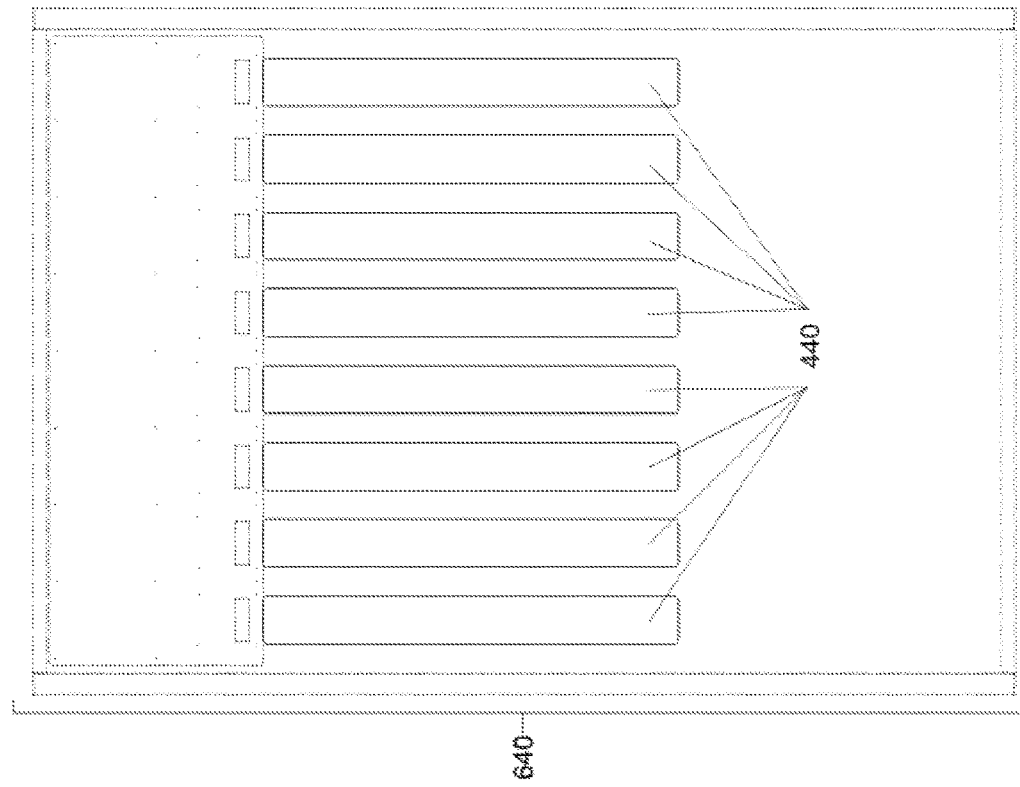
FIGS. 19A (orthogonal), 19B (isometric), and 19C (exploded isometric) are views of an Infrastructureless™ Power node comprising multiple Infrastructureless™ PM assemblies of FIGS. 18A through 18E connected to the ACP of an Infrastructureless™ Base Node of FIGS. 11A, 11B and 11C according to an embodiment.
Figure 19C:
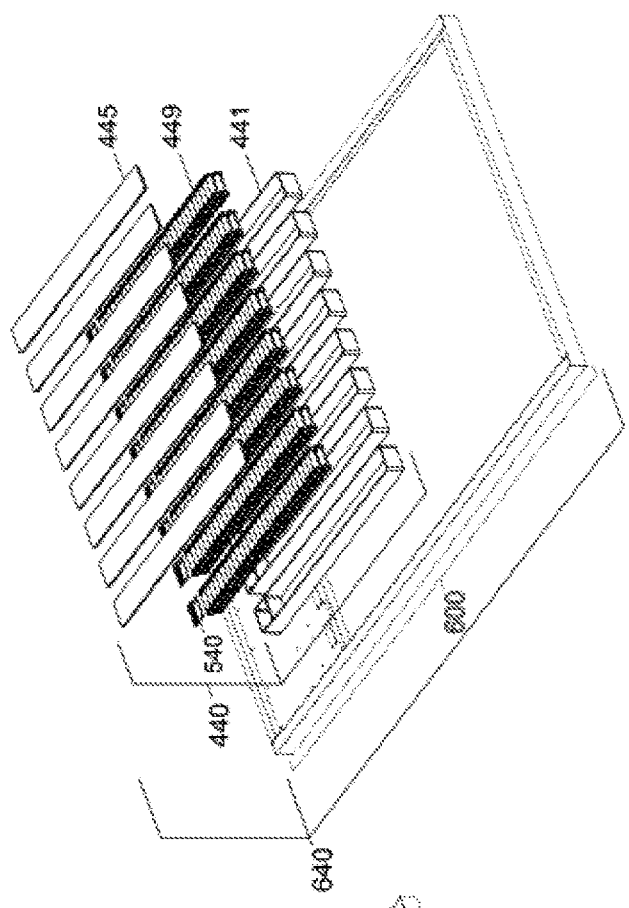
Figure 19B:
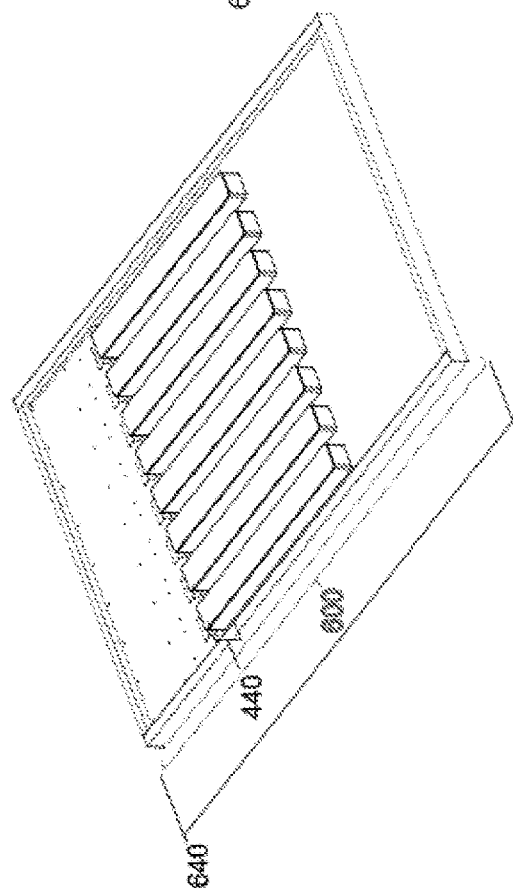

FIGS. 19A, 19B and 19C are illustrative embodiments of an Infrastructureless™ Power Node 640 comprising eight Infrastructureless™ PM assemblies 440 (FIGS. 18A, 18B and 18C) connected to an Infrastructureless™ Base Node 600 (FIGS. 11A and 11B).

In some embodiments, the Infrastructureless™ PM assemblies 440 (FIGS. 18A, 18B and 18C) of Infrastructureless™ Power Node 640 may be connected to Infrastructureless™ APC assembly 280 of Infrastructureless™ Base Node 600 (FIGS. 11A, 11B and 11C) using wired connection 442 (FIG. 18C). In other embodiments, the Infrastructureless™ PM assemblies 440 (FIGS. 18A through 18E) of Infrastructureless™ Power Node 640 may be connected to Infrastructureless™ ACP assembly 280 of Infrastructureless™ Base Node 600 (FIGS. 11A, 11B and 11C) wirelessly, e.g., using wireless technologies.

Infrastructureless™ Power Node 640 can be used to power a personal (gaming) computer 191 (FIGS. 4A, 4B and 4C). Since many gamers play at night, the Infrastructureless™ Power Node 640 could supply the appropriate amount of DC electricity to said personal (gaming) computer 191 (FIGS. 4A, 4B and 4C) during nighttime hours then recharge during daytime hours.

Infrastructureless™ Power Node 640 may be utilized to provide power to one or more connected computing devices even when PV panel 101 (FIG. 10A) is not generating enough power to support the needs of the connected computing device(s), e.g., due to atmospheric conditions, time of day, etc. As an example, Infrastructureless™ Power Node 640 may be utilized to power a computing device 191

(FIGS. 4A, 4B and 4C) or any other computing device. Infrastructureless™ Power Node 640 (FIGS. 19A, 19B and 19C) may also or alternatively be utilized to power any other computing device or system.

In some embodiments, any of Infrastructureless™ Compute node 610 (FIGS. 13A, 13B and 13C), Infrastructureless™ High-Capacity Compute node 620 (FIGS. 15A, 15B and 15C), Infrastructureless™ Network node 630 (FIGS. 17A, 17B and 17C) or other Infrastructureless™ nodes of the Infrastructureless™ Data Center may comprise one or more Infrastructureless™ PM assemblies 440 connected to their Infrastructureless™ ACP assembly 280 of Infrastructureless™ Base Node 600 (FIGS. 11A, 11B and 11C). For example, any combination of Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B, 16C and 16D), Infrastructureless™ PM assemblies 440 (FIGS. 18A, 18B and 18C) or other Infrastructureless™ module assemblies may be connected to the same Infrastructureless™ ACP assembly 280 of Infrastructureless™ Base Node 600 (FIGS. 11A, 11B and 11C) where Infrastructureless™ CM, Infrastructureless™ MM, Infrastructureless™ NM and Infrastructureless™ PM functionality may all be included on the same Infrastructureless™ ACP assembly 280 of Infrastructureless™ Base Node 600 (FIGS. 11A, 11B and 11C).

Infrastructureless™ Storage Module (SM)

The HIDC Way

Data storage in HIDCs have many forms each of which utilizes extensive amounts of infrastructure. For example, all storage implementations, whether Direct Attached Storage (DAS), Network Attached Storage (NAS), Storage Area Network (SAN), Software-Defined Storage (SDS), etc., use storage devices of some type including HDD, Magnetic Tape, SSD or other storage devices. Those storage devices are housed in chassis and those chassis are mounted in server cabinets.

Digital data is normally in one of three states: data at rest, data in transit and data in use. (See *Digital data* at Wikipedia.org) The state and length of time the data will be at each state will determine the storage device to be used.

"Storage systems typically use special hardware and software along with disk drives or SSDs to provide very fast and reliable storage for computing and data processing. Storage systems are complex and may be thought of as a special purpose computer designed to provide storage capacity along with advanced data protection features. Disk drives are one element within a storage system, along with hardware and special purpose embedded software within the system." (See *Storage virtualization* at Wikipedia.org)

The Infrastructureless™ Way

The Infrastructureless™ SM can make massive amounts of storage available for a variety of deployment models. When deployed using lossless network technologies (i.e.: Fiber Channel, InfiniBand or others), large SANs may be deployed. When deployed using RDMA protocols (i.e.: InfiniBand, ROCE or others), SDS arrays can be deployed inside HCI (Hyper-Converged Infrastructure) clusters.

Componentry

In illustrative embodiments, a SM may comprise multiple components including some or all of storage devices, storage protocols, computer file systems or any other data storage component.

The storage devices may comprise, for example, Flash Memory, HDDs, Memory Cards, Compact Flash, SD, SDSC, SDHC, SDXC, SDUC, Memory Sticks, Multi-Media Cards, NVMe, SSDs or any other memory technology.

The storage protocols may comprise, for example, Common Internet Files System (CIFS), DAS, FC, Small Computer System Interface (SCSI), Internet SCSI (iSCSI), Just a Bunch of Disks (JBoD), Massive Array of Idle Drives (MAID), NAS, Network File System (NFS), Object Storage, Redundant Array of Inexpensive Drives (RAID), SAN, SDS, Server Message Block (SMB) or any other storage protocol.

The computer file systems may comprise, for example, FAT, exFAT, ext, ext2, ext3, ext4, etc., HPFS, NTFS or any other computer file system.

Figure 20C:
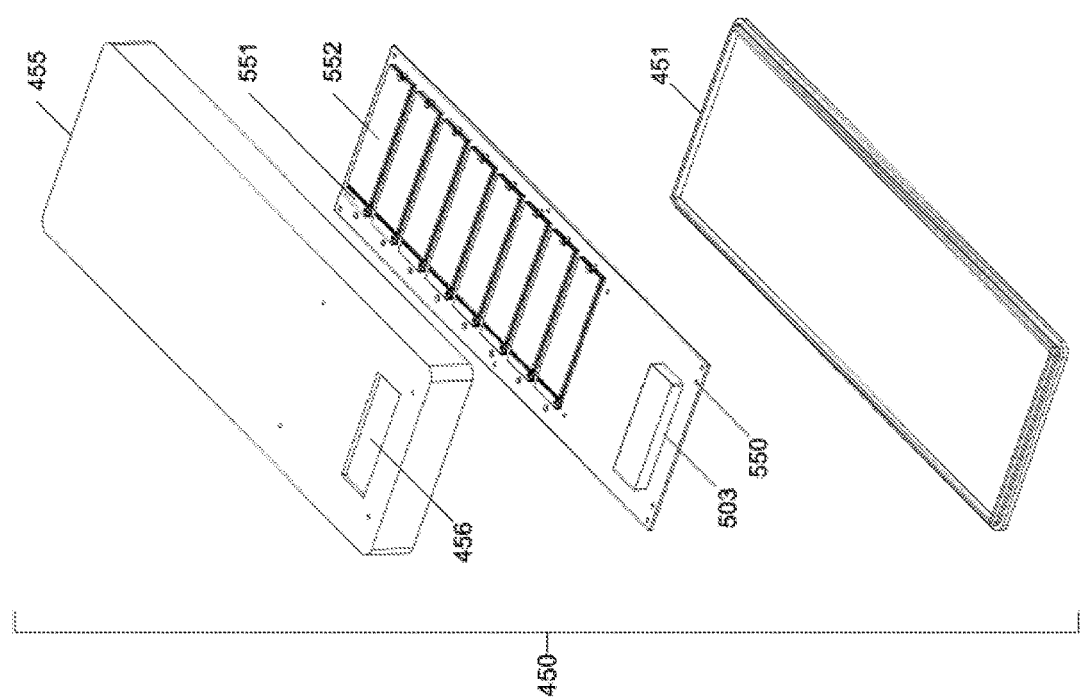
FIGS. 20A (orthogonal), 20B (isometric), and 20C (exploded isometric) are views of an Infrastructureless™ Storage Module (SM) assembly according to an embodiment.

FIGS. 20A, 20B and 20C are an illustrative embodiment of an Infrastructureless™ SM assembly 450 which comprises a single circuit board 550, e.g., a PCB, that is encased inside an Infrastructureless™ enclosure base 455 by an Infrastructureless™ enclosure cover 451. In some embodiments, the Infrastructureless™ enclosure base 441 and the Infrastructureless™ enclosure cover 445 together form a weatherproof enclosure or otherwise configure the enclosure to inhibit the intrusion of outside environmental elements from affecting or damaging components within the enclosure. A connector 503 extends through opening 456 in Infrastructureless™ SM enclosure base 455 and is configured to mate with connector 300 on an Infrastructureless™ ACP assembly 280 of Infrastructureless™ Base Node 600 (FIG. 11A). In some embodiments, SM assembly 450 may alternatively be mounted or attached to the PV panel and connected to the ACP, e.g., via a wired or wireless connection. As an example, wiring (not shown) may connect the connector of the SM assembly 450 to a corresponding connector of the ACP.

Circuit board 550 comprises eight connectors 551, e.g., Surface-Mount Technology (SMT) M.2 connectors in some embodiments although other connector technologies may alternatively be utilized, on each side. Connected to each connector 551 is a storage device 552 such as, e.g., a NVMe M.2 SSD or any other storage device. In some embodiments, a greater or smaller number of connectors 551 and storage devices 552 may alternatively be utilized for SM assembly 450 and different SM assemblies 450 may have different numbers of connectors 551 and storage devices 552 depending on system requirements. In some embodiments, connectors 551 may be disposed on only one side of circuit board 550.

The illustrative embodiment of an Infrastructureless™ SM assembly 450 in FIGS. 20A, 20B and 20C comprises sixteen storage devices 552 that can be configured as individual drives, a JBoD (Just a Bunch of Disks) array, a NAS array, a RAID array, any other configuration. In some embodiments, Infrastructureless™ SM assembly 450 may also be tasked with performing some or all the functionality of Infrastructureless™ MM assembly 420.

Circuit board 550 of Infrastructureless™ SM assembly 450 may comprise any number of connectors 551 and connectors 551 may be comprise any arrangement. Circuit board 550 of Infrastructureless™ SM assembly 450 may comprise any number of storage devices 552. In some embodiments, one or more storage devices 522 may also or alternatively be embedded into or integrated as part of circuit board 550 such that those storage devices 522 are not removable.

When this illustrative embodiment is populated with 8 TB NVMe M.2 SSDs each Infrastructureless™ SM assembly 450 can provide up to 128 TB of high-speed storage capacity. In other embodiments, larger or smaller storage devices 552 may enable a particular Infrastructureless™ SM assembly 450 to provide different amounts of high-speed storage capacity.

Additional configurations and functionalities can be achieved when combined with other Infrastructureless™ modules.

Figure 21A:
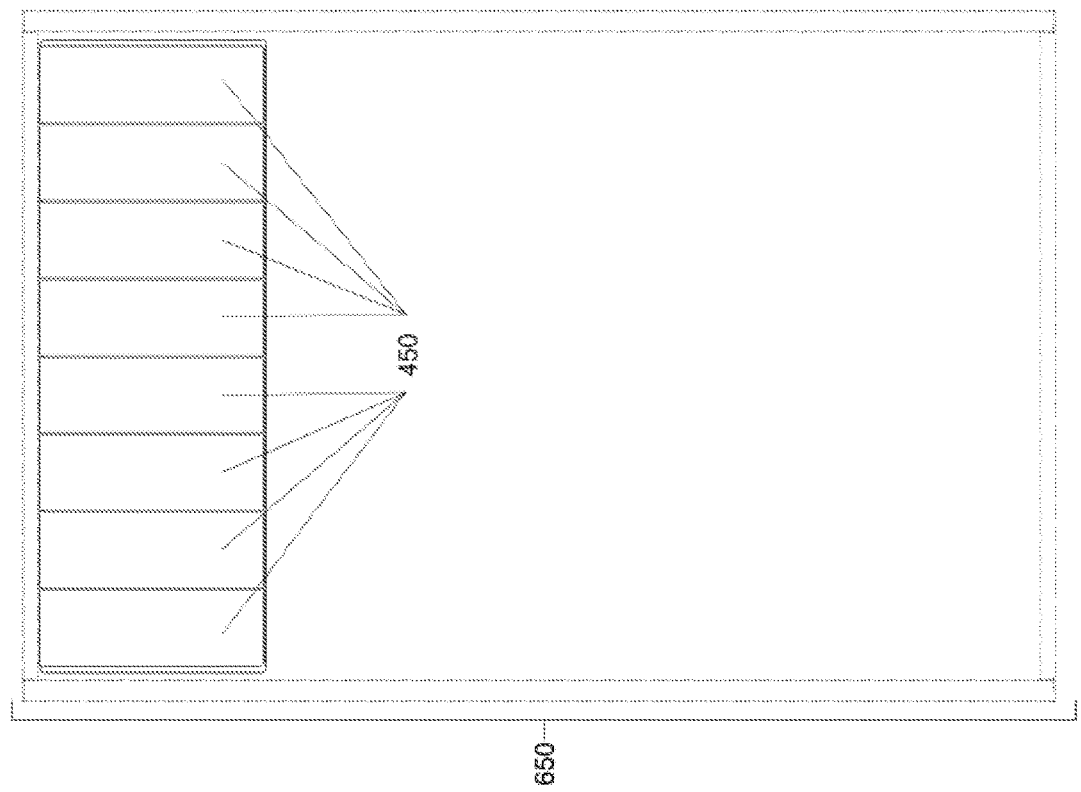
FIGS. 21A (orthogonal), 21B (isometric), and 21C (exploded isometric) are views of an Infrastructureless™ Storage node comprising multiple Infrastructureless™ SM assemblies of FIGS. 20A, 20B, and 20C mounted on the ACP of an Infrastructureless™ Base Node of FIGS. 11A, 11B and 11C according to an embodiment.
Figure 21C:
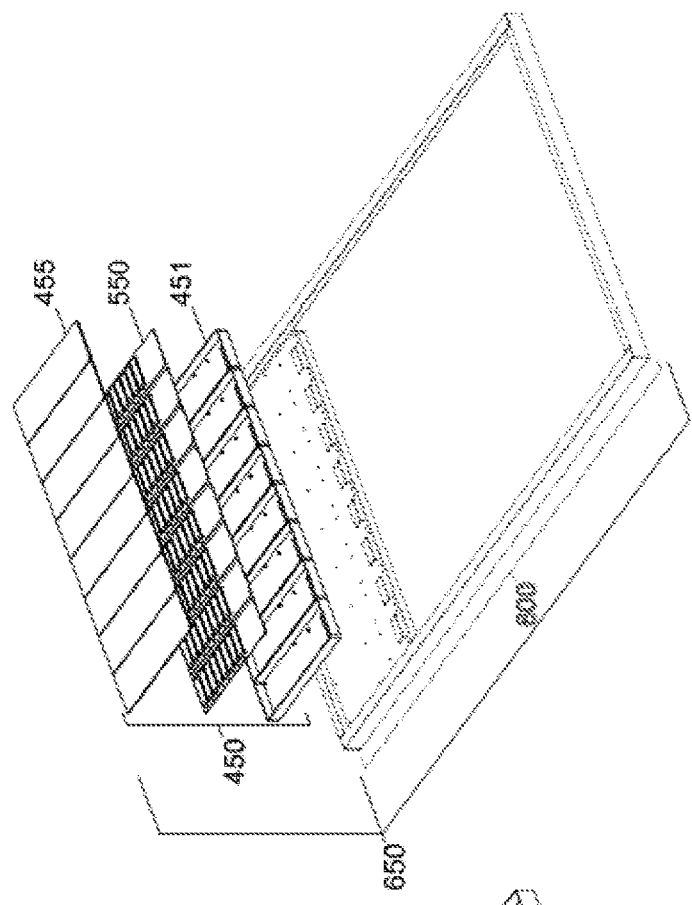
Figure 21B:
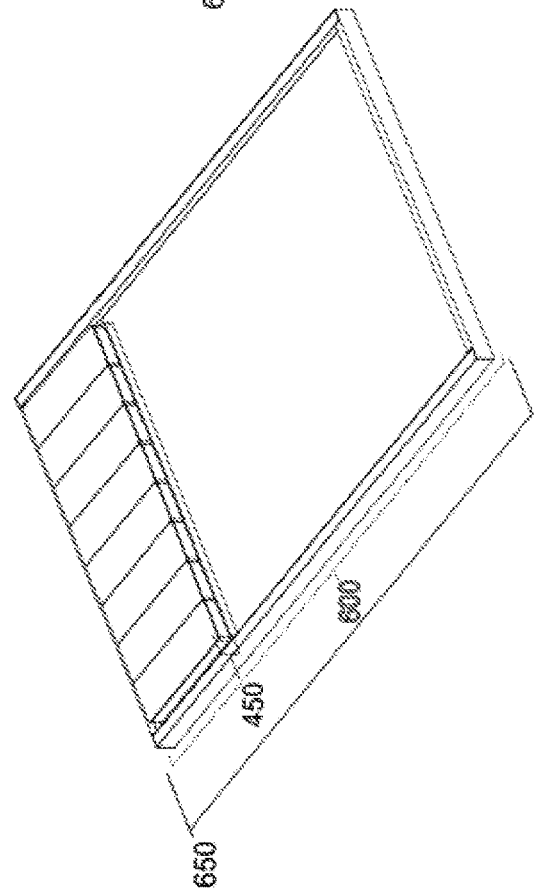

FIGS. 21A, 21B and 21C are illustrative embodiments of an Infrastructureless™ Storage Node 650 comprising multiple Infrastructureless™ SM assemblies 450 (FIGS. 20A, 20B and 20C) mounted on an Infrastructureless™ ACP assembly 280 of Infrastructureless™ Base Node 600 (FIGS. 11A, 11B and 11C) via a connection between the respective connectors 503 of each Infrastructureless™ SM assembly 450 (FIGS. 20A, 20B and 20C) to a corresponding one of connectors 300 of Infrastructureless™ Base Node 600 (FIGS. 11A, 11B and 11C). In other embodiments, any other number of connectors 300 and Infrastructureless™ SM assemblies 450 may alternatively be used.

In some embodiments, one or more of the Infrastructureless™ SM assemblies 450 (FIGS. 20A, 20B and 20C) mounted on Infrastructureless™ Base Node 600 may be configured as individual drives, a JBoD array, a NAS array, a RAID array, a SAN, a SDS array or any other storage configuration. In an embodiment, an example Infrastructureless™ SM node 650 comprising eight Infrastructureless™ SM assemblies 450 (FIGS. 20A, 20B and 20C) each having 8 TB storage devices 552 in all sixteen connectors 551 may provide up to 1 PetaByte (PB) of high-speed storage capacity.

In some embodiments, any of Infrastructureless™ Compute node 610 (FIGS. 13A, 13B and 13C), Infrastructureless™ High-Capacity Compute node 620 (FIGS. 15A, 15B and 15C), Infrastructureless™ Network node 630 (FIGS. 17A, 17B and 17C), Infrastructureless™ Power node 640 (FIGS. 19A, 19B and 19C) or other nodes of the Infrastructureless™ Data Center may comprise one or more Infrastructureless™ SM assemblies 450 (FIGS. 20A, 20B and 20C) mounted to their Infrastructureless™ Base Node 600. For example, the any combination of Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B, 16C and 16D), Infrastructureless™ PM assemblies 440 (FIGS. 18A, 18B and 18C), Infrastructureless™ SM assemblies 450 (FIGS. 20A, 20B and 20C) or other Infrastructureless™ module assemblies may be mounted to the same Infrastructureless™ Base Node where Infrastructureless™ CM, Infrastructureless™ MM, Infrastructureless™ NM, Infrastructureless™ PM and Infrastructureless™ SM functionality may all be included on the same Infrastructureless™ Base Node 600. Other configurations and functionalities can be achieved when combined with other modules.

Infrastructureless™ Data Center

There's not a one-size fits all solution to building an HIDC. Major systems vendors have been selling their solutions to HI DC tenants for decades. More recently, some organizations have been working to design commodity hardware that is more efficient, flexible, and scalable. In either case, data center systems are built from five elemental components: compute, memory, network, power (protection), and storage. Combinations of these five elemental components are grouped together to create data systems (i.e.: servers). Data systems are grouped together to form clusters (i.e.: HCI, HPC, SAN, SQL, etc.). Clusters are combined to create data centers.

An Infrastructureless™ Data System according to an illustrative embodiment comprises one or more of an Infrastructureless™ Compute node 610 (FIGS. 13A, 13B and 13C), an Infrastructureless™ Memory node, an Infrastructureless™ High-Capacity Compute node 620 (FIGS. 15A, 15B and 15C), an Infrastructureless™ Network node 630 (FIGS. 17A, 17B and 17C), an Infrastructureless™ Power node 640 (FIGS. 19A, 19B and 19C), an Infrastructureless™ Storage node 650 (FIGS. 21A, 21B and 21C) or any other Infrastructureless™ node comprising any combination of Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B, 16C and 16D), Infrastructureless™ PM assemblies 440 (FIGS. 18A, 18B and 18C), Infrastructureless™ SM assemblies 450 (FIGS. 20A, 20B and 20C) or any other Infrastructureless™ module assemblies. One or more Infrastructureless™ Data Systems are grouped together to form Infrastructureless™ Clusters and one or more Infrastructureless™ Clusters are combined to create environmentally friendly Infrastructureless™ Data Centers.

Infrastructureless™ Node embodiments using eight (8) of the same type of modules have already been discussed in the previous sections. Subsequent sections discuss a few embodiments using combinations of the Infrastructureless™ modules to create data systems (aka Infrastructureless™ Data Systems) that are configured to perform similar functionality to those found in HIDCs. Infrastructureless™ Data Systems can be grouped together to form Infrastructureless™ Clusters. Infrastructureless™ Clusters are combined to create Infrastructureless™ Data Centers.

Infrastructureless™ Nodes

Figures 22A, 22B:
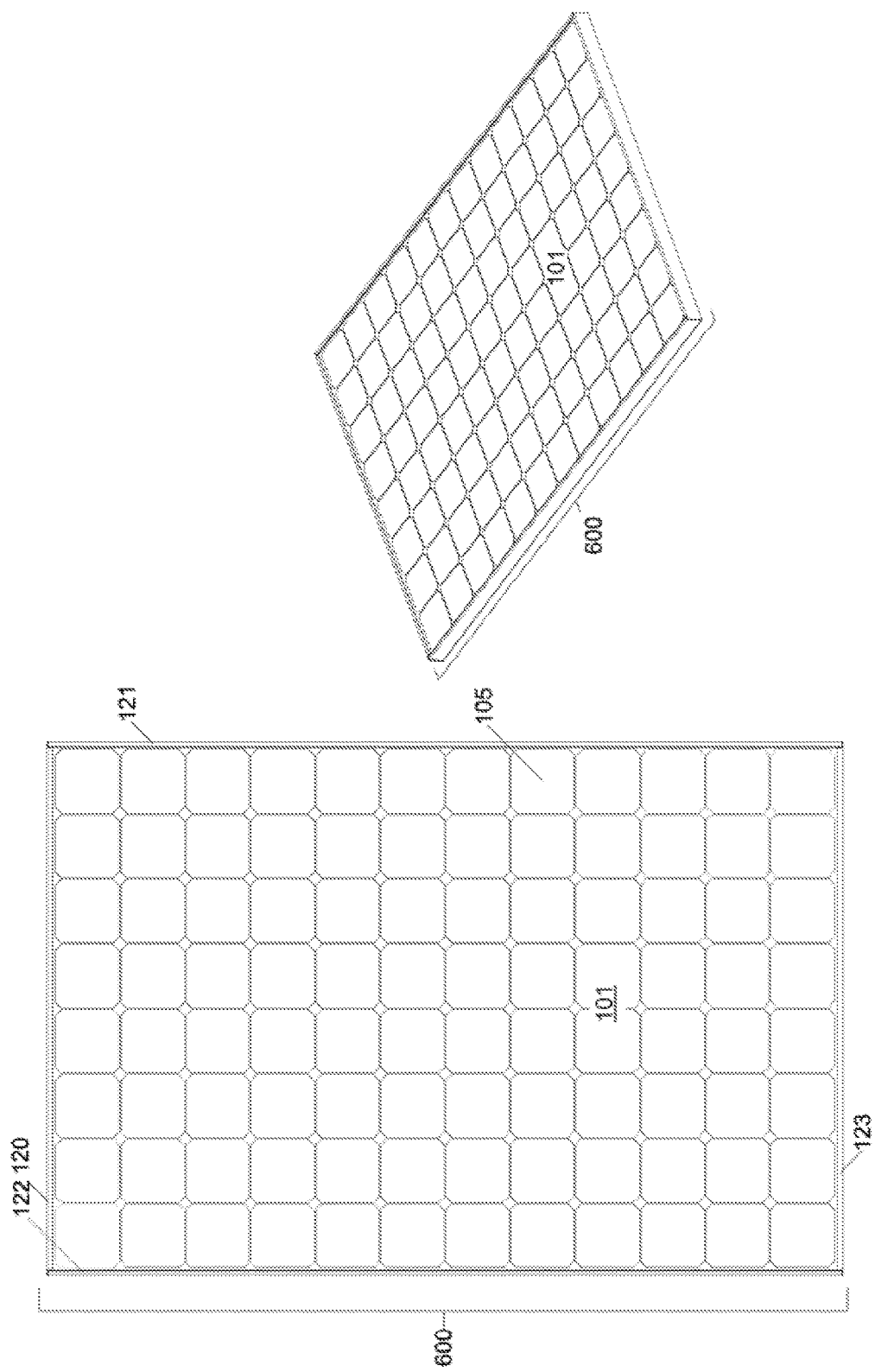
FIGS. 22A (orthogonal) and 22B (isometric) are views from the front of an Infrastructureless™ Base Node of FIGS. 11A, 11B and 11C according to an embodiment.

As seen in FIG. 22A, an Infrastructureless™ Data System according to the illustrative embodiments may not be visible when viewed from above, e.g., by a satellite, plane, etc. Instead, when viewed from above, the Infrastructureless™ node may look like an ordinary PV panel that is used solely for the generation of electricity since the Infrastructureless™ Data System components are mounted to the back of PV panel assembly 100 (FIG. 10A).

FIGS. 22A and 22B are an illustrative embodiment of the front an Infrastructureless™ Base Node 600. There is a PV panel 101 comprised of one or more PV Cells 105 arranged in an array. PV panel 101 may comprise any number of PV cells 105 and PV cells 105 may comprise any size or arrangement. Mounting frame pieces 120, 121, 122, or 123 are attached to corresponding edges of said PV panel 101. Attached to the underside of PV panel 101 is an Infrastructureless™ ACP assembly 280 (not shown).

The illustrative embodiments in FIGS. 22C through 25 will build upon the illustrative embodiment of Infrastructureless™ Base Node 600 shown in FIG. 22A by attaching, connecting or integrating one or more additional components that provide a portion of an Infrastructureless™ Data Center onto the back of an Infrastructureless™ Base Node 600 (FIG. 22A).

To bring perspective to the specific Infrastructureless™ components being discussed, embodiments of the Infrastructureless™ components will be displayed in drawings on a dotted outline of the Infrastructureless™ Base Node 600 (FIG. 22A). To help keep the focus on the specific Infrastructureless™ component being discussed, embodiments of the Infrastructureless™ components will be drawn using solid lines.

Since the view of the illustrative embodiments are looking down at Infrastructureless™ Base Node 600 (FIG. 22A) from above when installed, various layers of the illustrative embodiments are removed for clarity in the following figures to show the underlying modular componentry. The structural layers of an example Infrastructureless™ Base node comprise:

1. PV panel 101 (FIG. 22A)
2. Infrastructureless™ ACP assembly 280 (FIG. 11A) and Infrastructureless™ PM assemblies 440 (FIG. 19A). In some embodiments, assemblies 280 and 440 are adhered or attached to the back of PV panel 101 (FIG. 22A), e.g., as previously described.
3. Any combination of Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B, 16C and 16D), Infrastructureless™ PM assemblies 440 (FIGS. 18A, through 18E), Infrastructureless™ SM assemblies 450 (FIGS. 20A, 20B and 20C) or any other module assemblies connected via a connection between the respective connectors 500 of each Infrastructureless™ CM assembly 410, connectors 501 of each Infrastructureless™ MM assembly 420, connectors 502 of each Infrastructureless™ NM assembly 430, connectors 503 of each Infrastructureless™ SM assembly 450 to a corresponding one of connectors 300 of Infrastructureless™ Base Node 600 (FIGS. 11A, 11B and 11C). In other embodiments, any other number of connectors 300 and Infrastructureless™ module assemblies may alternatively be used.

Hyperconverged Infrastructure (HCI)

An HCI is the process of using software to aggregate physical computing resources into a larger logical computing resource to be managed by a "hypervisor", aggregating physical storage devices into a larger logical SDS device, and aggregating physical and virtual network devices into a larger logical SDN device. "HCI typically runs on Commercial Off-The-Shelf (COTS) servers." (See *Hyper-converged infrastructure* at Wikipedia.org)

HCI clustering is unique in that it depends on and extensively uses compute, network, and storage resources.

Figures 22C, 22D:
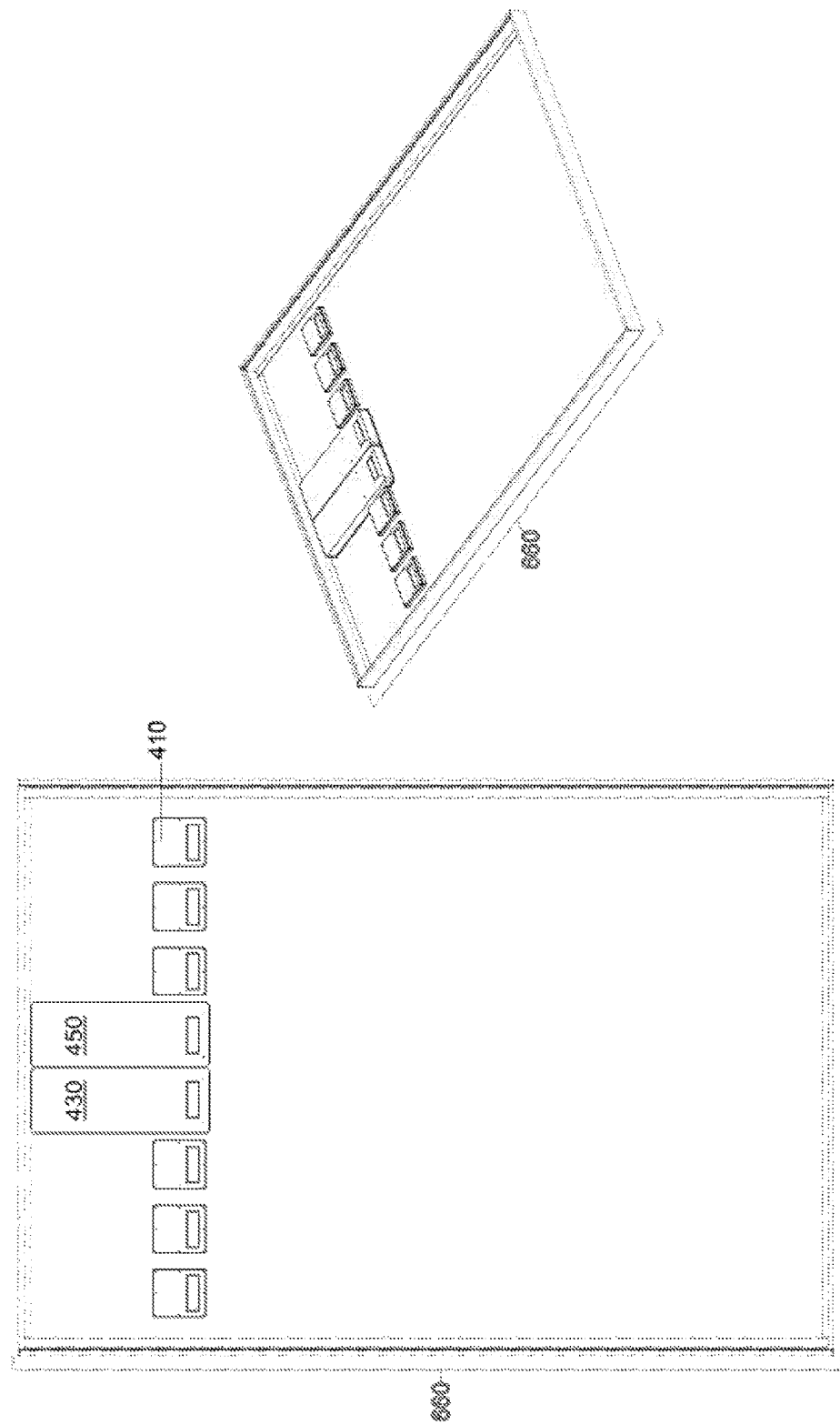
FIGS. 22C (orthogonal) and 22D (isometric) are views from the front of an Infrastructureless™ High-Performance Computing (HPC) node with the PV panel of FIGS. 10A and 10B and the ACP of an Infrastructureless™ Base Node of FIGS. 11A, 11B and 11C removed exposing the multiple Infrastructureless™ CM assemblies of FIGS. 12A, 12B, and 12C, the Infrastructureless™ NM assembly of FIGS. 16A, 16B, 16C and 16D and the Infrastructureless™ SM assembly of FIGS. 20A, 20B, and 20C according to an embodiment.

FIGS. 22C and 22D are an illustrative embodiment of the front of a Infrastructureless™ Hyper-Converged Node 660. Infrastructureless™ Hyper-Converged Node 660 comprises:

PV panel 101 (FIG. 22A)
Infrastructureless™ ACP assembly 280 (FIG. 11A) and Infrastructureless™ PM assemblies 440 (FIG. 19A)
six Infrastructureless™ CM assemblies 410 (FIGS. 12A, 12B and 12C)
one Infrastructureless™ NM assembly 430 (FIGS. 16A, 16B, 16C and 16D)
one Infrastructureless™ SM assembly 450 (FIGS. 20A, 20B and 20C Previous views of these modules showed the bottom surface, the surface that faces away from the sky when installed.

Infrastructureless™ Clusters

"A computer cluster is a set of computers that work together so that they can be viewed as a single system. Unlike grid computers, computer clusters have each node set to perform the same task, controlled and scheduled by software.

The components of a cluster are usually connected to each other through fast local area networks, with each node (computer used as a server) running its own instance of an operating system. In most circumstances, all of the nodes use the same hardware and the same operating system." (See *Computer cluster* at Wikipedia.org)

A computer cluster may be a simple two-node system which just connects two computing devices (i.e., personal computers) or may comprise tens, hundreds, thousands, or any number of servers.

Clustering is the process of aggregating similar physical resources into a larger logical resource. Using the Infrastructureless™ Data Systems discussed above we can group multiple similar Infrastructureless™ Data Systems into Infrastructureless™ Clusters.

In some embodiments, for example, any number of Infrastructureless™ Compute nodes 610 (FIGS. 13A, 13B and 13C) may be grouped together to form an Infrastructureless™ Compute cluster (e.g., a HPC cluster), any number of Infrastructureless™ Memory nodes may be grouped together to form an Infrastructureless™ Memory cluster, any number of Infrastructureless™ High-Capacity Compute nodes 620 (FIGS. 15A, 15B and 15C) may be grouped together to form an Infrastructureless™ High-Capacity Compute cluster (e.g., a database cluster), any number of Infrastructureless™ Network nodes 630 (FIGS. 17A, 17B and 17C) may be grouped together to form an Infrastructureless™ Network cluster (e.g., an Infrastructureless™ Data Center switch connected to one or more Infrastructureless™ Network nodes 630 (e.g., EoR/MoR) within each Infrastructureless™ Data Center row), any number of Infrastructureless™ Power nodes 640 (FIGS. 19A, 19B and 19C) may be grouped together to form an Infrastructureless™ Power cluster, any number of Infrastructureless™ Storage nodes 650 (FIGS. 21A, 21B and 21C) may be grouped together to form an Infrastructureless™ Storage cluster (e.g., DAS, NAS, SAN, etc.), any number of Infrastructureless™ HCI nodes 660 (FIGS. 22C and 22D) may be grouped together to form an Infrastructureless™ HCI cluster or any other Infrastructureless™ nodes comprising the same or a similar combination of Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B and 16C), Infrastructureless™ PM assemblies 440 (FIGS. 18A, 18B and 18C) and Infrastructureless™ SM assemblies 450 (FIGS. 20A, 20B and 20C) or any other Infrastructureless™ assemblies may be grouped together to form a corresponding Infrastructureless™ cluster.

Figure 23A:
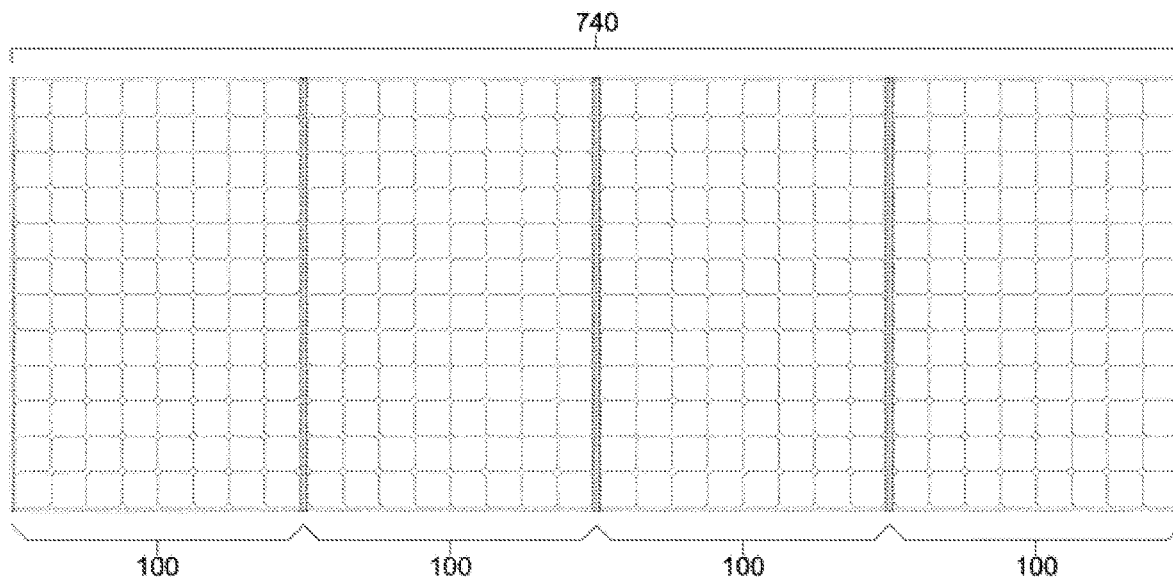
FIGS. 23A through 23J are views of different Infrastructureless™ Data Center Nodes grouped together to form Infrastructureless™ Data Center Clusters according to an embodiment.
Figure 23B:
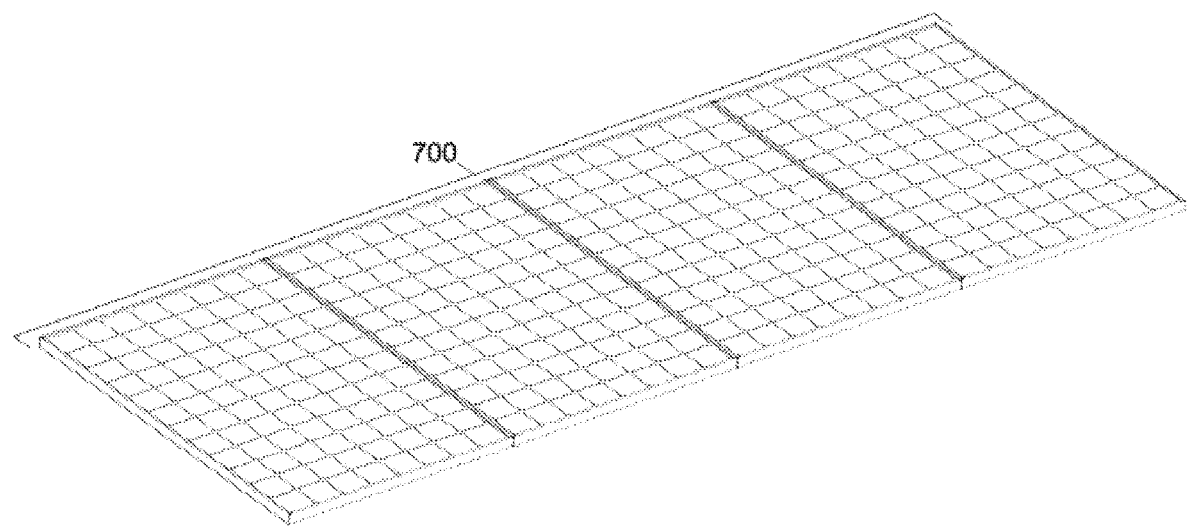

FIGS. 23A and 23B are an illustrative embodiment of the front of an example Infrastructureless™ Base Cluster 700. When viewed from above the Infrastructureless™ Base Cluster 700 looks like the front of four Infrastructureless™ Base Nodes 600 (FIG. 22A).

Figure 23C:
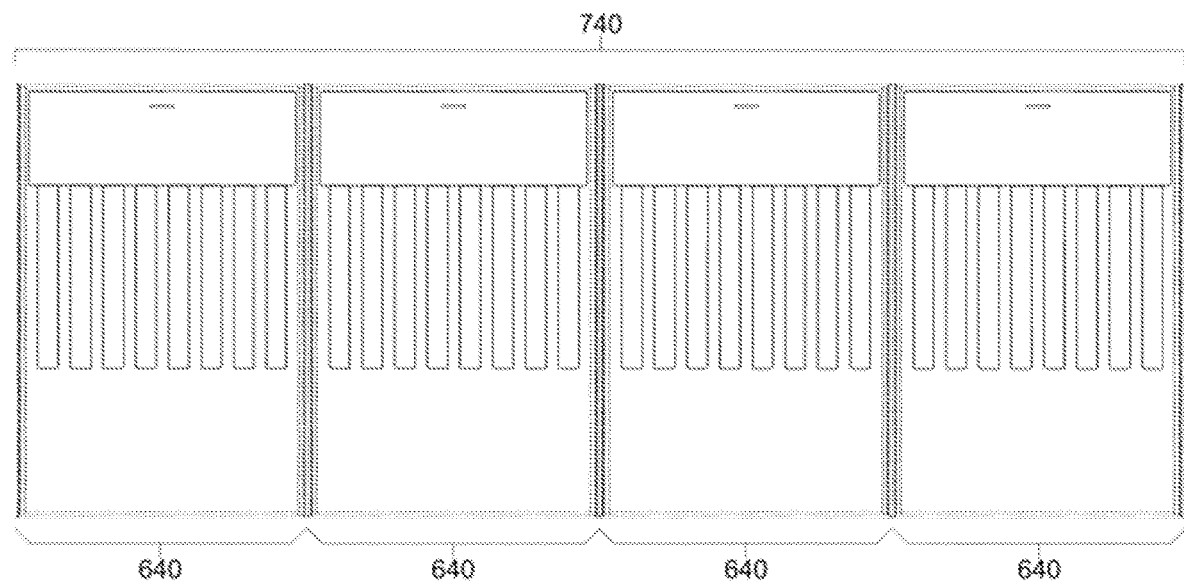
Figure 23D:
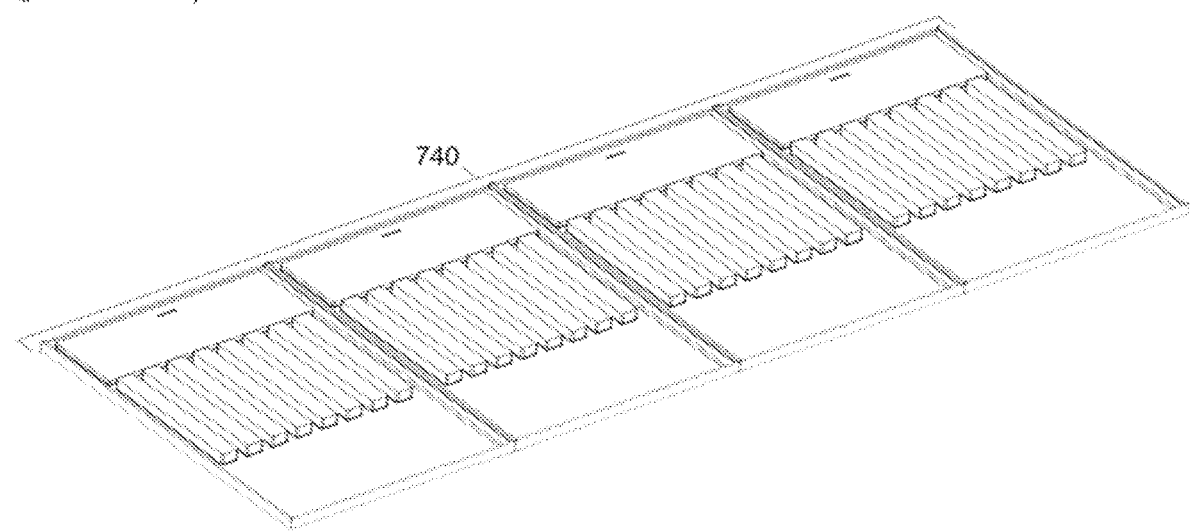

When viewed below PV panel 101 (FIG. 22A) in FIGS. 23C and 23D, eight Infrastructureless™ PM assemblies 440 (FIGS. 18A, 18B and 18C) are visible and are shown connected to each Infrastructureless™ Base Node 600. When eight Infrastructureless™ PM assemblies 440 (FIGS. 18A, 18B and 18C) are added to an Infrastructureless™ Base Node 600 (FIGS. 11A, 11B and 11C) the Infrastructureless™ Base Node 600 (FIGS. 11A, 11B and 11C) becomes an Infrastructureless™ Power Node 600 (FIGS. 19A, 19B and 19C) which also makes Infrastructureless™ Base Cluster 700 become an Infrastructureless™ Power Cluster 740.

The embodiment illustrated in FIGS. 23A through 23D will form the foundation for the clusters to be discussed below by adding combinations of the Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B and 16C) and Infrastructureless™ SM assemblies 450 (FIGS. 20A, 20B and 20C) or any other Infrastructureless™ assemblies discussed above.

Since the illustrative embodiments shown in FIGS. 23E through 23J are viewed from above when installed, the underlying modular componentry can be seen below the top two structural layers (discussed above) of Infrastructureless™ Base Node 600.

Hyperconverged Infrastructure (HCI)

Figure 23E:
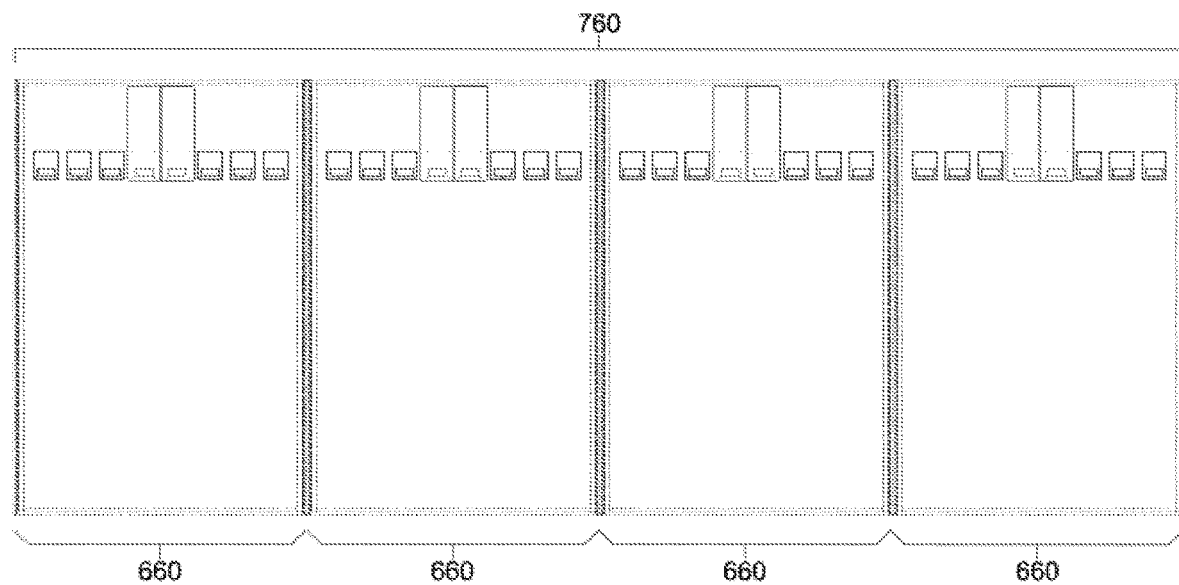
Figure 23F:
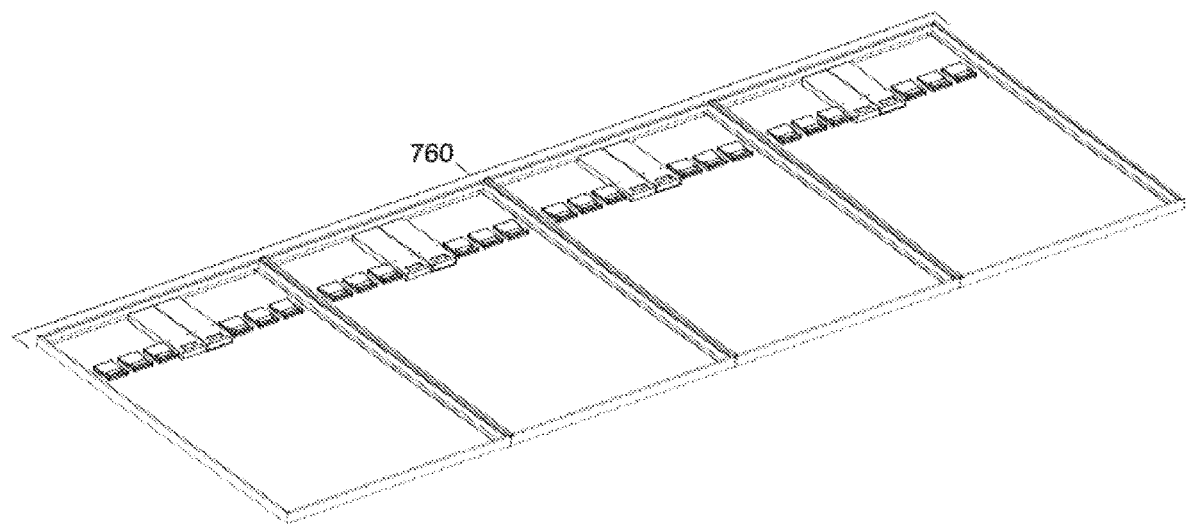

FIGS. 23E and 23F are an illustrative embodiment of an Infrastructureless™ HCI Cluster 760 comprising four Infrastructureless™ HCI Nodes 660 (FIGS. 22C and 22D). In addition to the modular componentry of the Infrastructureless™ Power Node 640 (FIGS. 23C and 23D) are six Infrastructureless™ CM assemblies 410 (FIGS. 12A, 12B and 12C), one Infrastructureless™ NM assembly 430 (FIGS. 16A, 16B, 16C and 16D) and one Infrastructureless™ SM assembly 450 (FIGS. 20A, 20B and 20C) via a connection between the respective connectors 500 of each Infrastructureless™ CM assembly 410 (FIGS. 12A, 12B and 12C), connectors 502 of each Infrastructureless™ NM assembly 430 (FIGS. 16A, 16B, 16C and 16D), connectors 503 of each Infrastructureless™ SM assembly 450 (FIGS. 20A, 20B and 20C) to a corresponding one of connectors 300 of Infrastructureless™ Base Node 600 (FIGS. 11A, 11B and 11C).

Storage Area Network (SAN)

Figure 23G:
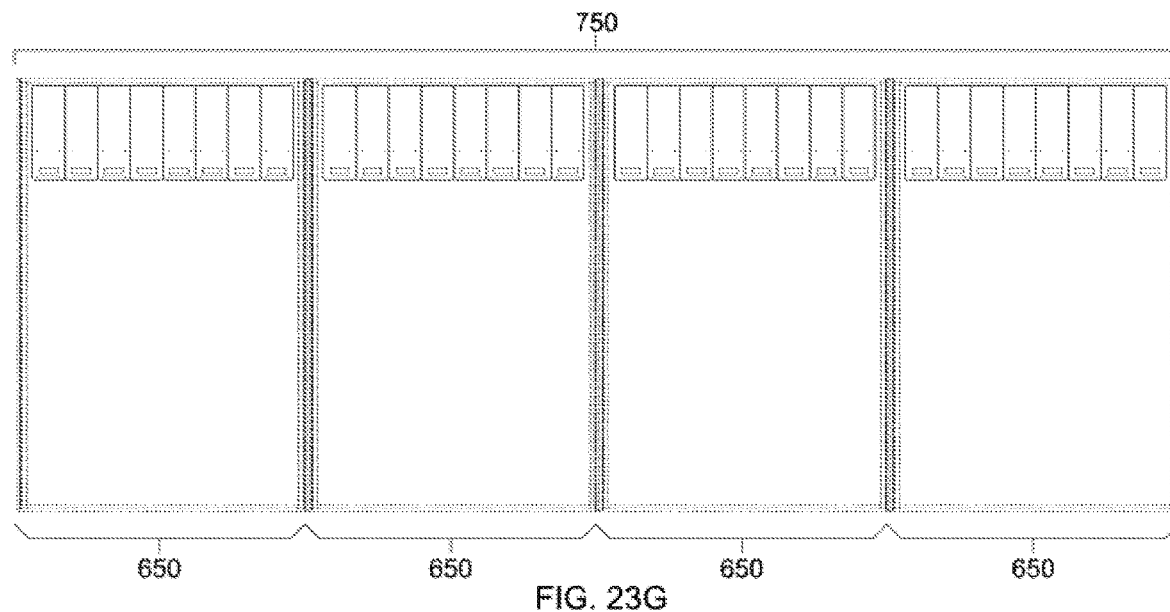
Figure 23H:
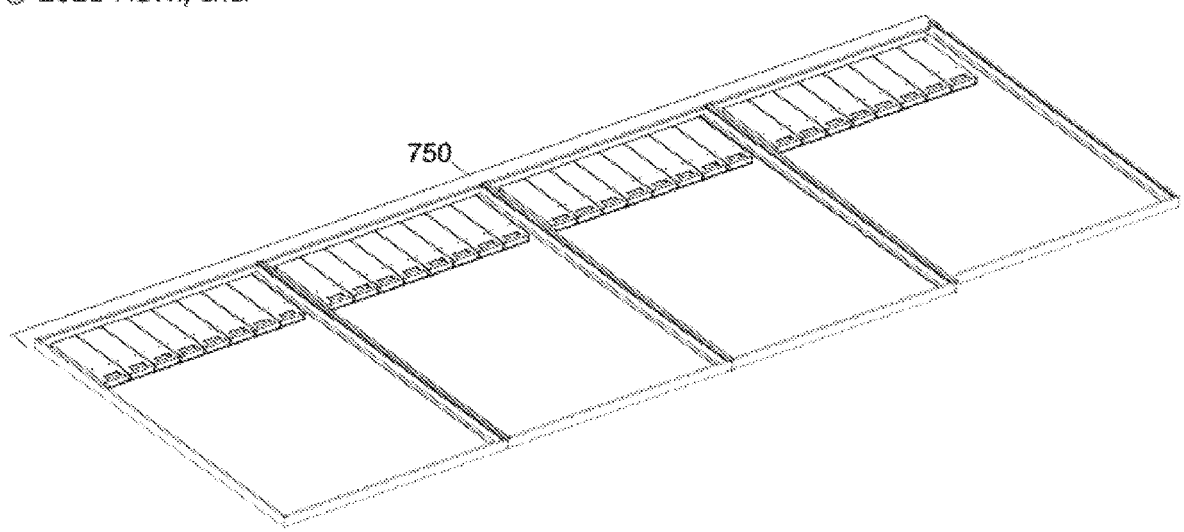

FIGS. 23G and 23H are an illustrative embodiment of an Infrastructureless™ Storage Cluster 750 comprising four Infrastructureless™ Storage Nodes 650 (FIGS. 21A, 21B and 21C). In addition to the modular componentry of the Infrastructureless™ Power Node 640 (FIGS. 23C and 23D) are eight Infrastructureless™ SM assemblies 450 (FIGS. 20A, 20B and 20C) via a connection between the respective connectors 503 of each Infrastructureless™ SM assembly 450 (FIGS. 20A, 20B and 20C) to a corresponding one of connectors 300 of Infrastructureless™ Base Node 600 (FIGS. 11A, 11B and 11C).

High-Performance Computing (HPC)

"HPC integrates systems administration (including network and security knowledge) and parallel programming into a multidisciplinary field that combines digital electronics, computer architecture, system software, programming languages, algorithms and computational techniques. HPC technologies are the tools and systems used to implement and create high performance computing systems. Recently, HPC systems have shifted from supercomputing to computing clusters and grids. Because of the need of networking in clusters and grids, High Performance Computing Technologies are being promoted by the use of a collapsed network backbone, because the collapsed backbone architecture is simple to troubleshoot, and upgrades can be applied to a single router as opposed to multiple ones." (See *High-performance computing* at Wikipedia.org)

Figure 23I:
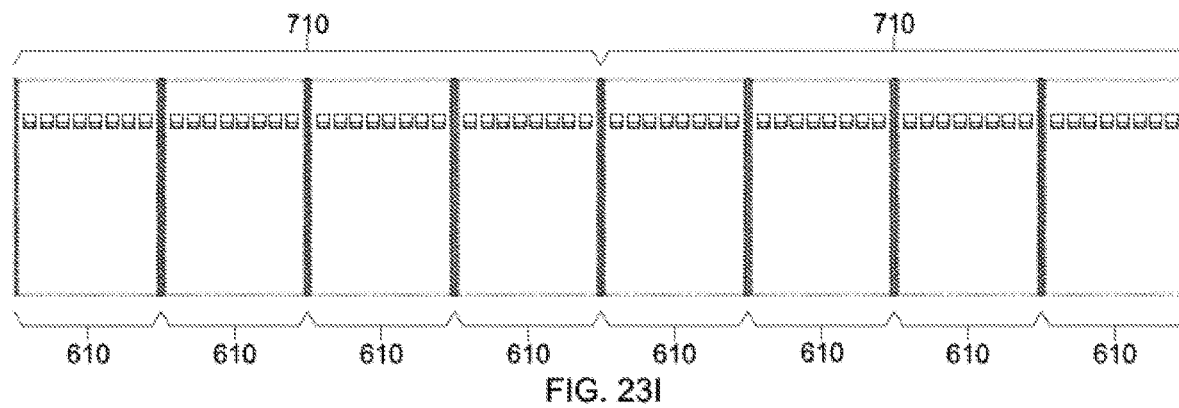
Figure 23J:
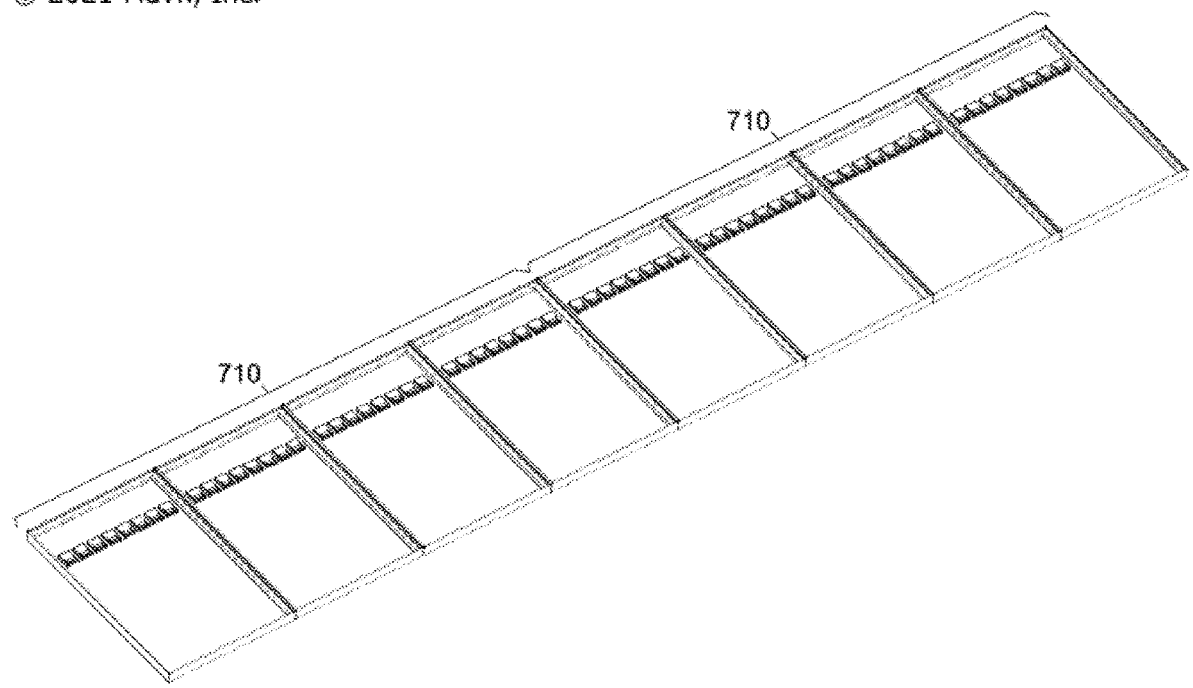

FIGS. 23I and 23J are an illustrative embodiment of two Infrastructureless™ Compute Clusters 710 with each cluster comprising four Infrastructureless™ Compute Nodes 610 (FIGS. 13A, 13B and 13C). In addition to the modular componentry of the Infrastructureless™ Power Node 640 (FIGS. 23C and 23D) are eight Infrastructureless™ CM assemblies 410 (FIGS. 12A, 12B and 12C) via a connection between the respective connectors 500 of each Infrastructureless™ CM assembly 410 (FIGS. 12A, 12B and 12C) to a corresponding one of connectors 300 of Infrastructureless™ Base Node 600 (FIGS. 11A, 11B and 11C). In some embodiments, one or more Infrastructureless™ CM assemblies 410 (FIGS. 12A, 12B and 12C) may be configured as a High-Performance Computing (HPC) node.

Infrastructureless™ Data Center

The Infrastructureless™ Cluster embodiments defined above may be grouped together to form an Infrastructureless™ Data Center of any size one row at a time.

Single Row

Figure 24A:
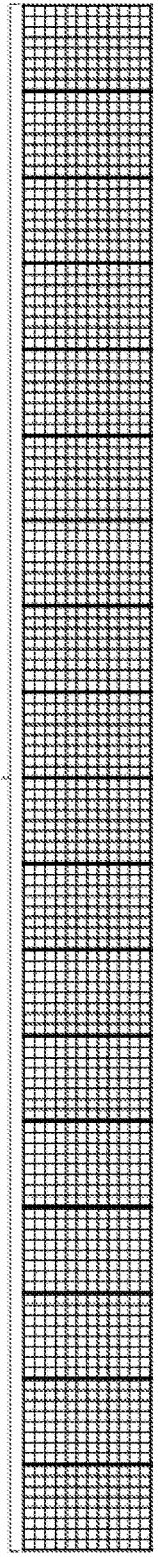
FIGS. 24A, 24B and 24C are orthogonal views of Infrastructureless™ Data Center Clusters grouped together to form a small Infrastructureless™ Data Center according to an embodiment.

When viewed from above, FIG. 24A is an illustrative embodiment of Infrastructureless™ Data Center 870. Infrastructureless™ Data Center 870 comprises eighteen Infrastructureless™ Base Nodes 600 (FIG. 22A) aligned side-by-side to form an Infrastructureless™ Data Center row 770. While illustrated as an Infrastructureless™ Data Center row 770, Infrastructureless™ Data Center 870 may alternatively comprise Infrastructureless™ Base Nodes 600 (FIG. 22A) arranged in any other manner.

Figure 24B:
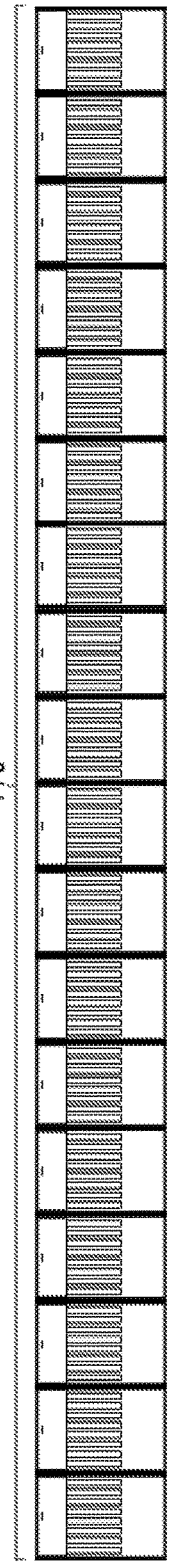

When viewing with each PV panel 101 (FIG. 22A) removed for clarity, FIG. 24B shows the components of each Infrastructureless™ Power Node assembly 640 (FIG. 19A).

Figure 24C:
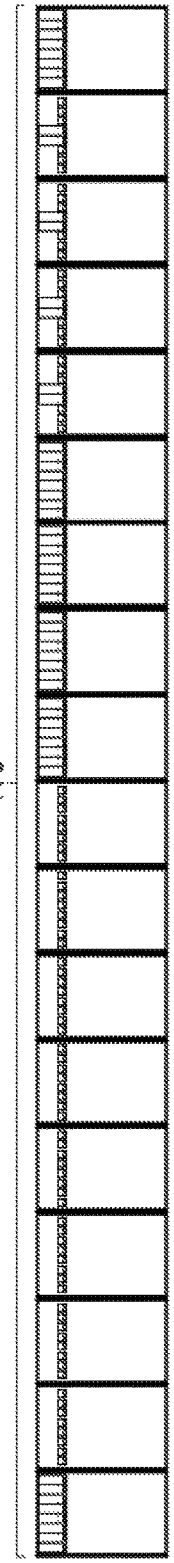

When viewed a layer deeper, with each ACP assembly 280 and PM assembly 440 removed for clarity, FIG. 24C shows the modular components for two Infrastructureless™ HPC Clusters 710 (FIG. 23I), Infrastructureless™ SAN Cluster 750 (FIG. 23G), and an Infrastructureless™ HCI Cluster 760 (FIG. 23E). Terminating each end of the row is an Infrastructureless™ Network Node 630 (FIG. 17A) performing the role of redundant EoR network switches.

While described as having 18 Infrastructureless™ Nodes, in other embodiments any other number of Infrastructureless™ Nodes may alternatively be included on Infrastructureless™ Data Center 870.

In some embodiments, for example, Infrastructureless™ Data Center 870 may comprise any number of Infrastructureless™ Compute nodes 610 (FIGS. 13A, 13B and 13C) and/or any number of Infrastructureless™ Memory Nodes 620 (FIGS. 14A, 14B, 14C and 14D) and/or any number of Infrastructureless™ Network Nodes 630 (FIGS. 16A, 16B, 16C and 16D) and/or any number of Infrastructureless™ Power Nodes 640 (FIGS. 18A, 18B and 18C) and/or any number of Infrastructureless™ Storage Nodes 650 (FIGS. 20A, 20B and 20C) and/or any number of Infrastructureless™ HCI Nodes 660 (FIGS. 22C and 22D) or any number of any other Infrastructureless™ node comprising any combination of Infrastructureless™ CM assemblies 410 (FIGS. 12A, 12B and 12C), Infrastructureless™ MM assemblies 420 (FIGS. 14A, 14B, 14C and 14D), Infrastructureless™ NM assemblies 430 (FIGS. 16A, 16B, 16C and 16D), Infrastructureless™ PM assemblies 440 (FIGS. 18A, 18B and 18C), Infrastructureless™ SM assemblies 450 (FIGS. 20A, 20B and 20C) or any other Infrastructureless™ module assemblies.

Multiple Rows

Figure 25:
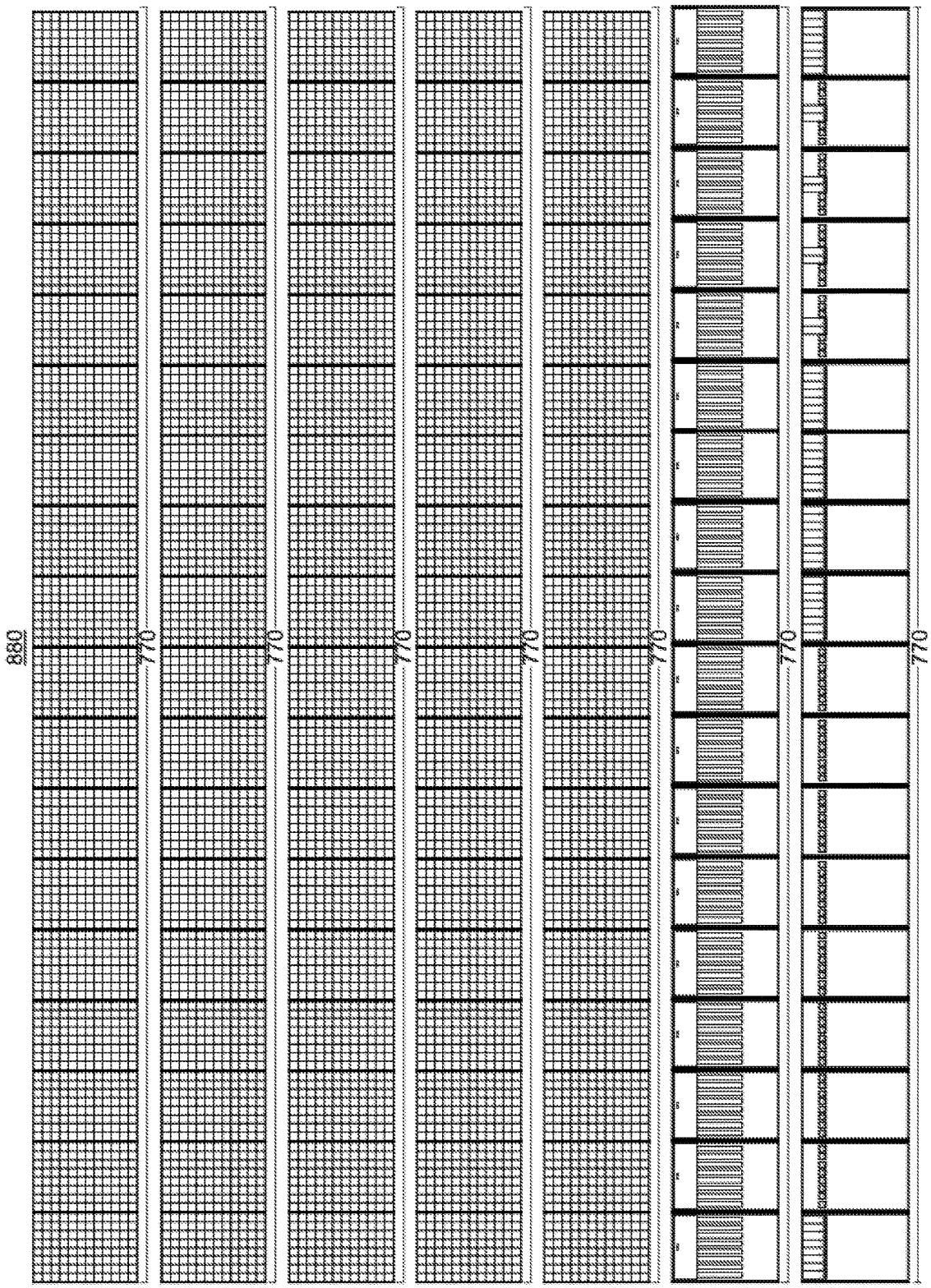
FIG. 25 (orthogonal) is an illustrative embodiment of multiple small Infrastructureless™ Data Centers grouped together to form a larger Infrastructureless™ Data Center according to an embodiment.

FIG. 25 is an illustrative embodiment of an Infrastructureless™ Data Center 880 comprising seven rows of Infrastructureless™ Node assemblies 770 (FIGS. 24A, 24B, and 24C). While described as having seven Infrastructureless™ Data Center rows 770, in other embodiments any other number of Infrastructureless™ Data Center Rows 770 may alternatively be included in Infrastructureless™ Data Center 870. Each Infrastructureless™ Data Center row may comprise any other configuration of Infrastructureless™ Clusters, Infrastructureless™ Nodes, or both.

Deployment Models

Photovoltaic Power Station (Aka Solar Park, Solar Farm, or Solar Power Plant)

In some embodiments, the Infrastructureless™ Data Centers, nodes and assemblies described above may be deployed and integrated into the PV panels 101 (FIG. 1A) of new or existing photovoltaic power stations such as, e.g., a solar park, solar farm, solar power plant or other photovoltaic power station. As an example, solar farms are a popular deployment model for PV panels because they are typically the easiest and least expensive to deploy. Solar farms often occupy large areas of otherwise unoccupied land, typically near the edge of metropolitan areas. The Infrastructureless™ Data Centers, nodes and assemblies described above may be attached, connected or integrated into new or existing solar farms to provide an environmentally friendly implementation of a data center with little additional footprint.

Commercial Carport

Deploying Infrastructureless™ Nodes/Clusters/Data Centers in the form of commercial carports is almost as easy to deploy as a Solar Farm and has additional advantages. The most obvious of these advantages is Infrastructureless™ Data Centers deployed in the form of commercial carports on land that is already occupied and would be the "highest and best use" for the land.

HIDCs consume so much water they create a water scarcity footprint. Infrastructureless™ Data Centers consume no water. Instead, Infrastructureless™ Data Centers deployed as a series of commercial carports can be configured to capture rainwater runoff in such a manner so it can flow into the local drainage system. These Infrastructureless™ Data Centers would create a negative water scarcity footprint, or a water scarcity offset. In areas that get fog, fog nets can also be integrated into Infrastructureless™ Data Centers deployed as a series of commercial carports leveraging the same runoff and drainage system to capture additional water.

Infrastructureless™ Data Centers deployed as a series of commercial carports provide shade to the vehicles parked under those carports preventing sun/weather damage to them and helping to keep them cooler. Infrastructureless™ Data Centers deployed as a series of commercial carports also shade portions of the underlying parking lot surface keeping the shaded surface cool and preventing sun/weather damage to the shaded surface. This is important because "asphalt is releasing hazardous air pollutants into communities, especially when hit with extreme heat and sunlight, according to new research published in the journal Science Advances." (See *As Earth overheats, asphalt is releasing harmful air pollutants in cities* at CNBC.com)

Roof-Top (Commercial)

In some embodiments, Infrastructureless™ Nodes may be installed on the rooftops of commercial spaces to form all or part of an Infrastructureless™ Data Center. For example, a business who owns a commercial building may install the Infrastructureless™ Nodes that implement an Infrastructureless™ Data Center on the rooftop of the commercial building to provide data center services for that business or for tenants of the building. Such a data center may provide multiple benefits to business in that commercial building. For example, such a business may relocate their data center or a portion of their data center to their rooftop Infrastructureless™ Data Center, allowing them to lower their electric bill by reducing the need for servers within their building, reduce weather exposure to the rooftop material, reclaim expensive office space previously used as a data center for other more productive purposes, and if suitably modified, inhibit or reduce the occurrence of roof leaks by capturing runoff water from the PV panel assemblies 100.

Roof-Top (Residential)

In some embodiments, Infrastructureless™ Nodes may be installed on residential rooftops to form all or part of an Infrastructureless™ Data Center. PV panels on residential roofs are more common than on commercial roofs and may be utilized by homeowners or others to mitigate consumption of energy within the household. For example, users with computing devices that consume excessive power when idle or active may utilize the power output by the Infrastructureless™ Power Node 640 to power the computing device off the grid. In addition, homeowners may relocate the functionality of servers or other data center components to an Infrastructureless™ Data Center on their rooftop, reducing both energy consumption and heat generation within the house which offsets costs to cool the house. In some cases, an Infrastructureless™ Data Center installed on the roof of a residential house may be utilized to start or expand crypto mining capabilities in a manner that doesn't impact the electrical grid. Infrastructureless™ Nodes installed on the roof of a residential home may also increase the life of roofing materials such as shingles, reduce solar heating of the roofing material, reduce solar heating of the house by the roofing material and provide other environmentally friendly benefits. In some embodiments, a homeowner may lease usage of the rooftop Infrastructureless™ Data Center to another party, providing further environmental benefits by replacing the usage of an HI DC by the other party with an environmentally friendly Infrastructureless™ Data Center.

Pre-Existing PV Panels

Another advantage of the Infrastructureless™ Data Center is any currently installed PV panel can be converted into an Infrastructureless™ Node. This means any PV Panel that's already installed using one of the previously mentioned Deployment Models can be upgraded to become an Infrastructureless™ Node in a new or existing Infrastructureless™ Data Center.

The foregoing description will so fully reveal the general nature of the illustrative embodiments that others can, by applying knowledge within the skill of the relevant art(s) (including the contents of the documents cited and incorporated by reference herein), readily modify and/or adapt for various applications such specific embodiments, without undue experimentation, without departing from the general concept of the illustrative embodiments. Such adaptations and modifications are therefore intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s).

COPYRIGHT NOTICE

A portion of the disclosure of this patent document contains material which is subject to (copyright or mask work) protection. The (copyright or mask work) owner has no objection to the facsimile reproduction by anyone of the patent document or the patent disclosure, as it appears in the Patent and Trademark Office patent file or records, but otherwise reserves all (copyright or mask work) rights whatsoever.

What is claimed is:

1. An infrastructureless data center comprising:
a plurality of base nodes, each base node comprising an active carrier plane affixed to a photovoltaic panel, each active carrier plane comprising a plurality of connectors;
a plurality of power assemblies affixed to the photovoltaic panel of each base node and electrically connected to the corresponding active carrier plane, each power assembly comprising a power storage device that is configured to be charged based on power supplied from the photovoltaic panel and to supply power to the corresponding active carrier plane, the corresponding active carrier plane comprising circuitry that is configured to supply both data and power connections to each connector of the plurality of connectors;
a plurality of compute assemblies, each compute assembly comprising at least one processing device and being configured to perform data center compute operations;
a plurality of storage assemblies, each storage assembly comprising at least one data storage device and being configured to perform data center storage operations; and
a plurality of network assemblies, each network assembly comprising at least one network device and being configured to perform data center networking operations,
the compute assemblies, storage assemblies and network assemblies each being configured to be mounted to the active carrier planes of the plurality of base nodes by coupling to any of the connectors of the active carrier planes and, when mounted, being configured to receive both data and power from the corresponding connector via the circuitry of the corresponding active carrier plane; and
the plurality of base nodes, each having at least one assembly selected from one or more of the plurality of compute assemblies, plurality of storage assemblies, and plurality of network assemblies mounted thereto, and being disposed in data communication with each other, together forming and functioning as the infrastructureless data center.

2. The infrastructureless data center of claim 1, wherein: each compute assembly comprises:
a compute assembly connector that is configured to physically couple to a corresponding one of the connectors of the active carrier plane of the corresponding base node, the physical coupling mounting the compute assembly to the corresponding active carrier plane;
at least one volatile memory device; and
at least one non-volatile memory device;
each storage assembly comprises a storage assembly connector that is configured to physically couple to a corresponding one of the connectors of the active carrier plane of the corresponding base node, the physical coupling mounting the storage assembly to the corresponding active carrier plane; and
each network assembly comprises a network assembly connector that is configured to physically couple to a corresponding one of the connectors of the active carrier plane of the corresponding base node, the physical coupling mounting the network assembly to the corresponding active carrier plane.

3. The infrastructureless data center of claim 2, wherein:
each compute assembly comprises a weatherproof compute assembly enclosure, the compute assembly connector of each compute assembly extending through a corresponding opening in the weatherproof compute assembly enclosure, the compute assemblies being configured to mount to the connectors of the active carrier plane external to the weatherproof compute assembly enclosures;
each storage assembly comprises a weatherproof storage assembly enclosure, the storage assembly connector of each storage assembly extending through a corresponding opening in the weatherproof storage assembly enclosure, the storage assemblies being configured to mount to the connectors of the active carrier plane external to the weatherproof storage assembly enclosures; and
each network assembly comprises a weatherproof network assembly enclosure, the network assembly connector of each network assembly extending through a corresponding opening in the weatherproof network assembly enclosure, the network assemblies being configured to mount to the connectors of the active carrier plane external to the weatherproof network assembly enclosures.

4. The infrastructureless data center of claim 1, wherein:
the infrastructureless data center further comprises a given compute assembly, a given storage assembly and a given network assembly each mounted to the active carrier plane of the same one of the base nodes; and
the given compute assembly, the given storage assembly and the given network assembly each comprise connectors that are configured to physically couple to the connectors of the active carrier plane of the base node to which the given compute assembly, the given storage assembly and the given network assembly are mounted.

5. The infrastructureless data center of claim 1, wherein the power assemblies are removably affixed to the photovoltaic panel.

6. The infrastructureless data center of claim 1, wherein the infrastructureless data center is configured to be energy self-sufficient and independent of a local electrical grid.

7. The infrastructureless data center of claim 1, wherein the plurality of photovoltaic panels are geographically co-located.

8. The infrastructureless data center of claim 1, wherein each photovoltaic panel is disposed adjacent to at least one other photovoltaic panel of the plurality of photovoltaic panels.

9. The infrastructureless data center of claim 1, wherein the active carrier plane of a first base node of the plurality of based nodes that is affixed to a first photovoltaic panel of the plurality of photovoltaic panels is configured to communicate with the active carrier plane of a second base node of the plurality of base nodes that is affixed to a second photovoltaic panel of the plurality of photovoltaic panels via a wired connection.

10. The infrastructureless data center of claim 1, wherein:
the active carrier plane comprises a weatherproof active carrier plane enclosure, the plurality of connectors extending through corresponding openings in the weatherproof active carrier plane enclosure;
the compute assemblies are configured to mount to the connectors of the active carrier plane external to the weatherproof active carrier plane enclosure;
the storage assemblies are configured to mount to the connectors of the active carrier plane external to the weatherproof active carrier plane enclosure; and the network assemblies are configured to mount to the connectors of the active carrier plane external to the weatherproof active carrier plane enclosure.

11. The infrastructureless data center of claim 1, wherein the infrastructureless data center is configured to function independent from conventional data center infrastructure including:
 a connection to a local utility electrical grid;
 installation within a building or other structure;
 installation of cooling systems;
 a water supply; and
 server storage cabinets, racks, and computing device chassis mounted in such server cabinets or racks.

12. An infrastructureless data center comprising:
 a plurality of active carrier planes, each active carrier plane being configured to be affixed to a corresponding photovoltaic panel of a plurality of photovoltaic panels, each active carrier plane comprising a plurality of connectors;
 a plurality of power assemblies that are configured to be affixed to each photovoltaic panel and electrically connected to the corresponding active carrier plane, each power assembly comprising a power storage device that is configured to be charged based on power supplied from the photovoltaic panel and to supply power to the corresponding active carrier plane, the corresponding active carrier plane comprising circuitry that is configured to supply both data and power connections to each connector of the plurality of connectors of the corresponding active carrier plane; and
 a plurality of assemblies, each assembly being configured to be mounted to a corresponding active carrier plane of the plurality of active carrier planes by coupling to any of the connectors of the corresponding active carrier plane and, when mounted, being configured to receive both data and power from the corresponding connector via the circuitry of the corresponding active carrier plane,
 the plurality of active carrier planes each having at least one of the plurality of assemblies mounted thereto, and being disposed in data communication with each other, together forming and functioning as the infrastructureless data center.

13. The infrastructureless data center of claim 12, wherein:
 the plurality of assemblies comprises a compute assembly, a storage assembly and a network assembly;
 the compute assembly comprises at least one processing device, at least one volatile memory device and at least one non-volatile memory device;
 the storage assembly comprises at least one data storage device; and
 the network assembly comprises at least one network device.

14. The infrastructureless data center of claim 13, wherein the compute assembly, the storage assembly and the network assembly are each configured to mount to the same active carrier plane of the plurality of active carrier planes.

15. The infrastructureless data center of claim 12, wherein:
 each assembly of the plurality of assemblies comprises an assembly connector that is configured to physically couple to a corresponding connector of the plurality of active carrier plane connectors to mount the assembly to the active carrier plane.

16. The infrastructureless data center of claim 12, wherein the infrastructureless data center is configured to be energy self-sufficient and independent of a local electrical grid.

17. The system of claim 12, wherein the infrastructureless data center is configured to function independent from conventional data center infrastructure including:
 a connection to a local utility electrical grid;
 installation within a building or other structure;
 installation of cooling systems;
 a water supply; and
 server storage cabinets, racks, and computing device chassis mounted in such server cabinets or racks.

18. A system comprising:
 a plurality of data center base nodes each comprising a base node component affixed to a photovoltaic panel, the plurality of data center base nodes being configured to communicate data therebetween, each base node component comprising a plurality of connectors, each connector being configured to accept a connection to a corresponding data center assembly, the connection of the corresponding data center assembly mounting the corresponding data center assembly to the base node component at the corresponding photovoltaic panel, the plurality of data center base nodes each having one or more of the data center assemblies mounted thereto together forming an infrastructureless data center.

19. The system of claim 18, wherein:
 the corresponding data center assembly comprises one of a compute assembly, a storage assembly and a network assembly;
 the compute assembly comprises at least one processing device, at least one volatile memory device and at least one non-volatile memory device;
 the storage assembly comprises at least one data storage device; and
 the network assembly comprises at least one network device.

20. The system of claim 18, wherein the infrastructureless data center is configured to function independent from conventional data center infrastructure including:
 a connection to a local utility electrical grid;
 installation within a building or other structure;
 installation of cooling systems;
 a water supply; and
 server storage cabinets, racks, and computing device chassis mounted in such server cabinets or racks.

\* \* \* \* \*

UNITED STATES PATENT AND TRADEMARK OFFICE
CERTIFICATE OF CORRECTION

PATENT NO. : 12,034,397 B2
APPLICATION NO. : 17/933476
DATED : July 9, 2024
INVENTOR(S) : Jeffrey Patrick Brew It is certified that error appears in the above-identified patent and that said Letters Patent is hereby corrected as shown below:

On the Title Page

(71) Applicant should read: Jeffrey Patrick Brew, Las Vegas, NV (US)
(72) Inventor should read: Jeffrey Patrick Brew, Las Vegas, NV (US)

Signed and Sealed this
Sixth Day of August, 2024

Katherine Kelly Vidal
*Director of the United States Patent and Trademark Office*